US012733210B2

(12) United States Patent
Chiang et al.

(10) Patent No.: US 12,733,210 B2
(45) Date of Patent: Sep. 8, 2026

(54) SEMICONDUCTOR STRUCTURE INCLUDING BOTTOM ISOLATION AND METHOD FOR MANUFACTURING THE SAME

(71) Applicant: TAIWAN SEMICONDUCTOR MANUFACTURING COMPANY, LTD., Hsinchu (TW)

(72) Inventors: Yu-Ho Chiang, Hsinchu (TW); Wei-Chen Chang, Hsinchu (TW); Jiun-Jie Chao, Hsinchu (TW); Jyh-Huei Chen, Hsinchu (TW); Jye-Yen Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 340 days.

(21) Appl. No.: 18/498,953

(22) Filed: Oct. 31, 2023

(65) Prior Publication Data

US 2025/0142881 A1 May 1, 2025

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/017* (2025.01); *H10D 84/0186* (2025.01); *H10D 84/0188* (2025.01);
(Continued)

(58) Field of Classification Search
CPC .. H10D 30/6729; H10D 30/014; H10D 30/43; H10D 30/6735; H10D 30/6757; H10D 62/121; H10D 64/017; H10D 84/017; H10D 84/0186; H10D 84/0188; H10D 84/038; H10D 84/85; H10D 84/0149; H10D 84/0151; H10D 84/83; H10W 20/42; H10W 20/435
See application file for complete search history.

(56) References Cited

U.S. PATENT DOCUMENTS 12,148,807 B2 * 11/2024 Chu .................... H10D 64/258
12,453,148 B2 * 10/2025 Yu ........................ H10D 30/014
(Continued)

*Primary Examiner* — Victor A Mandala
(74) *Attorney, Agent, or Firm* — Birch, Stewart, Kolasch & Birch, LLP

(57) ABSTRACT

A semiconductor structure includes: a first fin portion and a second fin portion; a first device and a second device which are respectively disposed on front surfaces of the first and second fin portions, each of the first and second devices including a source/drain portion; an isolation portion disposed to separate the first fin portion from the second fin portion and to separate the first device from the second device; and a hard mask portion disposed beneath a back surface of the isolation portion, and including a main region and two sidewall regions that are respectively located at two opposite sides of the main region so as to separate the main region from the first and second fin portions. The sidewall regions are made of a material different from that of the isolation portion. The main region is made of a material different from the material of the sidewall regions.

20 Claims, 46 Drawing Sheets

(51) Int. Cl.

| | |
|---|---|
| ***H10D 30/43*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |
| ***H10W 20/41*** | (2026.01) |
| ***H10W 20/42*** | (2026.01) |

(52) U.S. Cl.
CPC ........... *H10D 84/038* (2025.01); *H10D 84/85* (2025.01); *H10W 20/42* (2026.01); *H10W 20/435* (2026.01)

(56) References Cited

U.S. PATENT DOCUMENTS

| | | | | |
|---|---|---|---|---|
| 2021/0202758 | A1* | 7/2021 | Yeong | H10D 84/834 |
| 2024/0021708 | A1* | 1/2024 | Lan | H10D 30/024 |
| 2024/0321687 | A1* | 9/2024 | Xie | H10D 30/43 |
| 2024/0332388 | A1* | 10/2024 | Lee | H10D 30/6735 |
| 2024/0429284 | A1* | 12/2024 | Xie | H10D 62/121 |
| 2025/0006557 | A1* | 1/2025 | Huang | H10D 84/013 |
| 2025/0089312 | A1* | 3/2025 | Ramaswamy | H10D 84/0167 |
| 2025/0107227 | A1* | 3/2025 | Kang | H10D 84/83 |
| 2025/0113547 | A1* | 4/2025 | Lin | H10D 30/031 |
| 2025/0113603 | A1* | 4/2025 | Qayyum | H10D 30/43 |
| 2025/0120122 | A1* | 4/2025 | Lee | H10D 84/0149 |
| 2025/0344461 | A1* | 11/2025 | Yu | H10D 30/024 |
| 2026/0020332 | A1* | 1/2026 | Lee | H10D 84/832 |

* cited by examiner

SEMICONDUCTOR STRUCTURE INCLUDING BOTTOM ISOLATION AND METHOD FOR MANUFACTURING THE SAME

BACKGROUND

With the size miniaturization of a semiconductor device, the dimension of interconnect structures (e.g., metal lines, vias, contacts, etc.) that interconnect the semiconductor device to an external circuit is reduced as well. In order to reduce the electrical resistance of the interconnect structures and to enhance the electrical performance of the semiconductor device, the structural design of the interconnect structures and the semiconductor device are in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A to 32 illustrate schematic views of intermediate stages of the method depicted in FIG. 7 in accordance with some embodiments.

DETAILED DESCRIPTION

Figure 1:
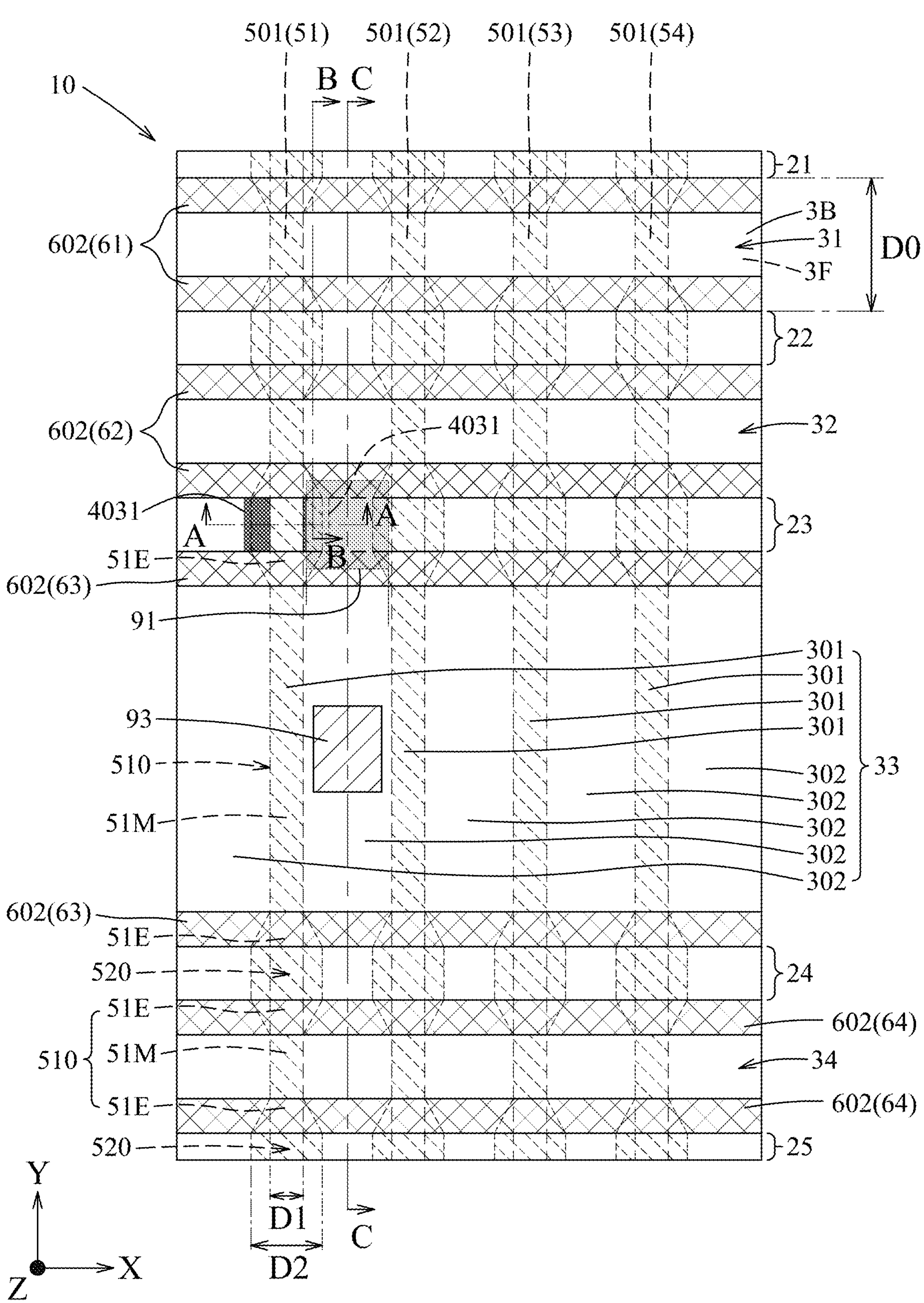
FIG. 1 is a schematic plane view of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

The term "source/drain portion(s)" may refer to a source or a drain, individually or collectively dependent upon the context.

In order to achieve high integration density and performance, the size of a transistor formed on a substrate continuously shrinks in three dimensions, and a backside interconnect structure (e.g., a backside via) is formed at the backside of the substrate and extends through the substrate to be electrically connected to the transistor, so that routing congestion in a front-side interconnect structure, which is formed at the front-side of the substrate, can be alleviated.

With the size miniaturization of the transistors, the distance between two gate electrodes of two adjacent transistors may be closer, and the dimension of a source (or a drain) between the two gate electrodes may be smaller. When the dimension of a backside via connected to the source (or the drain) is designed to be larger, the backside via which is disposed at the backside of the substrate and the two gate electrodes which are disposed at the front side of the substrate may be partially overlapped in a vertical direction. Once an isolation structure, which serves to separate the backside via from the two gate electrodes, is damaged due to process variations during semiconductor manufacturing, a current leakage may occur. Therefore, the present disclosure is directed to a semiconductor structure including a modified isolation structure which can effectively separate the backside via from the two gate electrodes, and a method for manufacturing the same.

Figure 2:
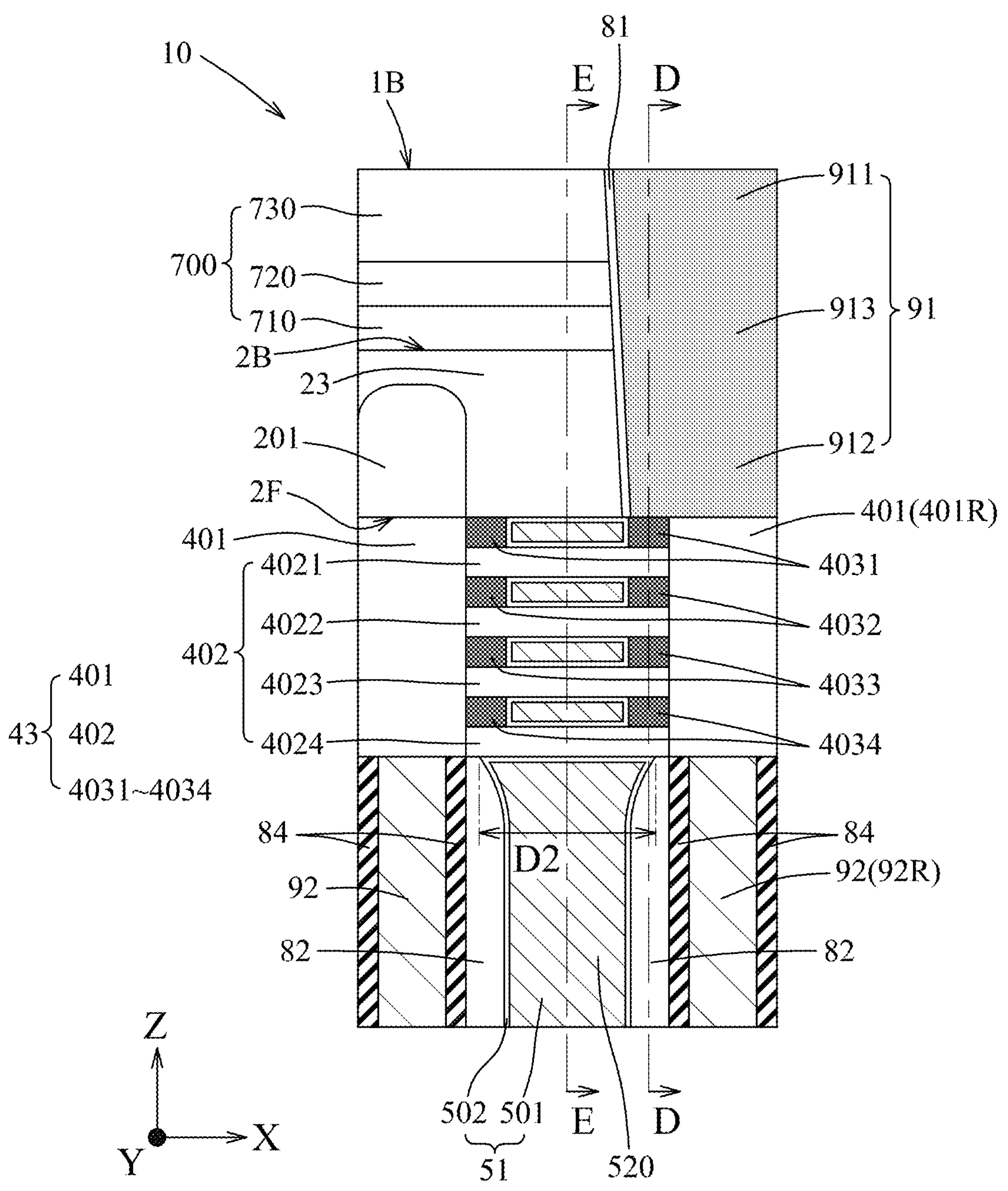
FIG. 2 is a schematic sectional view taken along line A-A of FIG. 1 in accordance with some embodiments.
Figure 3:
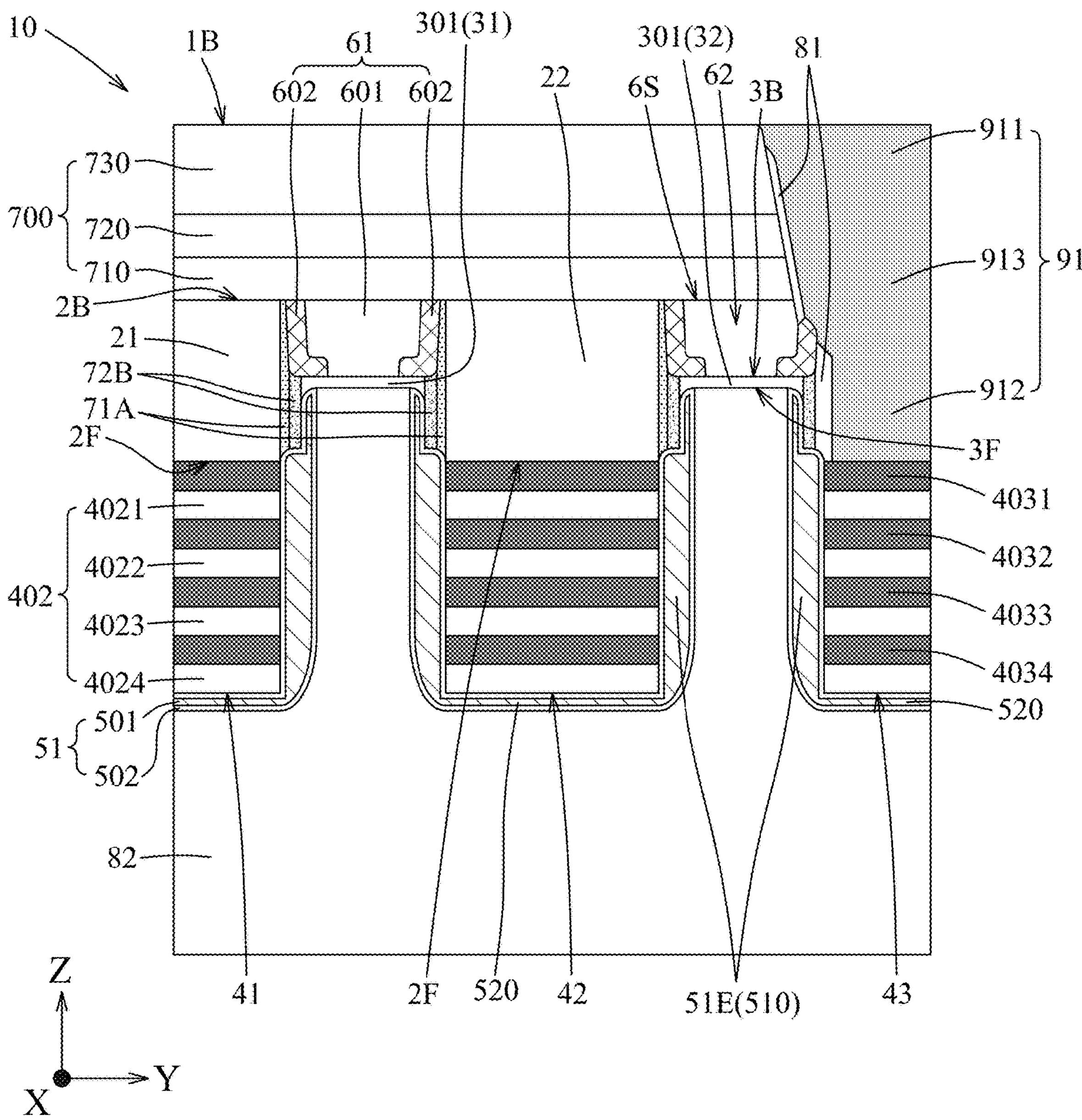
FIG. 3 is a schematic sectional view taken along line B-B of FIG. 1 in accordance with some embodiments.
Figure 4:
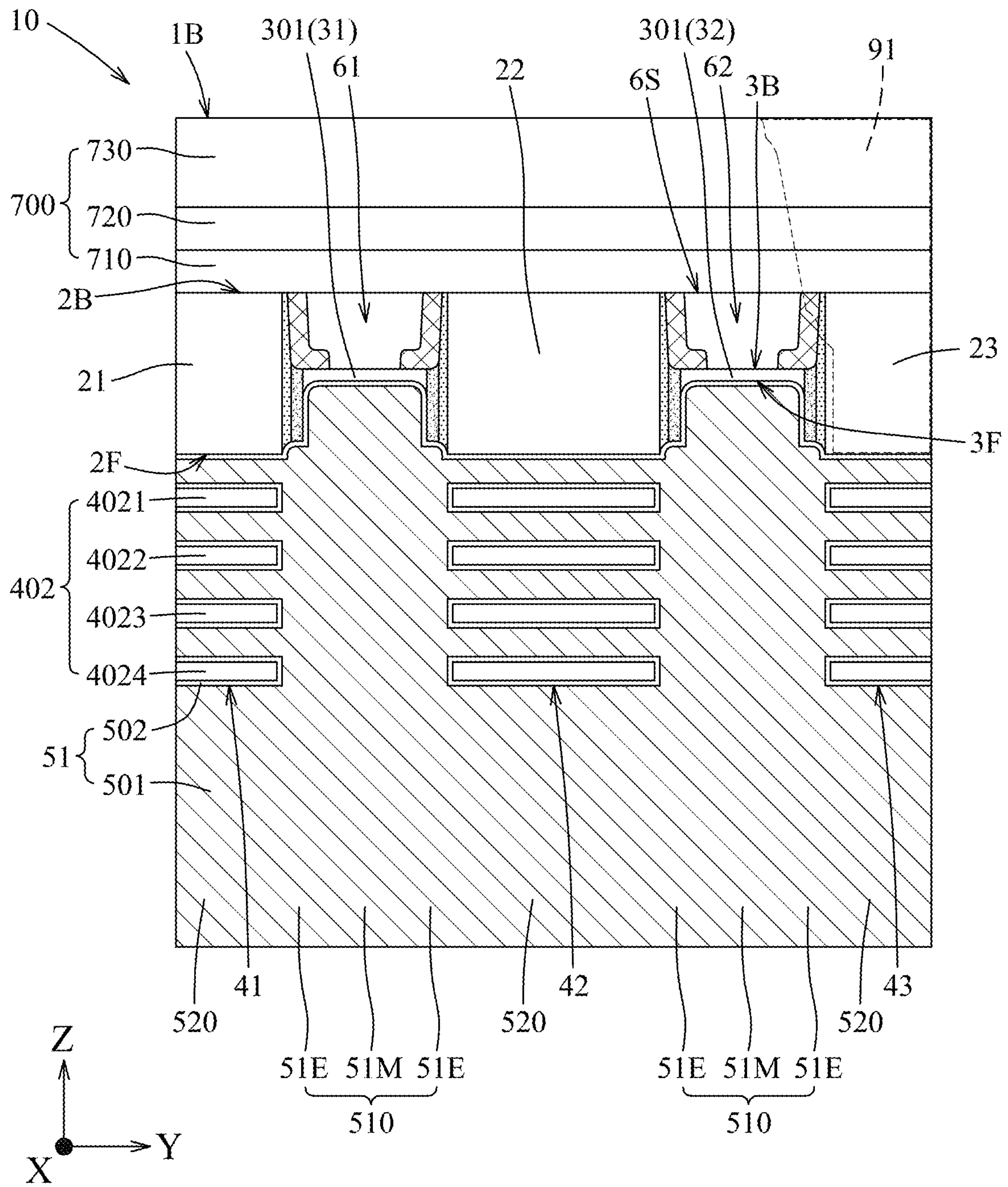
FIG. 4 is a schematic sectional view taken along line E-E of FIG. 2 in accordance with some embodiments.
Figure 5:
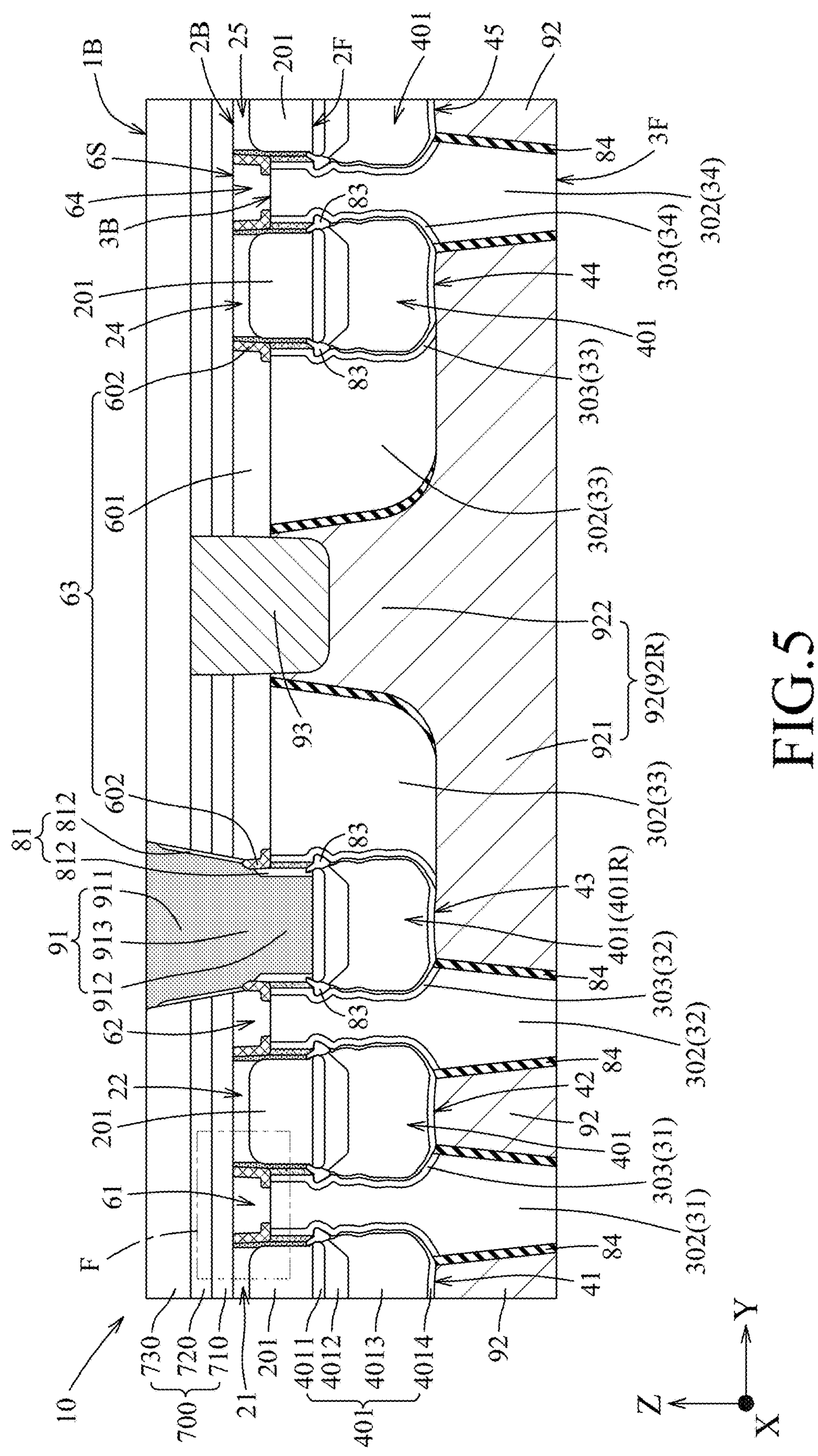
FIG. 5 is a schematic sectional view taken along line C-C of FIG. 1 in accordance with some embodiments.

FIG. 1 is a schematic plane view of a semiconductor structure 10 when being viewed from a back surface 1B (see FIG. 2) thereof in accordance with some embodiments, in which fin portions 21 to 25, isolation portions 31 to 34, gate electrodes 501 of gate portions 51 to 54, sidewall regions 602 of hard mask portions 61 to 64, a pair of inner spacers 4031 of a device 43 (see FIG. 2), a backside via 91, and a backside contact portion 93 are shown, and other elements are omitted. FIGS. 2, 3 and 5 are schematic sectional views respectively taken along line A-A, line B-B and line C-C of FIG. 1 in accordance with some embodiments, but further illustrating the other elements omitted in FIG. 1. The schematic sectional view shown in FIG. 3 is also a schematic sectional view taken along line D-D of FIG. 2. FIG. 4 is a schematic sectional view taken along line E-E of FIG. 2 in accordance with some embodiments. Some structures are omitted in FIGS. 1 to 5 for the sake of brevity.

In some embodiments, the semiconductor structure 10 includes a plurality of fin portions 21 to 25 (five of which are shown in FIG. 1), a plurality of isolation portions 31 to 34 (four of which are shown in FIG. 1), a plurality of devices 41 to 45 (five of which are shown in FIG. 5), a plurality of gate portions 51 to 54 (four of which are shown in FIG. 1), a plurality of hard mask portions 61 to 64 (four of which are shown in FIG. 1), at least one backside via 91 (one of which are shown in FIG. 1), and at least one backside contact portion 93 (one of which are shown in FIG. 1).

Referring to FIGS. 1 to 4, each of the fin portions 21 to 25 is elongated in an X direction, and has a front surface 2F and a back surface 2B which are respectively distal from and proximate to the back surface 1B of the semiconductor structure 10. Two adjacent ones of the fin portions 21 to 25 are spaced apart from each other in a Y direction by a corresponding one of the isolation portions 31 to 34. The Y direction is transverse to the X direction. As shown in FIG. 1, each of the isolation portions 31 to 34 has a dimension (D0) in the Y direction. The dimension (DO) of each of the isolation portions 31 to 34 may vary according to a distance between two corresponding adjacent ones of the fin portions 21 to 25. In the exemplary example shown in FIG. 1, the dimension (D0) of the isolation portion 33 is greater than that of each of the isolation portions 31, 32, 34. In some embodiments, each of the fin portions 21 to 25 may be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. Other materials suitable for the fin portions 21 to 25 are within the contemplated scope of the present disclosure. Other material and structural details of the isolation portions 31 to 34 will be described later.

Referring to FIGS. 2 and 5, the devices 41 to 45 are respectively disposed on the front surfaces 2F of the fin portions 21 to 25, and are spaced apart from each other. Each of the devices 41 to 45 (e.g., the device 43 shown in FIG. 2) includes two source/drain portions 401 and a channel portion 402 extending between the two source/drain portions 401. In some embodiments, each of the devices 41 to 45 is configured as a gate-all-around (GAA) transistor, and structural details thereof are described hereinafter with reference to FIG. 2. In some other embodiments not shown herein, each of the devices 41 to 45 may include two GAA transistors stacked on one another in a Z direction transverse to both the X and Y directions. In some embodiments, the structural design of such two GAA transistors may be referred to as a complementary field-effect transistors (CFET) structure. In some embodiments, the X, Y and Z directions are perpendicular to one another. In some yet other embodiments not shown herein, each of the devices 41 to 45 may include two GAA transistors which are arranged in a fork-sheet structure, wherein the two GAA transistors are spaced part from each other in the Y direction through a wall portion. Other configurations suitable for the devices 41 to 45 are within the contemplated scope of the present disclosure.

In the device 43 shown in FIG. 2, the channel portion 402 is disposed on and spaced apart from the fin portion 23 in the Z direction. The channel portion 402 includes at least one channel part. In FIG. 2, the number of the at least one channel part is four. The four channel parts 4021 to 4024 are spaced apart from each other in the Z direction. Each of the channel parts 4021 to 4024 extends between the source/drain portions 401. In some embodiments, possible materials suitable for the channel portion 402 are similar to those for the fin portions 21 to 25, and thus the details thereof are omitted for the sake of brevity. In some embodiments, the channel portion 402 is made of silicon. Other materials suitable for the channel portion 402 are within the contemplated scope of the present disclosure.

Each of the source/drain portions 401 in the device 43 is disposed on the fin portion 23. In some embodiments, each of the source/drain portions 401 may include single crystalline silicon, polycrystalline silicon or other suitable materials. In some embodiments, the source/drain portions 401 may be doped with n-type impurities so as to function as a source/drain of an n-FET. The n-type impurities may be, for example, but not limited to, nitrogen (N), phosphorous (P), arsenic (As), antimony (Sb), other suitable materials, or combinations thereof. In some other embodiments, the source/drain portions 401 may be doped with p-type impurities so as to function as a source/drain of a p-FET. The p-type impurities may be, for example, but not limited to, boron (B), aluminum (Al), gallium (Ga), indium (In), other suitable materials, or combinations thereof. In some embodiments, as shown in FIG. 5, each of the source/drain portions 401 may be formed as a multi-layered structure having several sub-layers 4011 to 4014 with different doping concentration and/or different dopants. In some embodiments not shown herein, each of the source/drain portions 401 may be formed as a single layer structure.

Figure 14A:
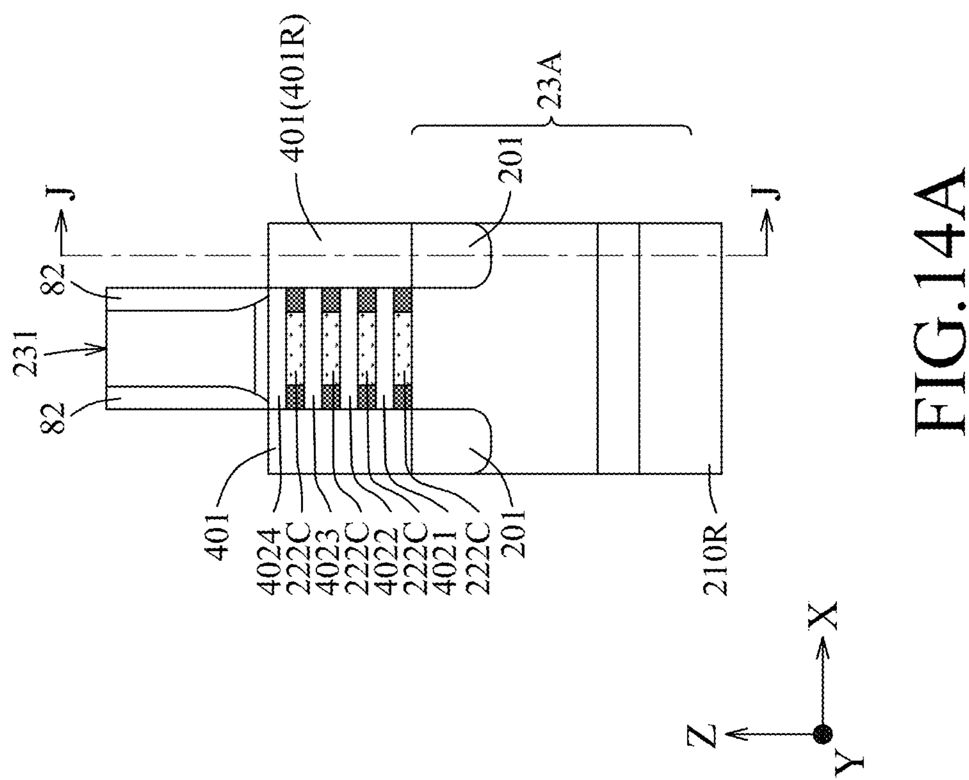

In some embodiments, as shown in FIGS. 2 and 5, each of the fin portions 21 to 25 may be formed with un-doped regions 201 which are made of an un-doped semiconductor material (e.g., un-doped silicon), and which are provided for improving epitaxial growth quality of the source/drain portions 401 which are formed respectively from the un-doped regions 201. In some embodiments, the un-doped regions 201 may also serve to reduce current leakage among the source/drain portions 401 and a corresponding one of the fin portions 21 to 25. Please note that in FIG. 2, the right one of the un-doped regions 201 shown in FIG. 14A is removed during forming the backside via 91, and thus only the left one of the un-doped regions 201 is shown.

Each of the devices 41 to 45 (e.g., the device 43 shown in FIG. 2) further includes four pairs of inner spacers 4031 to 4034. Each pair of the inner spacers 4031 to 4034 are spaced apart from each other in the X direction, and serves to separate the source/drain portions 401 from the gate portion 51 which will be described later. A backmost one pair of the inner spacers (i.e., the inner spacers 4031 which are most proximate to the back surface 1B) are disposed between the fin portion 23 and a backmost one of the channel parts 4021, and are also shown in FIG. 1. The other three pairs of the inner spacers 4032 to 4034 are each disposed between two adjacent ones of the channel parts 4021 to 4024. In some embodiments, each pair of the inner spacers 4031 to 4034 may include a low-k dielectric material, such as silicon oxide, silicon nitride, silicon oxynitride, silicon carbonitride, silicon oxycarbide, silicon oxycarbonitride, silicon carbide, and so on. Other low-k dielectric materials suitable for the pairs of the inner spacers 4031 to 4034 are within the contemplated scope of the present disclosure.

Referring to FIG. 1, the gate portions 51 to 54 are each elongated in the Y direction, and are spaced apart from each other in the X direction. The structural details thereof are described hereinafter with reference to FIGS. 2 and 4. The gate portion 51 extends in each of the isolation portions 31 to 34 in the Y direction (see FIG. 1), and is disposed over the channel portions 402 of each of the devices 41 to 45 although only the devices 41 to 43 are exemplarily shown in FIG. 4. In some embodiments, the gate portion 51 surrounds the channel parts 4021 to 4024 of the channel portions 402 of each of the devices 41 to 45, although only the devices 41 to 43 are exemplarily shown in FIG. 4. The gate portion 51 is separated from the source/drain portions 401 through the pairs of the inner spacers 4031 to 4034 of each of the devices 41 to 45, although only the device 43 is exemplarily shown in FIG. 2. In some embodiments, the gate portion 51 includes a gate electrode 501 and a gate dielectric layer 502 disposed to separate the gate electrode 501 from the fin portions 21 to 25 and the channel parts 4021 to 4024 of the channel portions 402 of each of the devices 41 to 45, although only the devices 41 to 43 and the fin portions 21 to 23 are exemplarily shown in FIGS. 3 and 4.

In some embodiments, the gate electrode 501 may be configured as a multi-layered structure including (i) at least one work function metal that is provided for adjusting threshold voltage of an n-FET or a p-FET, and (ii) an electrically conductive material having a low resistance that is provided for reducing electrical resistance of the gate electrode 501, other suitable materials, or combinations thereof. In some embodiments, the work function metal of the gate electrode 501 for forming an n-FET may be different from that for forming a p-FET so as to permit the n-FET and the p-FET to have different threshold voltages. Other methods suitable for adjusting the threshold voltages are within the contemplated scope of the present disclosure. In some embodiments, the gate electrode 501 may include a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other materials suitable for the gate electrode 501 are within the contemplated scope of the present disclosure.

In some embodiments, the gate dielectric layer 502 may include silicon oxide, silicon nitride, silicon oxynitride, a suitable high-k material (such as hafnium oxide, zirconium oxide, zirconium aluminum oxide, hafnium aluminum oxide, hafnium silicon oxide, aluminum oxide, etc.), other suitable materials, or combinations thereof. Other dielectric materials suitable for the gate dielectric layer 502 are within the contemplated scope of the present disclosure. In some embodiments, the gate dielectric layer 502 has a thickness ranging from about 1 nm to about 2.5 nm.

Each of the isolation portions 31 to 34 is made of electrically insulating material(s), and is disposed to separate two adjacent ones of the fin portions 21 to 25 from each other, and to separate two adjacent ones of the devices 41 to 45 from each other. Each of the isolation portions 31 to 34 has a front surface 3F and a back surface 3B which are respectively distal from and proximate to the back surface 1B of the semiconductor structure 10, as shown in FIGS. 3 to 5. In some embodiments, as shown in FIG. 1, each of the isolation portions 31 to 34 may include trench isolation regions 301 and inter-layer dielectric (ILD) regions 302 disposed to alternate with the trench isolation regions 301 in the X direction. It is noted that each of the gate portions 51 to 54 (e.g., the gate portion 51 shown in FIGS. 3 and 4) is disposed over the front surfaces 3F on a corresponding one of the trench isolation regions 301 of each of the isolation portions 31 to 34, although only one of the trench isolation regions 301 of each of the isolation portions 31, 32 is exemplarily shown in FIGS. 3 and 4. In some embodiments, the trench isolation regions 301 may each be a portion of a shallow trench isolation (STI), a portion of a deep trench isolation (DTI), or other suitable structures. In some embodiments, possible insulating materials suitable for the trench isolation regions 301 may include silicon oxide, silicon nitride, silicon oxynitride, or combinations thereof. Two adjacent ones of the ILD regions 302 are disposed at two opposite sides of a corresponding one of the gate portions 51 to 54 in the X direction. In some embodiments, possible insulating materials suitable for the ILD regions 302 may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), spin-on-glass (SOG), or combinations thereof. In some embodiments, each of the isolation portions 31 to 34 may further include contact etching stop regions 303, and the details thereof will be described later. Other insulating materials suitable for the isolation portions 31 to 34 are within the contemplated scope of the present disclosure.

Referring to FIGS. 1, 3 and 4, each of the hard mask portions 61 to 64 is elongated in the X direction, and is disposed on a corresponding one of the isolation portions 31 to 34 in a way that each of the hard mask portions 61 to 64 is spaced apart from the gate portions 51 to 54. In some embodiments, each of the hard mask portions 61 to 64 is disposed on the back surface 3B of a corresponding one of the isolation portions 31 to 34.

In some embodiments, each of the hard mask portions 61 to 64 has a surface 6S (see FIGS. 3 to 5) which is opposite to a corresponding one of the isolation portions 31 to 34, and which is flush with the back surface 2B of each of the fin portions 21 to 25. Each of the hard mask portions 61 to 64 includes a main region 601 and two sidewall regions 602 that are respectively located at two opposite sides of the main region 601 in the Y direction so as to separate the main region 601 from two adjacent ones of the fin portions 21 to 25. The sidewall regions 602 are made of a first insulating material different from the insulating material of the isolation portions 31 to 34. In some embodiments, the first insulating material is not silicon nitride. In some embodiments, the first insulating material may be an electrically insulating metal oxide, such as titanium oxide, hafnium oxide, aluminum oxide, zirconium oxide, zirconium aluminum oxide, or combinations thereof. The main region 601 is made of a second insulating material different from the first insulating material of the sidewall regions 602. In some embodiments, the second insulating material may include silicon oxide, silicon nitride, silicon oxynitride, silicon oxycarbide, silicon oxycarbon nitride, or combinations thereof.

Figure 6:
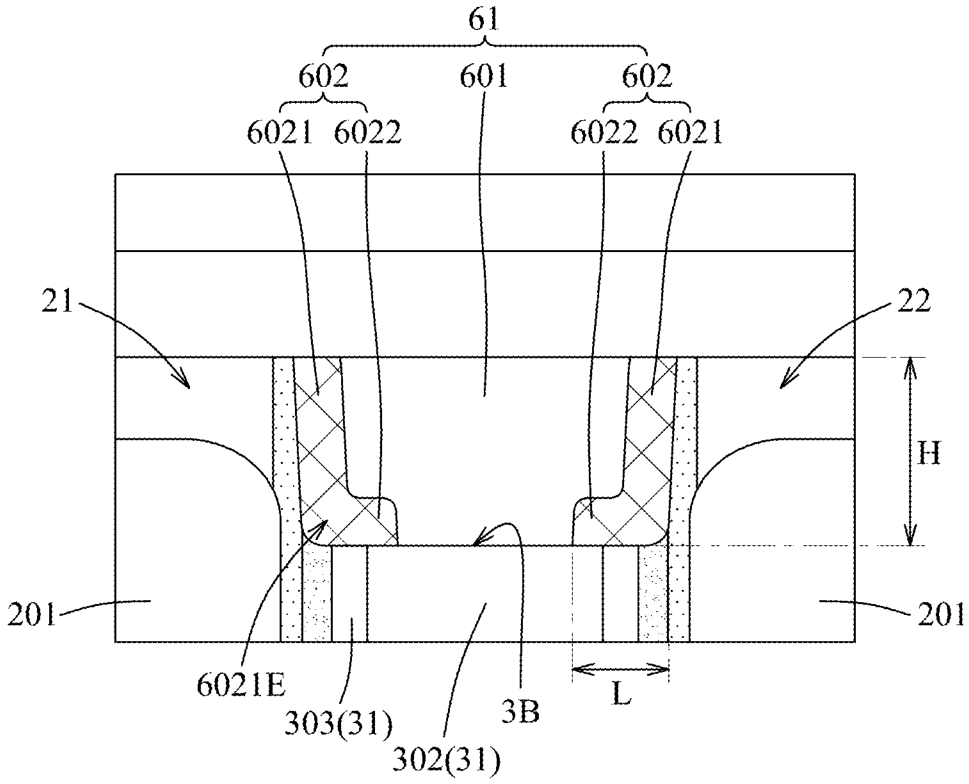
FIG. 6 is a fragmentary enlarged view of area (F) shown in FIG. 5 in accordance with some embodiments.

FIG. 6 is a fragmentary enlarged view of area (F) shown in FIG. 5, which more clearly illustrates the structural details of the hard mask portion 61. In each of the hard mask portions 61 to 64 (e.g., the hard mask portion 61 shown in FIG. 6), each of the two sidewall regions 602 has a vertical part 6021 and a horizontal part 6022 which is connected to an end 6021E of the vertical part 6021. The horizontal parts 6022 of the two sidewall regions 602 extend toward each other. In other words, each of the sidewall regions 602 has an L-shape cross section. In some embodiments, the horizontal part 6022 of each of the sidewall regions 602 is in contact with the back surface 3B of a corresponding one of the isolation portions 31 to 34 (e.g., the isolation portion 31 shown in FIG. 6). In some embodiments, the horizontal part 6022 is in contact with the trench isolation regions 301 (see FIGS. 1, 3 and 4) and the ILD regions 302 (see FIGS. 1 and 5) of the corresponding one of the isolation portions 31 to 34. In some embodiments, the horizontal part 6022 has a length (L) in the Y direction ranging from about 2 nm to about 20 nm. In some embodiments, the horizontal part 6022 has a height (H) in the Z direction ranging from about 5 nm to about 60 nm.

Referring to FIGS. 2 to 5, the semiconductor structure 10 further includes a dielectric layer 700 disposed to cover the back surface 2B of each of the fin portions 21 to 25 and the surface 6S of each of the hard mask portions 61 to 64. The backside via 91 extends through the dielectric layer 700 and the fin portion 23 such that the backside via 91 is brought into connection with one of the source/drain portions 401 (e.g., the source drain portion denoted by 401R in FIG. 2) of the device 43. In some embodiments, the dielectric layer 700 is configured as a multi-layered structure including a plurality of dielectric sub-layers 710, 720, 730. In some embodiments, the dielectric sub-layer 720 is made of a material different from a material of the dielectric sub-layer 710. The number of the dielectric sub-layers is not limited to three, and may vary according to practical requirements. In some embodiments not shown herein, the dielectric layer 700 may be configured as a single layer structure. In some embodiments, the dielectric layer 700 may include silicon nitride, silicon oxide, silicon oxynitride, silicon oxycarbon nitride, or combinations thereof. Other dielectric materials suitable for the dielectric layer 700 are within the contemplated scope of the present disclosure. In some embodiments, the backside via 91 may include a conductive material, such as tungsten (W), aluminum (Al), ruthenium (Ru), cobalt (Co), copper (Cu), palladium (Pd), nickel (Ni), platinum (Pt), a low resistivity metal constituent, or combinations thereof. Other conductive materials suitable for the backside via 91 are within the contemplated scope of the present disclosure.

In some embodiments, the semiconductor structure 10 further includes a silicon nitride re-deposition (SNR) layer 81 disposed to separate the backside via 91 from the fin portion 23 (see FIG. 2) and the isolation portions 32, 33 (see FIG. 5).

In some embodiments, as shown in FIG. 5, the backside via 91 has a wider portion 911 and a narrower portion 912. The narrower portion 912 is disposed between the wider portion 911 and the source/drain portions 401R of the second device 43. Referring to FIGS. 1 and 5, the wider portion 911 has a dimension in the Y direction greater than a dimension of the fin portion 23 in the Y direction, and the narrower portion 912 has a dimension in the Y direction not greater than the dimension of the fin portion 23 in the Y direction. In some embodiments, the backside via 91 further has a transition portion 913 located between the wider portion 911 and the narrower portion 912. The SNR layer 81 is discontinuous so as to permit the transition portion 913 to be in direct contact with the hard mask portions 62, 63. In some embodiments, as shown in FIGS. 1 and 2, the narrower portion 912 has a dimension in the X direction greater than a dimension of the source/drain portion 401R of the device 43 in the X direction such that the narrower portion 912 is partially landed on one of the inner spacers 4031 of the device 43. In some embodiments, as shown in FIG. 5, the SNR layer 81 includes two vertical parts 812 which surround the wider portion 911 and the narrower portion 912, respectively and which are spaced apart from each other so as to make the SNR layer 81 discontinuous.

In some embodiments, each of the gate portions 51 to 54 (e.g., the gate portion 51 shown in FIGS. 1 to 4) includes a plurality of first gate parts 510 and a plurality of second gate parts 520 formed to alternate with the first gate parts 510 in the Y direction.

Referring to FIGS. 1, 3 and 4, the first gate parts 510 respectively extend in the isolation portions 31 to 34 in a way that the first gate parts 510 are respectively spaced apart from the hard mask portions 61 to 64, although only the isolation portions 31, 32 and the hard mask portions 61, 62 are exemplarily shown in FIGS. 3 and 4. Each of the first gate parts 510 has a middle region 51M and two end regions 51E. The two end regions 51E are disposed at two opposite sides of the middle region 51M in the Y direction. A dimension (D1) of the middle region 51M in the X direction being smaller than a dimension of each of the two end regions 51E in the X direction, as shown in FIG. 1. In some embodiments, the two inner spacers 4031 are also spaced apart by a distance that is substantially equal to the maximum dimension (D1).

The second gate parts 520 are respectively disposed over the channel portions 402 of the devices 41 to 45 (only the device 43 is exemplarily shown in FIG. 2, and only the devices 41 to 43 are exemplarily shown in FIGS. 3 and 4). Each of the second gate parts 520 has a maximum dimension (D2) in the X direction, as shown in FIGS. 1 and 2. The maximum dimension (D2) is greater than the dimension (D1). Therefore, each of the second gate parts 520 partially overlaps the inner spacers 4031 to 4034 of a corresponding one of the devices 41 to 45 (e.g., the device 43 shown in FIG. 2) in the Z direction. The dimension of each of the two end regions 51E in the X direction gradually increases toward an adjacent one of the second gate parts 520.

Therefore, as shown in FIG. 3 (i.e., the schematic sectional view taken along line D-D of FIG. 2), one of the end region 51E is disposed on the front surface 3F of the isolation portion 32. With provision of the hard mask portion 62 for protecting the back surface 3B of the isolation portion 32, the transition portion 913 of the backside via 91 is prevented from penetrating through the isolation portion 32, and is thus prevented from being in contact with the end regions 51E of the gate portion 51 (in other words, short circuit between the transition portion 913 of the backside via 91 and the end regions 51E of the gate portion 51 can be avoided) although the SNR layer 81 may be formed in a discontinuous manner.

In some embodiments, the semiconductor structure 10 further includes a plurality of front-side contact portions 92 (see FIG. 5). Each of the front-side contact portions 92 is disposed on a corresponding one of the source/drain portions 401 of the devices 41 to 45 according to the circuit design of the semiconductor structure 10. Possible conductive materials suitable for the front-side contact portions 92 are similar to those for the backside via 91, and thus the details thereof are omitted for the sake of brevity. Other conductive materials suitable for the front-side contact portions 92 are within the contemplated scope of the present disclosure.

In some embodiments, one of the front-side contact portions 92 (e.g., the front-side contact portion denoted by 92R in FIG. 5) may have a horizontal part 921 and a vertical part 922. The horizontal part 921 is elongated in the Y direction, so as permit one of the source/drain portions 401 of the device 43 to be electrically connected to an adjacent one of the source/drain portions 401 of the device 44 through the horizontal part 921. The vertical part 922 is connected to the horizontal part 921, and extends through the ILD region 302 of the isolation portion 33. In some embodiments, the vertical part 922 is in contact with the main region 601 of the hard mask portion 63.

In some embodiments, the semiconductor structure 10 further includes a backside contact portion 93 disposed in the dielectric layer 700 and extending through the main region 601 of the hard mask portion 63 such that the backside contact portion 93 is brought into connection with the vertical part 922 of the front-side contact portion 92R. Possible conductive materials suitable for the backside contact portion 93 are similar to those for the backside via 91, and thus the details thereof are omitted for the sake of brevity. Other conductive materials suitable for the backside contact portion 93 are within the contemplated scope of the present disclosure.

In some alternative embodiments, the semiconductor structure 10 may further include additional features, and/or some features present in the semiconductor structure 80 may be modified, replaced, or eliminated without departure from the spirit and scope of the present disclosure. For example, in some embodiments, the semiconductor structure 10 further includes a plurality of liners 71A, 72B (see FIG. 3), multiple pairs of gate spacers 82 (see FIG. 2), multiple pairs of fin spacers 83 (see FIG. 5), a plurality of front-side silicon nitride re-deposition (SNR) layers 84 (see FIG. 2), and the details thereof will be described later.

Figure 7:
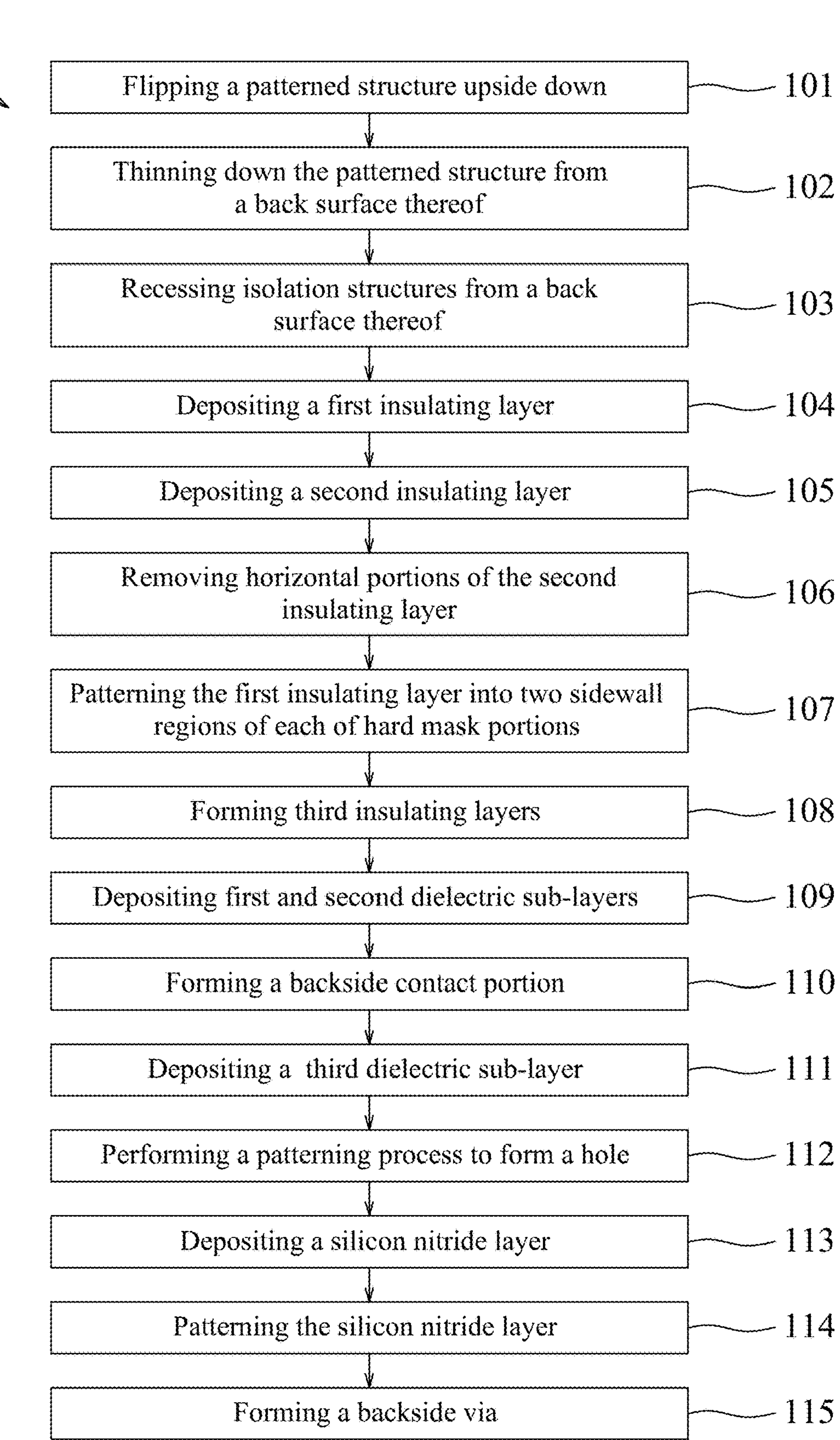
FIG. 7 is a flow diagram illustrating a method for manufacturing a semiconductor structure in accordance with some embodiments.

FIG. 7 is a flow diagram illustrating a method 100 for manufacturing a semiconductor structure (for example, the semiconductor structure 10 shown in FIGS. 1 to 5) in accordance with some embodiments. FIGS. 8A to 32 illustrate schematic views of intermediate stages of the method 100 in accordance with some embodiments. Some structures are omitted in FIGS. 8A to 32 for the sake of brevity. It is noted that similar numerals from the above-mentioned embodiments are used where appropriate, with some construction differences being indicated with different numerals.

Figure 17A:
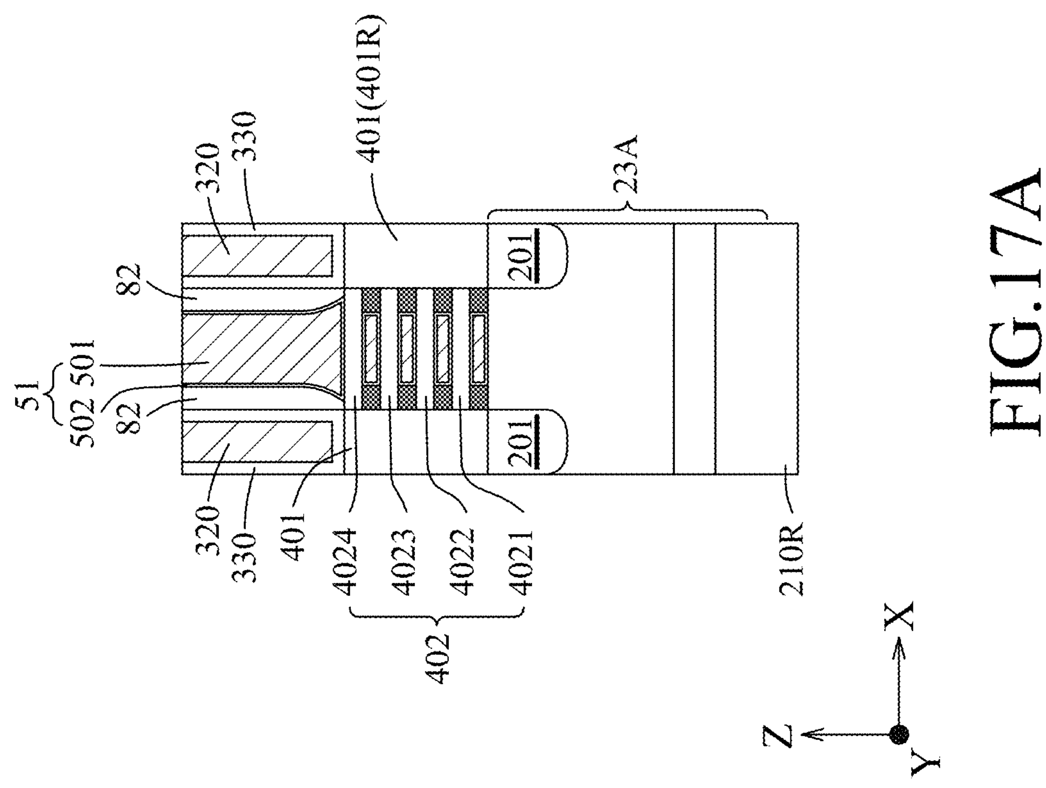
Figure 17B:
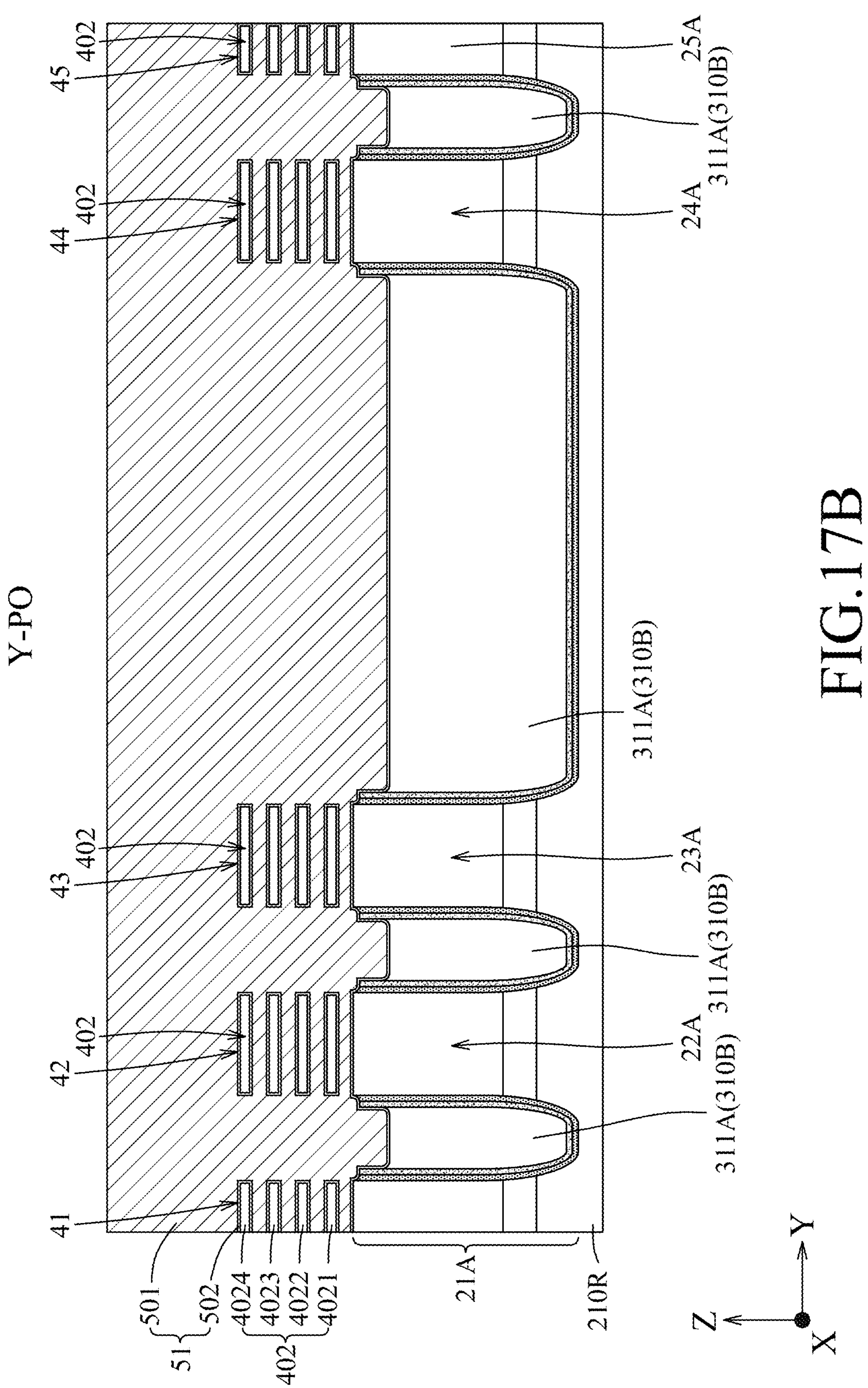
Figure 18A:
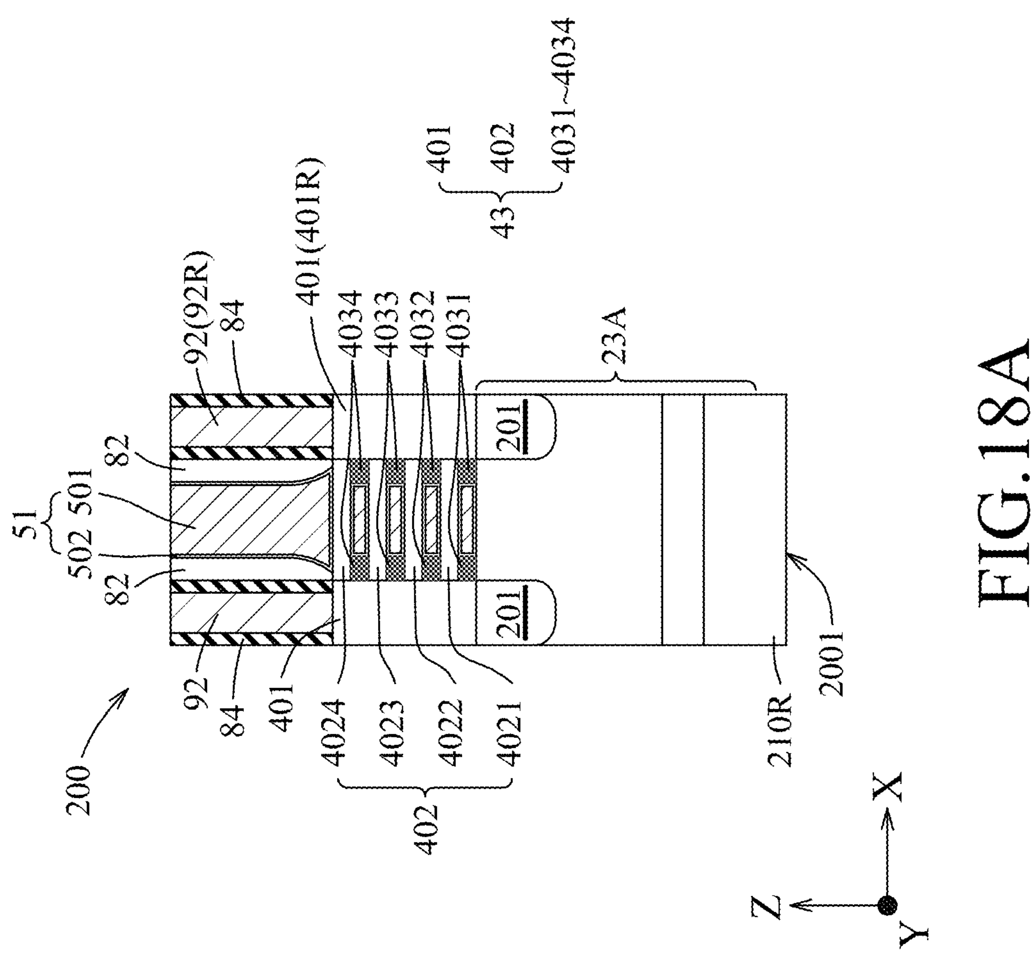
Figure 18B:
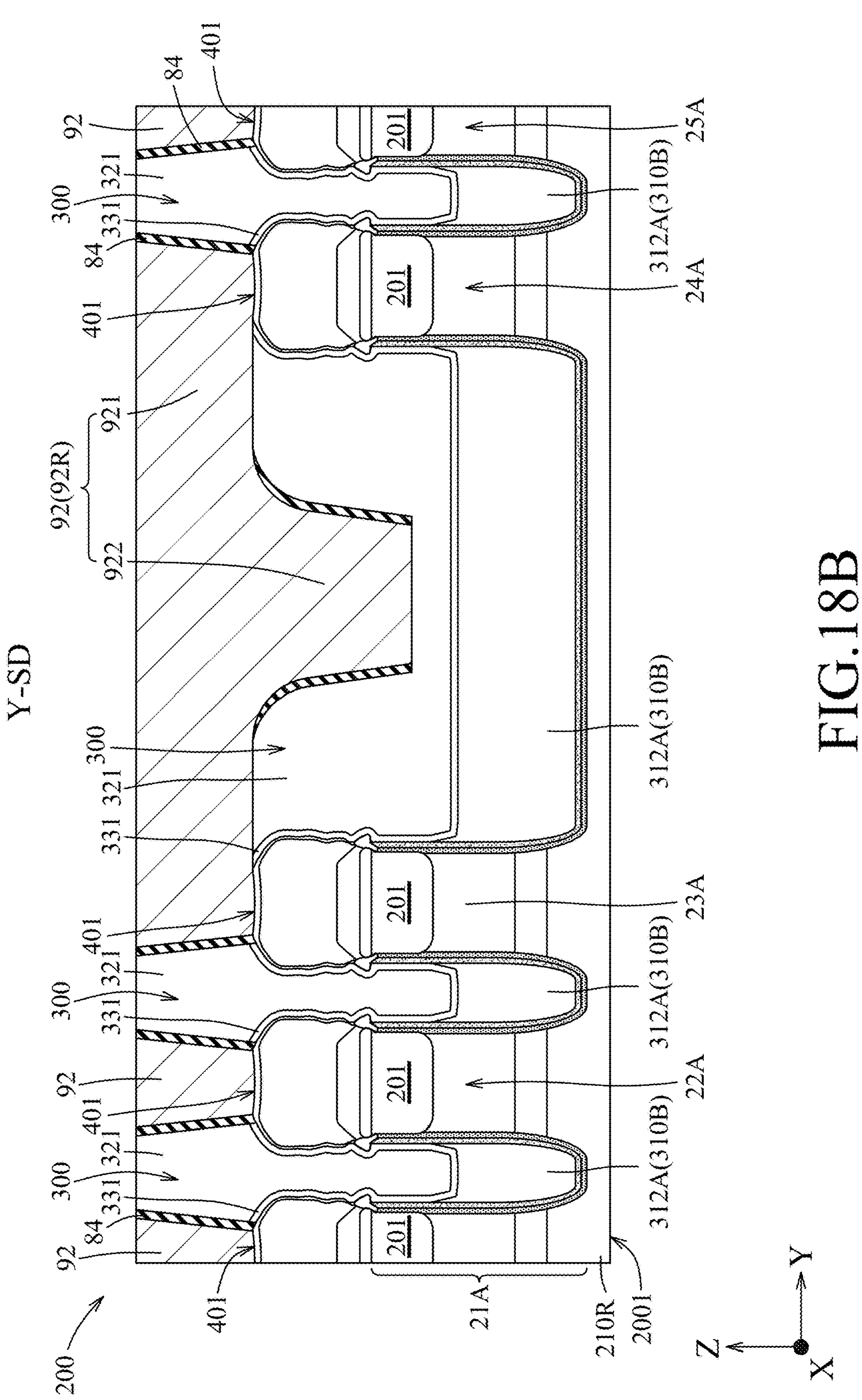
Figure 19A:
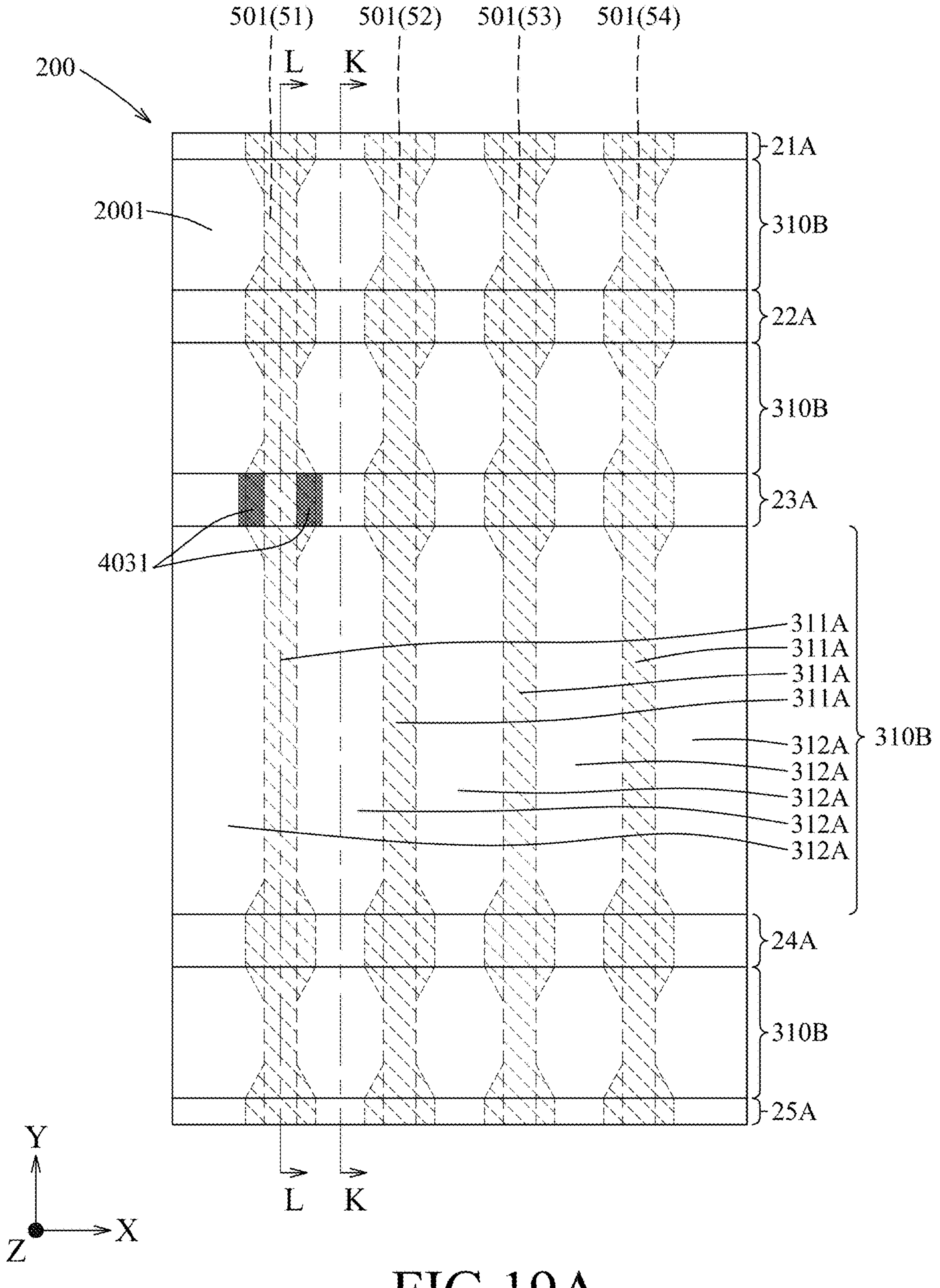
Figure 19B:
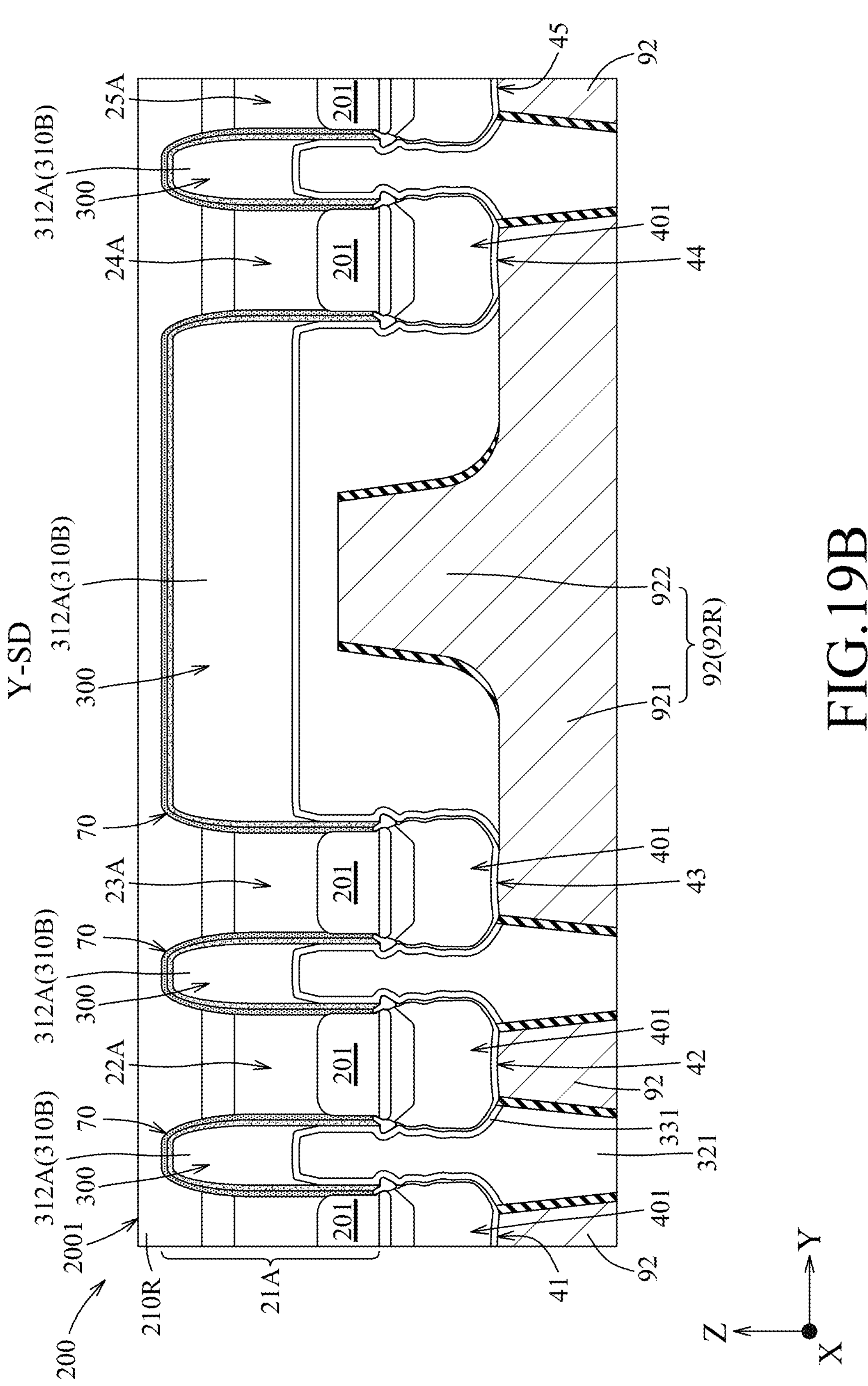
Figure 19C:
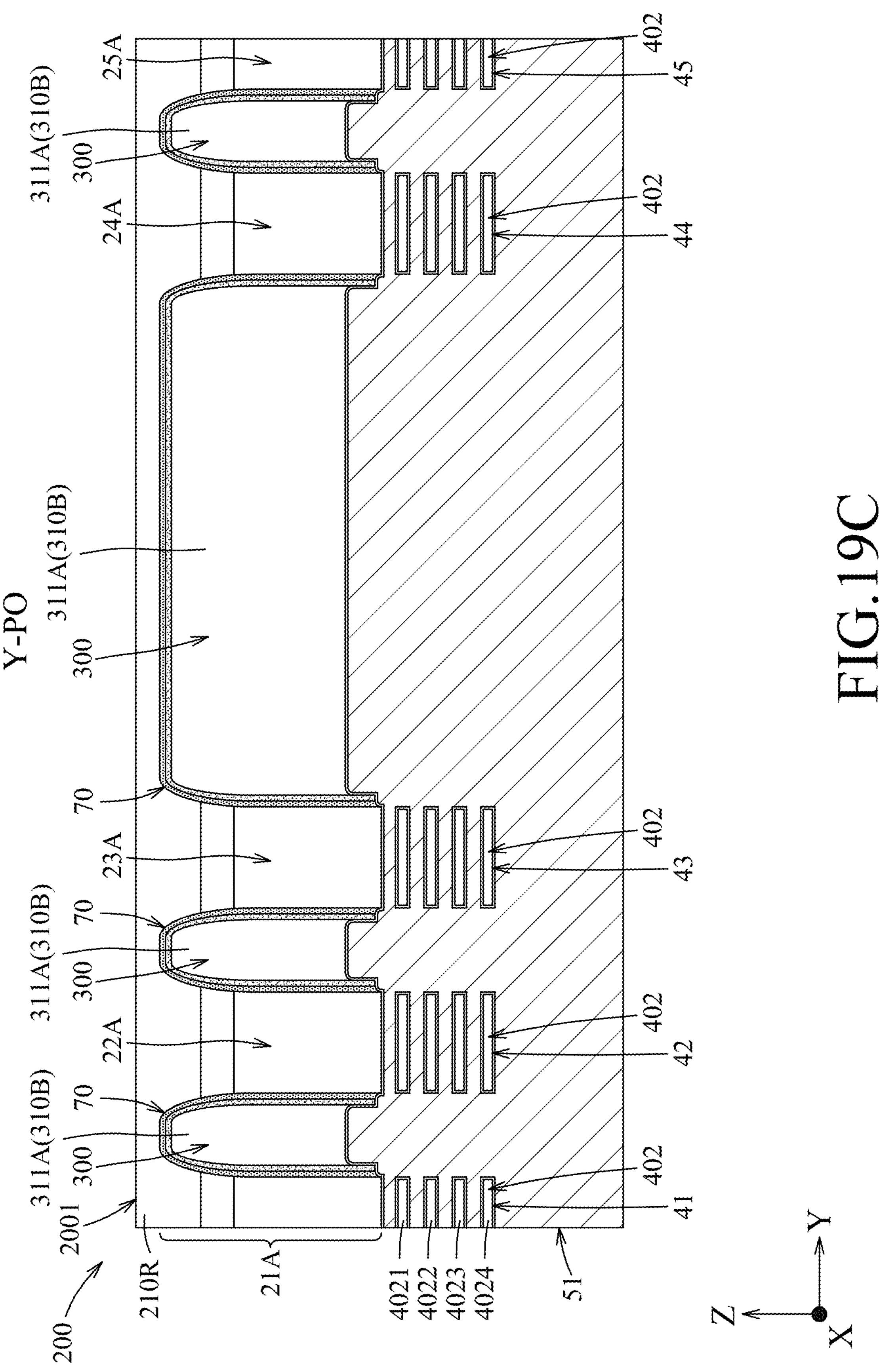

Referring to FIG. 7 and the examples illustrated in FIGS. 8A to 19C, the method 100 begins at step 101, where a patterned structure 200 shown in FIGS. 18A and 18B is flipped upside down. FIG. 19A is a schematic plane view of the patterned structure 200 when being viewed from a back surface 2001 (FIGS. 18A and 18B) in accordance with some embodiments, in which the fins 21A to 25A, trench isolations 310B, the gate electrode 501 of each of the gate portions 51 to 54, and the inner spacers 4031 of the device 43 (see FIG. 18A) are shown, and other elements are omitted. FIGS. 19B and 19C are schematic sectional views respectively taken along line K-K and line L-L of FIG. 19A in accordance with some embodiments, but further illustrating the other elements omitted in FIG. 19A.

In some embodiments, formation of the patterned structure 200 may include multiple sub-steps, as shown in FIGS. 8A to 18B.

Figure 8A:
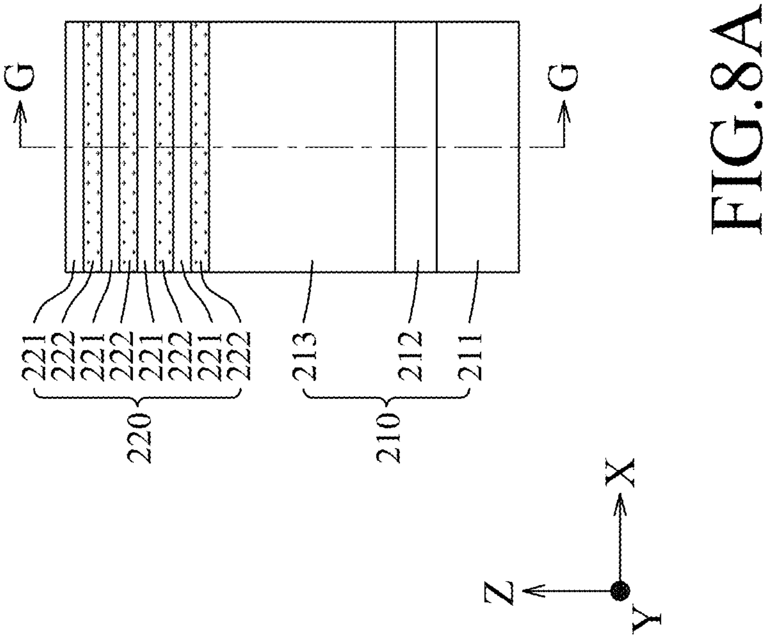
Figure 8B:
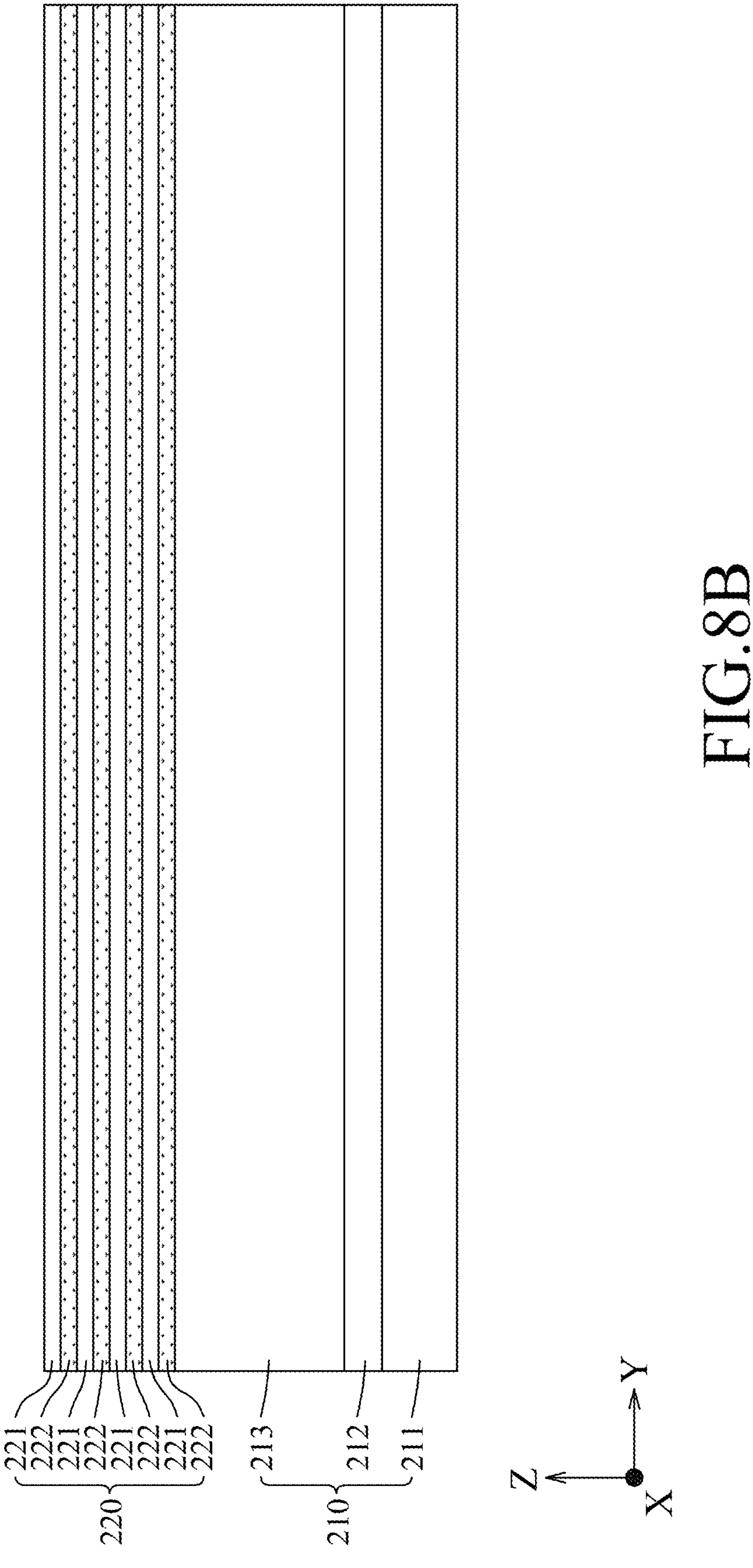

Referring to FIGS. 8A and 8B, a stack 220 is formed on a starting substrate 210 by chemical vapor deposition (CVD), atomic layer deposition (ALD), an epitaxial growth process (such as molecular-beam epitaxy (MBE), selective area epitaxy (SEG), etc.), or other suitable deposition techniques. FIG. 8B is a schematic sectional view taken along line G-G of FIG. 8A in accordance with some embodiments.

The starting substrate 210 may include elemental semiconductor materials (such as crystalline silicon, diamond, or germanium), compound semiconductor materials (such as silicon carbide, gallium arsenide, indium arsenide, or indium phosphide), alloy semiconductor materials (such as silicon germanium, silicon germanium carbide, gallium arsenide phosphide, or gallium indium phosphide), or combinations thereof. In addition, the starting substrate 210 may be a bulk silicon substrate, a silicon-on-insulator (SOI) substrate, or a germanium-on-insulator (GOI) substrate. In some embodiments, as shown in FIGS. 8A and 8B, the starting substrate 210 may be configured as a multi-layered structure having a plurality of sub-layers 211 to 213 stacked on each other. The sub-layer 212 serves as a stop layer (e.g., an etching stop layer, a polishing stop layer, or the like) in subsequent step(s), and thus the sub-layer 212 is made of a material different from that of each of the sub-layers 211, 213. In some embodiments, the sub-layer 212 is made of silicon germanium, and the sub-layers 211, 213 are each made of silicon. Other materials suitable for the starting substrate 210 are within the contemplated scope of the present disclosure.

The stack 220 includes four channel layers 221 and four sacrificial layers 222 disposed to alternate with the channel layers 221 in the Z direction. The channel layers 221 are used for forming the channel parts 4021 to 4024 of the channel portion 402 of each of the devices 41 to 45, and thus each of the channel layers 221 includes the material of the channel parts 4021 to 4024 of the channel portion 402 of each of the devices 41 to 45. Each of the sacrificial layers 222 is made of a material different from that of the channel layers 221, such that the sacrificial layers 222 may be selectively removed with the channel layers 221 being substantially intact due to different etching selectivities in an etching process. In some embodiments, each of the channel layers 221 is made of silicon, and each of the sacrificial layers 222 is made of silicon germanium. In some embodiments, each of the channel layers 221 has a thickness ranging from about 3 nm to about 8 nm. In some embodiments, each of the sacrificial layers 222 has a thickness ranging from about 5 nm to about 12 nm.

Figure 9A:
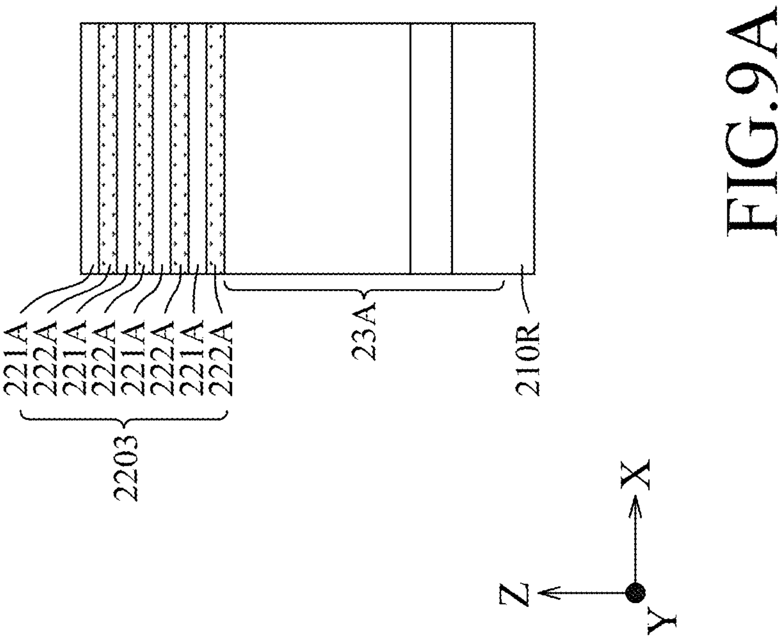
Figure 9B:
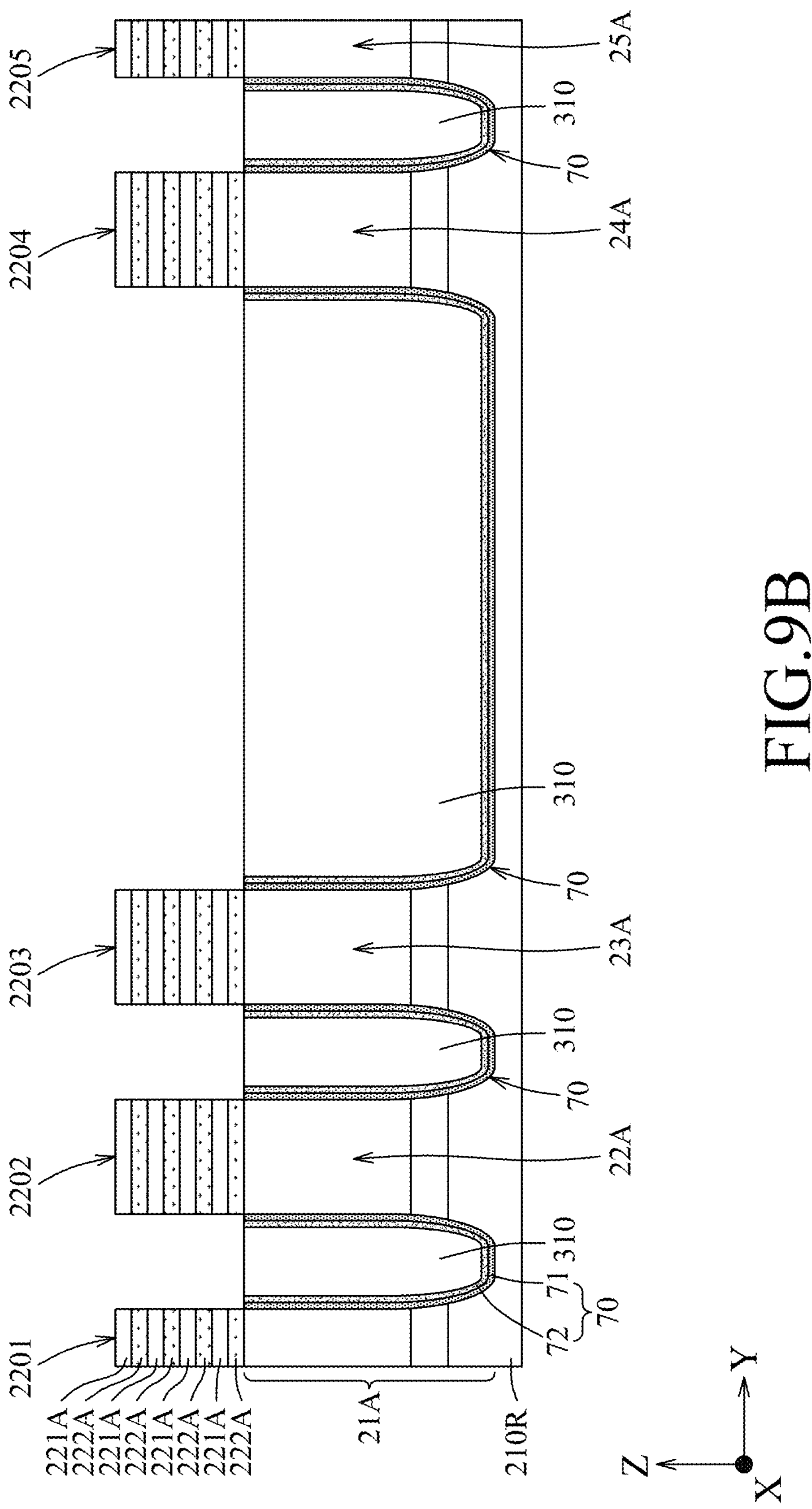

Referring to FIGS. 9A and 9B, which are views respectively subsequent to FIGS. 8A and 8B, the stack 220 and the starting substrate 210 (see FIGS. 8A and 8B) are patterned, and a plurality of trench isolations 310 are formed by suitable deposition processes and etching processes.

The stack 220 is patterned into stacking portions 2201 to 2205 (only the stack portion 2203 is exemplarily shown in FIG. 9A). Each of the stacking portions 2201 to 2205 includes four channel films 221A that are patterned from the channel layers 221 and four sacrificial films 222A that are patterned from the sacrificial layers 222. The starting substrate 210 is patterned into an underlying substrate 210R and the fins 21A to 25A (only the fin 23A is exemplarily shown in FIG. 9A) disposed on the underlying substrate 210R. In some embodiments, patterning of the stack 220 and the starting substrate 210 is performed by suitable processes including lithography and etching processes.

The trench isolations 310 are formed to alternate with the fins 21A to 25A in the Y direction by suitable processes including a deposition technique (for example, but not limited to, CVD or ALD) and an etching technique (for example, but not limited to, dry etching, wet etching, or a combination thereof), so as to separate two adjacent ones of the fins 21A to 25A. In some embodiments, the trench isolations 310 may each be a shallow trench isolation (STI), a deep trench isolation (DTI), or other suitable structures. Each of the trench isolations 310 will be patterned into the trench isolation regions 301 of a corresponding one of the isolation portions 31 to 34 as described above (see FIGS. 1, 3 and 4). Thus, possible insulating materials suitable for the trench isolations 310 may include silicon oxide, silicon nitride, silicon oxynitride, or combinations thereof. In some embodiments, a liner 70 is further formed to separate each of the trench isolations 310 from two corresponding adjacent ones of the fins 21A to 25A. In some embodiments, the liner 70 may include a first sub-layer 71 and a second sub-layer 72 that is disposed between the first sub-layer 71 and each of the trench isolations 310 so as to form a bi-layered structure. In some embodiments, the first sub-layer 71 is made of silicon, and the second sub-layer 72 is made of silicon oxide. Other materials suitable for the first and second sub-layers 71, 72 are within the contemplated scope of the present disclosure. In some embodiments not shown herein, the liner 70 may be configured as a single layer structure.

Figure 10A:
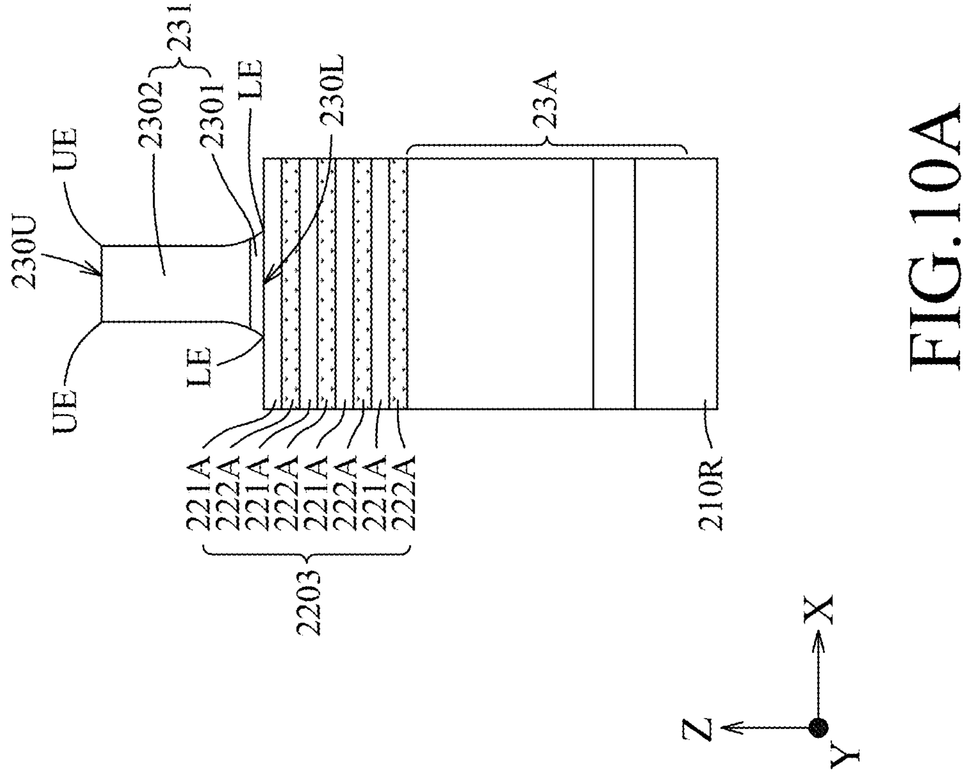
Figure 10B:
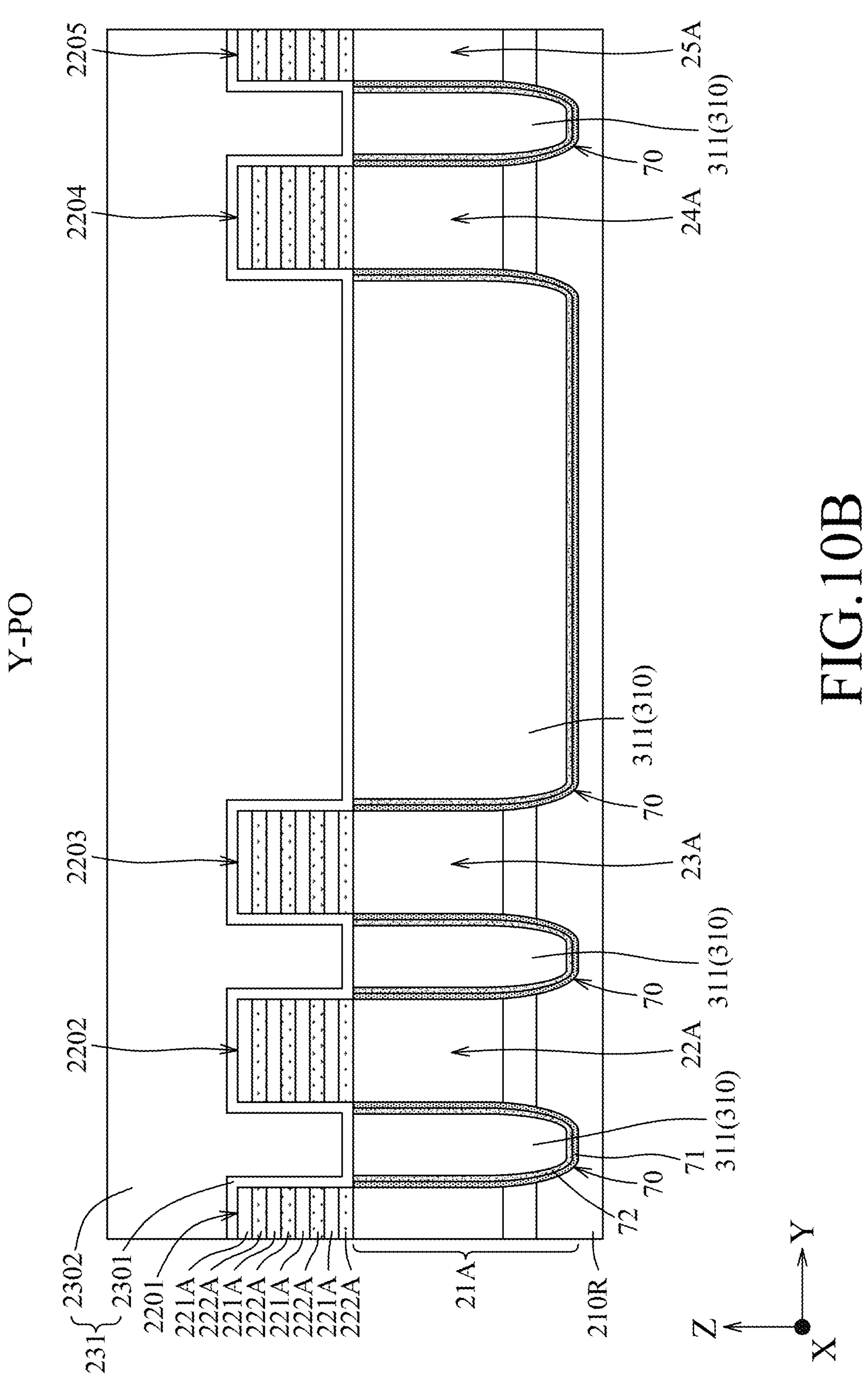
Figure 10C:
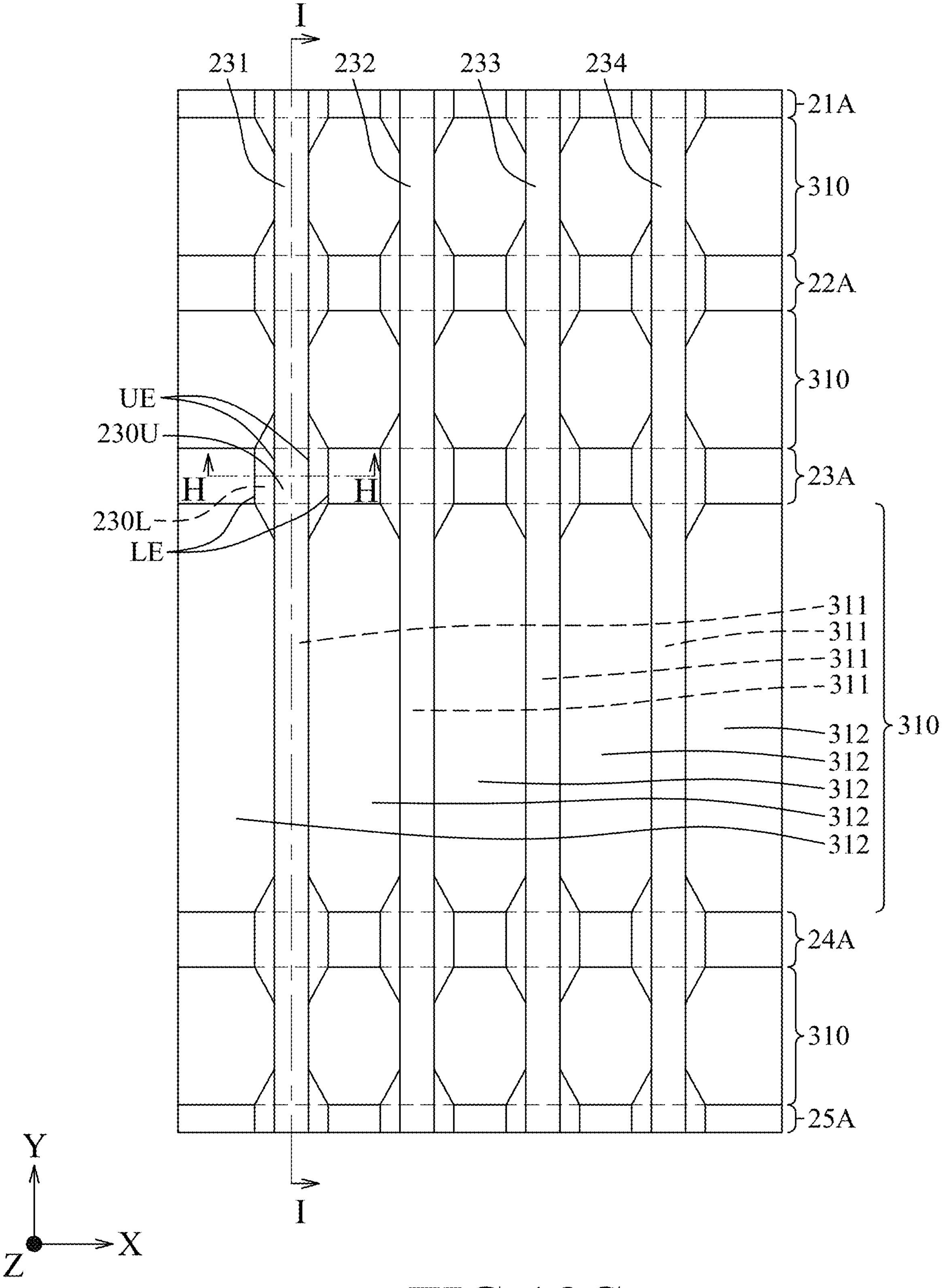

Referring to FIGS. 10A and 10B, which are views respectively subsequent to FIGS. 9A and 9B, four dummy gate structures 231 to 234 (see FIG. 10C, only the dummy gate structure 231 is shown in FIGS. 10A and 10B) are each formed over the stacking portions 2201 to 2205 and the trench isolations 310. FIG. 10C is a plane schematic plane view of the structure shown in FIGS. 10A and 10B when being viewed from a side opposite to the underlying substrate 210R in accordance with some embodiments, in which the fins 21A to 25A, the dummy gate structures 231 to 234 and the trench isolations 310 are illustrated, and other elements are omitted. FIGS. 10A and 10B are also schematic sectional views taken along line H-H and line I-I of FIG. 10C. As shown in FIG. 10C, the four dummy gate structures 231 to 234 are elongated in the Y direction, and spaced apart from each other in the X direction. The symbol "Y-PO" in FIG. 10B represents the cross-sectional view taken along line I-I, and other subsequent figures, each having the same symbol "Y-PO", represent the structure subsequent to FIG. 10B.

Each of the dummy gate structures 231 to 234 includes a dummy dielectric portion 2301 and a dummy gate portion 2302 that is disposed on the dummy dielectric portion 2301 and that is separated from the stacking portions 2201 to 2205 through the dummy dielectric portion 2301. In some embodiments, the dummy dielectric portion 2301 may include silicon oxide, silicon nitride, silicon oxynitride, high dielectric constant (k) materials, other suitable dielectric materials, or combinations thereof. In some embodiments, the dummy gate portion 2302 may include polycrystalline silicon, single crystalline silicon, amorphous silicon, or combinations thereof. Other materials suitable for the dummy gate structures 231 to 234 are within the contemplated scope of the present disclosure. The dummy gate structures 231 to 234 may be formed by suitable processes including a deposition technique (for example, but not limited to, CVD or ALD) and an etching technique (for example, but not limited to, dry etching, wet etching, or a combination thereof).

Referring to FIGS. 10A and 10C, each of the dummy gate structures 231 to 234 has an upper surface 230U distal from the underlying substrate 210R and a lower surface 230L proximate to the underlying substrate 210R. The upper surface 230U has two upper edges (UE) opposite to each other in the X direction, and the lower surface 230L has two lower edges (LE) opposite to each other in the X direction. As shown in FIG. 10C, each of the dummy gate structures 231 to 234 has dummy parts displaced from each other in the Y direction. A distance between the two upper edges (UE) in the X direction is substantially not significantly changed for the different dummy parts of each of the dummy gate structures 231 to 234. On the contrary, a distance between the two lower edges (LE) in the X direction is greater than the distance between the upper edges (UE) in the X direction at some of the dummy parts which are disposed over the fins 21A to 25A, respectively.

In practice, the position and dimension of the dummy gate structures 231 to 234 determine the position and dimension of the gate portions 51 to 54 to be formed subsequently. That is, the dummy gate structures 231 to 234 will be removed in subsequent steps, and then the gate portions 51 to 54 will be formed at the original position of the dummy gate structures 231 to 234. Therefore, a contour of each of the gate portions 51 to 54 in the plane view shown in FIG. 1 is similar to the contour of a corresponding one of the dummy gate structures 231 to 234 in the plane view shown in FIGS. 10C.

Figure 11A:
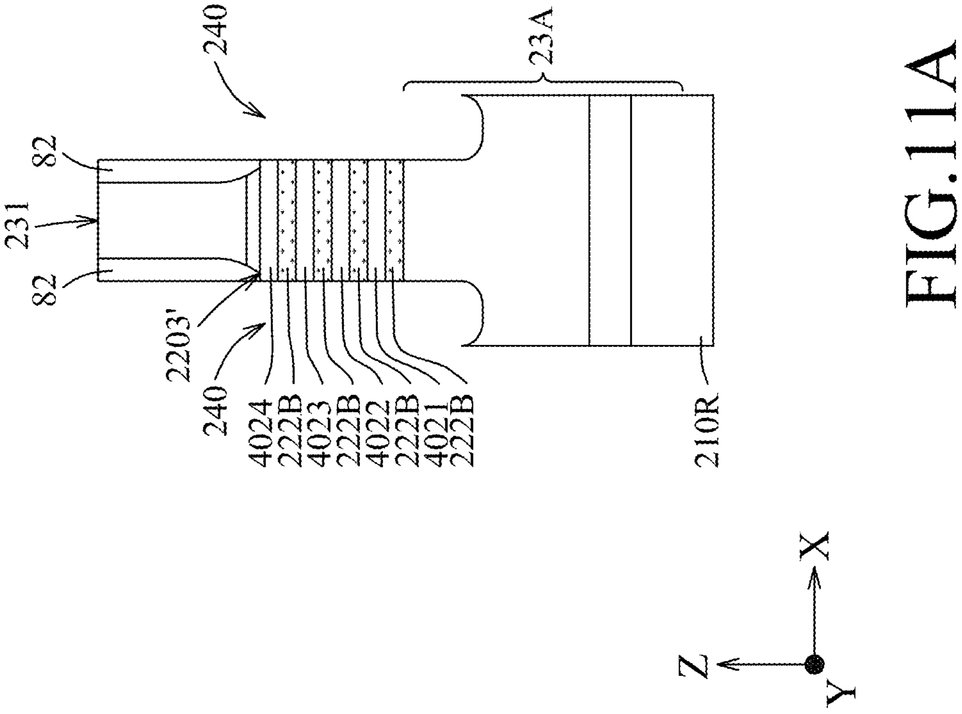
Figure 11B:
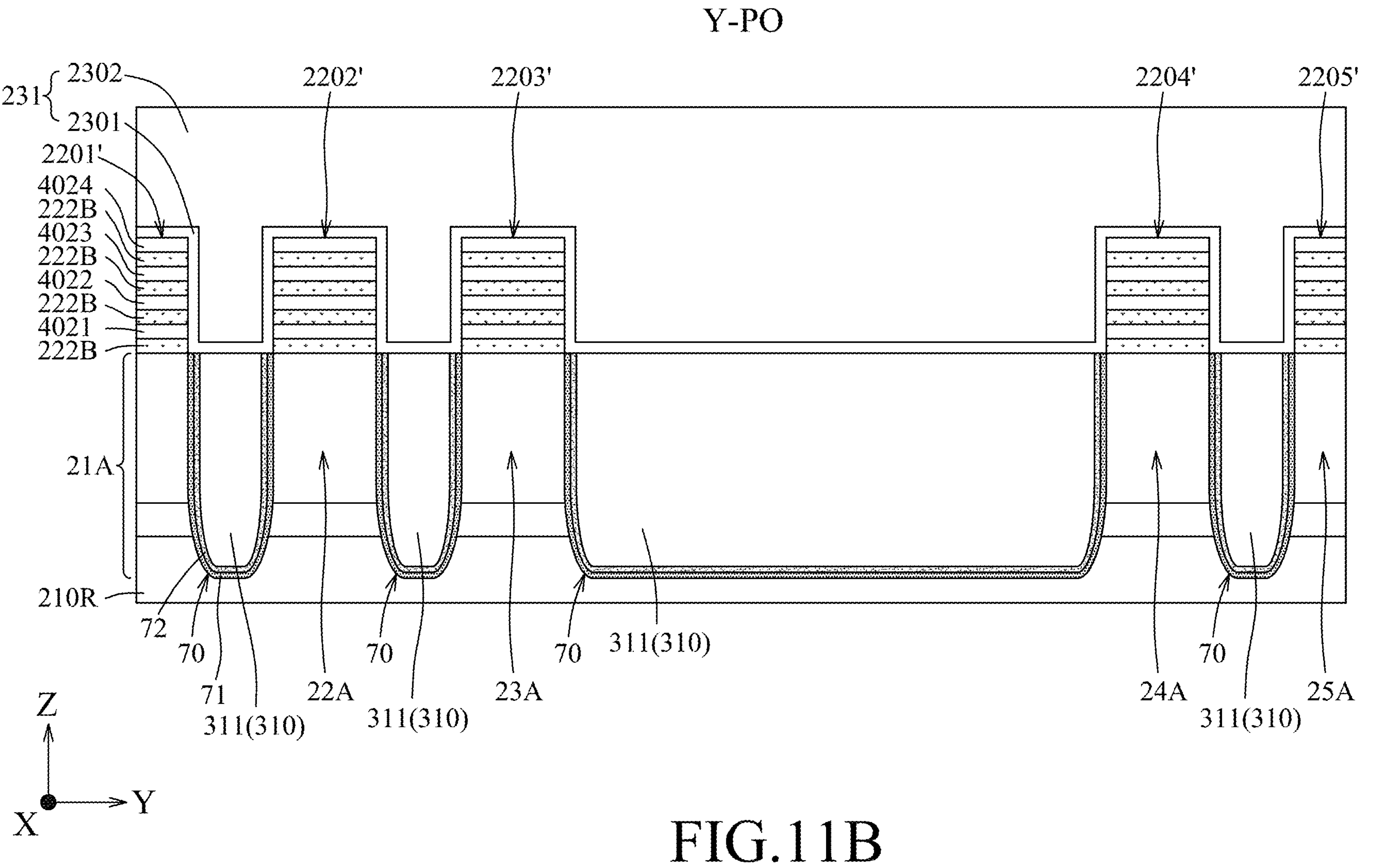

Referring to FIGS. 11A and 11B, which are views respectively subsequent to FIGS. 10A and 10B, each pair of the gate spacers 82 is formed at two opposite sides of a corresponding one of the dummy gate structures 231 to 234 in the X direction, and then each of the stacking portions 2201 to 2205 is patterned by an etching process using the dummy gate structures 231 to 234 and the gate spacers 82 as a hard mask, so as to form a plurality of recesses 240 (only two of the recesses 240 are shown in FIG. 11A). In some embodiments, during formation of the gate spacers 82, each pair of the fin spacers 83 is formed at two opposite sides of a corresponding one of the fins 21A to 25A in the Y direction (see FIG. 14B).

In some embodiments, the gate spacers 82 and the fin spacers 83 may be made of a dielectric material. The dielectric material for forming the gate spacers 82 and the fin spacers 83 may include a nitride-based material, such as silicon nitride, silicon oxynitride, silicon carbon nitride, silicon oxycarbonnitride, but is not limited thereto. Other materials suitable for forming the gate spacers 82 and the fin spacers 83 are within the contemplated scope of the present disclosure. In some embodiments, the gate spacers 82 and the fin spacers 83 may be formed using suitable processes including a deposition technique (for example, but not limited to, CVD or ALD) and an etching technique (for example, but not limited to, dry etching, wet etching, or a combination thereof). In some embodiments, each of the recesses 240 further extends into a corresponding one of the fins 21A to 25A.

The patterned stacking portions are respectively denoted by the numeral 2201' to 2205'. In each of the patterned stacking portions 2201' to 2205', the patterned channel films serve as the channel parts 4021 to 4024, and the patterned sacrificial films are denoted by the numeral 222B.

Figure 12A:
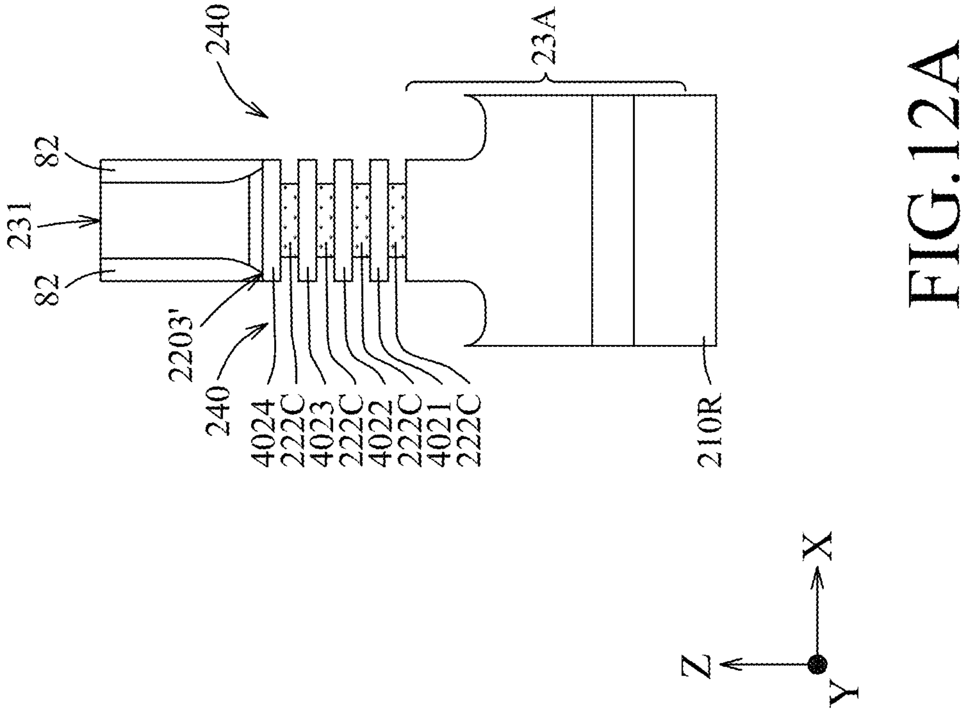
Figure 12B:
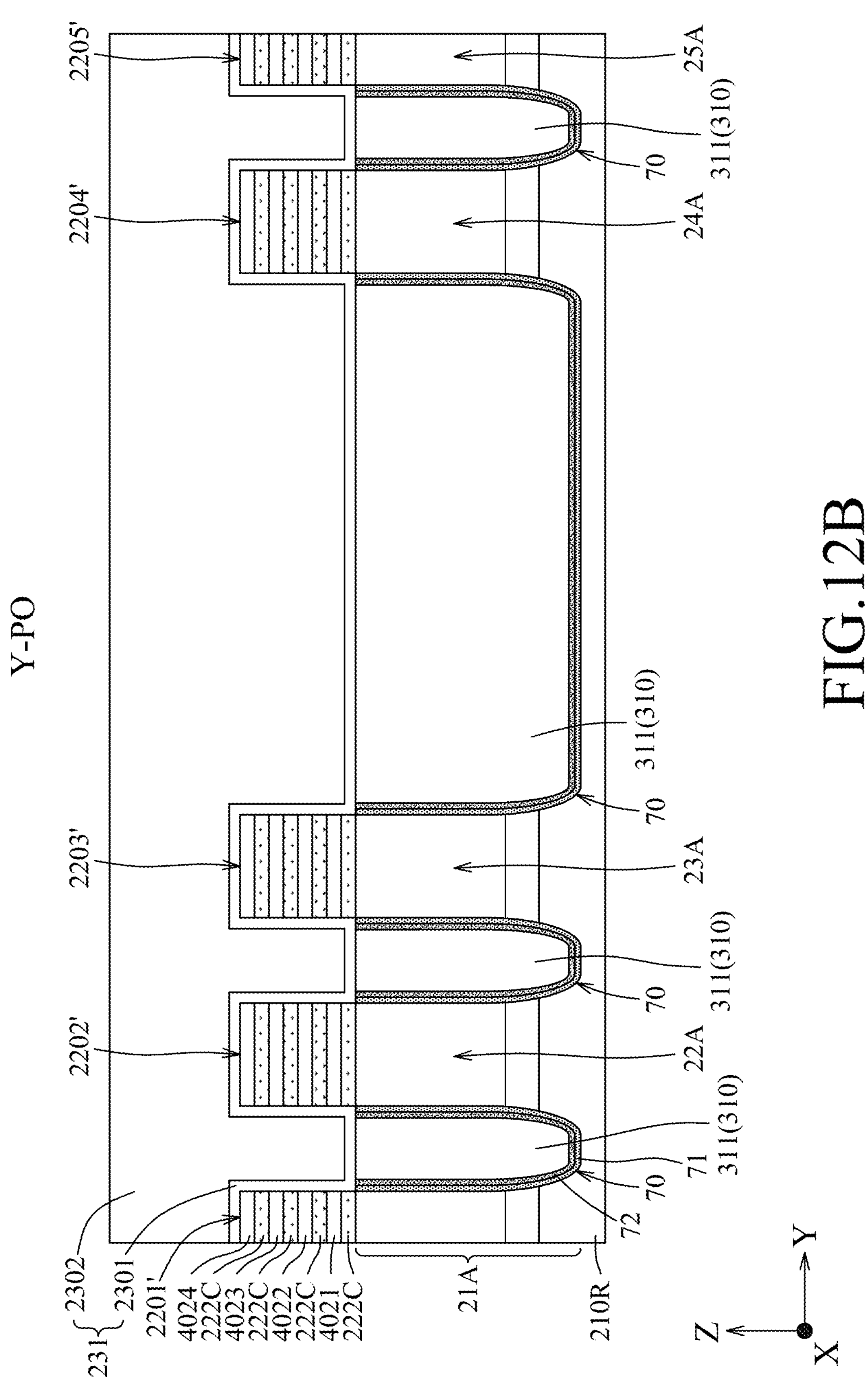

Referring to FIGS. 12A and 12B which are views respectively subsequent to FIGS. 11A and 11B, in each of the stacking portions 2201' to 2205', the sacrificial films 222B (see FIGS. 11A and 11B) are laterally trimmed using an etching process. The trimmed sacrificial films are denoted by the numeral 222C.

Figure 13:
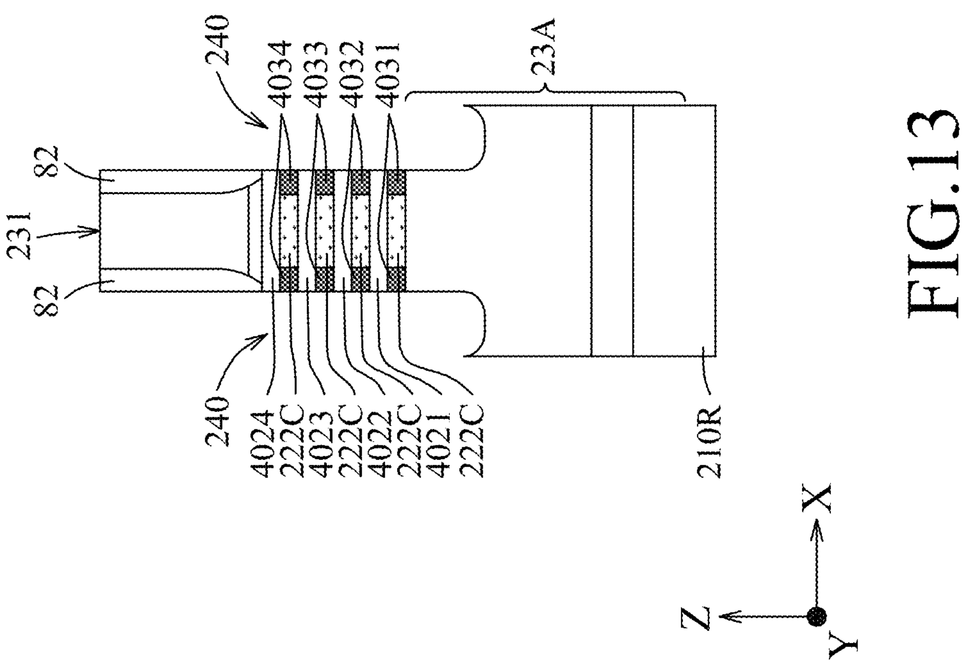

Referring to FIG. 13, which is a view subsequent to FIG. 12A, the pairs of inner spacers 4031 to 4034 are formed. During formation of the inner spacers 4031 to 4034, the structure shown in FIG. 12B is substantially not changed. Each pair of the inner spacers 4031 to 4034 are formed at two opposite sides of a corresponding one of the trimmed sacrificial films 222C in the X direction.

Figure 14B:
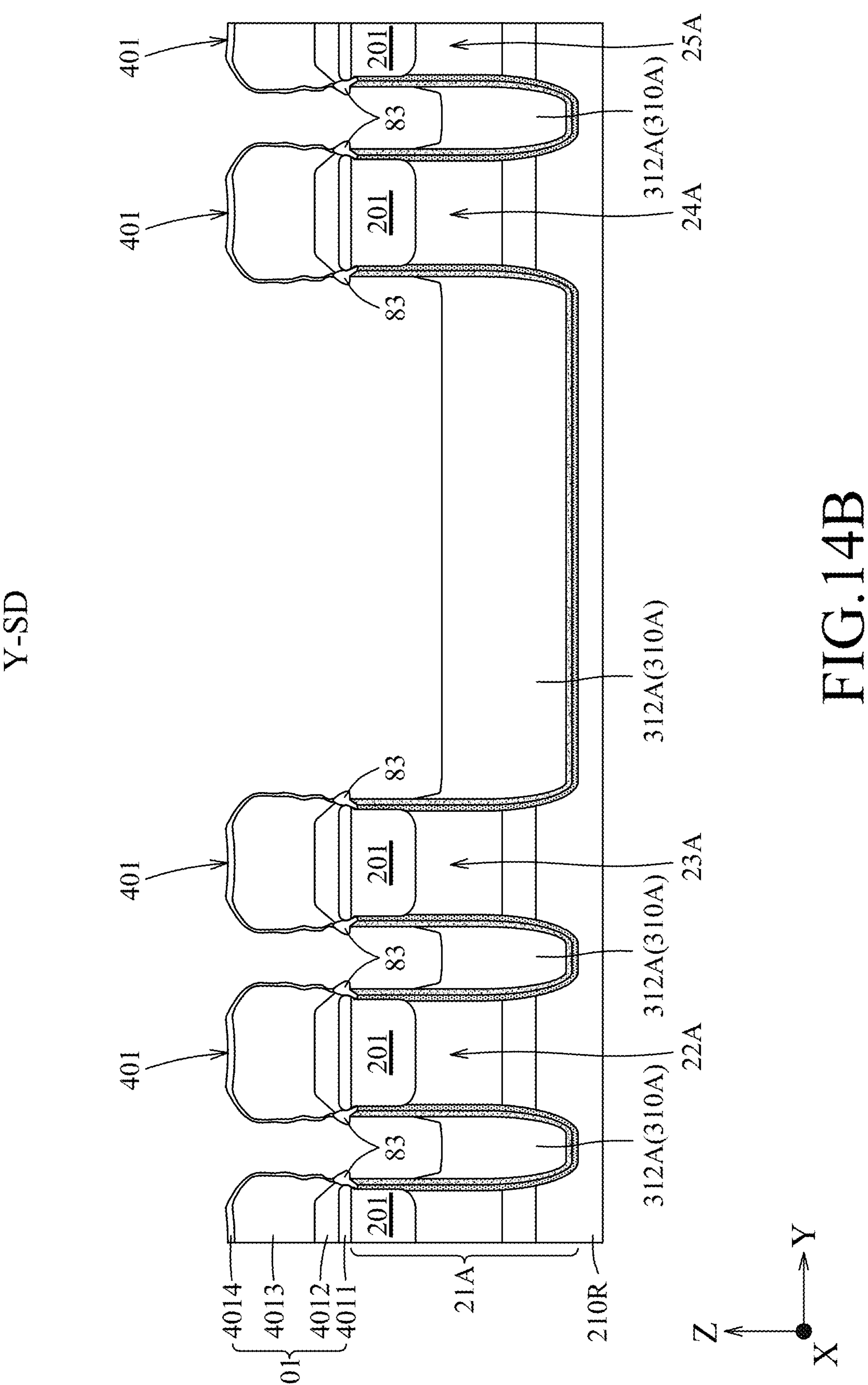

Referring to FIGS. 14A, which is a view respectively subsequent to FIG. 13, and referring to FIG. 14B, which is a schematic sectional view taken along line J-J of FIG. 14A, the un-doped regions 201 are formed in the fins 21A to 25A through the recesses 240 (see FIG. 13), and the source/drain portions 401 are respectively formed on the un-doped regions 201, thereby obtaining the devices 41 to 45 as described above with reference to FIGS. 2 to 5. The symbol "Y-SD" in FIG. 14B represents the cross-sectional view taken along line J-J, and other subsequent figures, each having the same symbol "Y-SD", represent the structure subsequent to FIG. 14B.

In some embodiments, formation of the un-doped regions 201 and the source/drain portions 401 may be performed by an epitaxial growth process including molecular-beam epitaxy (MBE), an epitaxial deposition/partial etch process, such as a cyclic deposition-etch (CDE) process and/or a selective epitaxial growth (SEG) process, but the disclosure is not limited to such. The structural detail (i.e., the sub-layers 4011 to 4014) of each of the source/drain portions 401 are shown in FIG. 14B, and omitted in FIG. 14A. During formation of the un-doped regions 201 and the source/drain portions 401, the structure shown in FIG. 12B is substantially not changed.

Referring back to FIG. 10C, each of the trench isolations 310 has four first regions 311 (one of which is shown in FIG. 12B) respectively located beneath the dummy gate structures 231 to 234, and five second regions 312 exposed from the dummy gate structures 231 to 234. In some embodiments, during formation of the un-doped regions 201 and the source/drain portions 401, the second regions 312 of each of trench isolations 310 may be also etched. As shown in FIG. 14B, in the structure after formation of the un-doped regions 201 and the source/drain portions 401, each of the etched trench isolations 310A includes the etched second regions 312A (one of which is shown in FIG. 15B) and the first regions 311 (which are respectively protected by the dummy gate structures 231 to 234, see FIG. 12B).

Figure 15A:
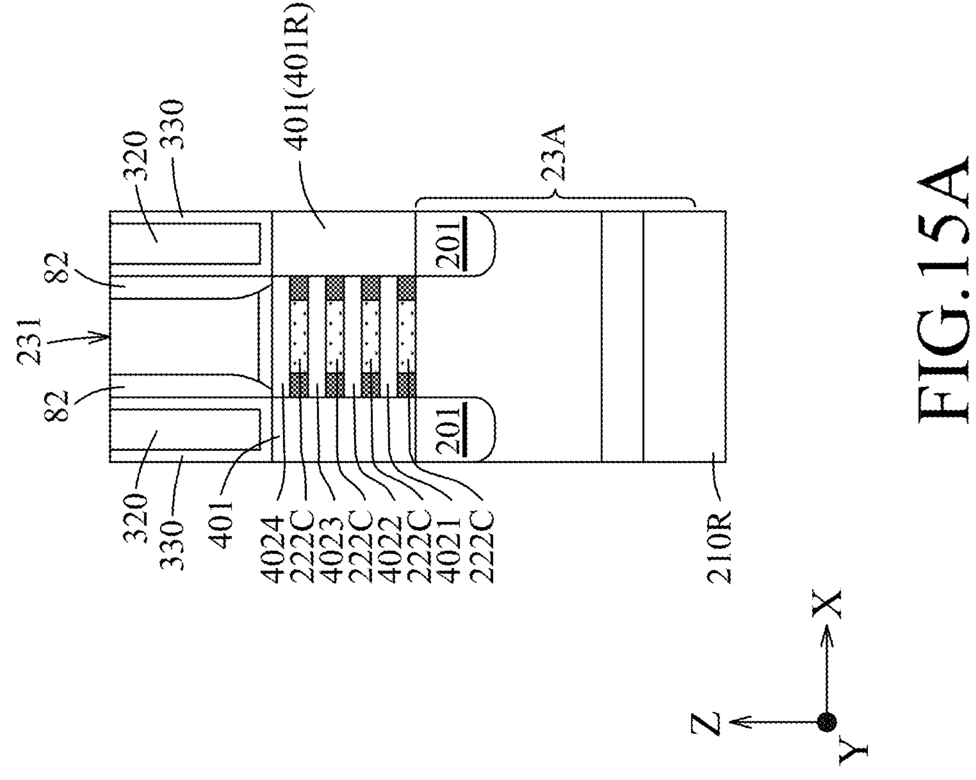
Figure 15B:
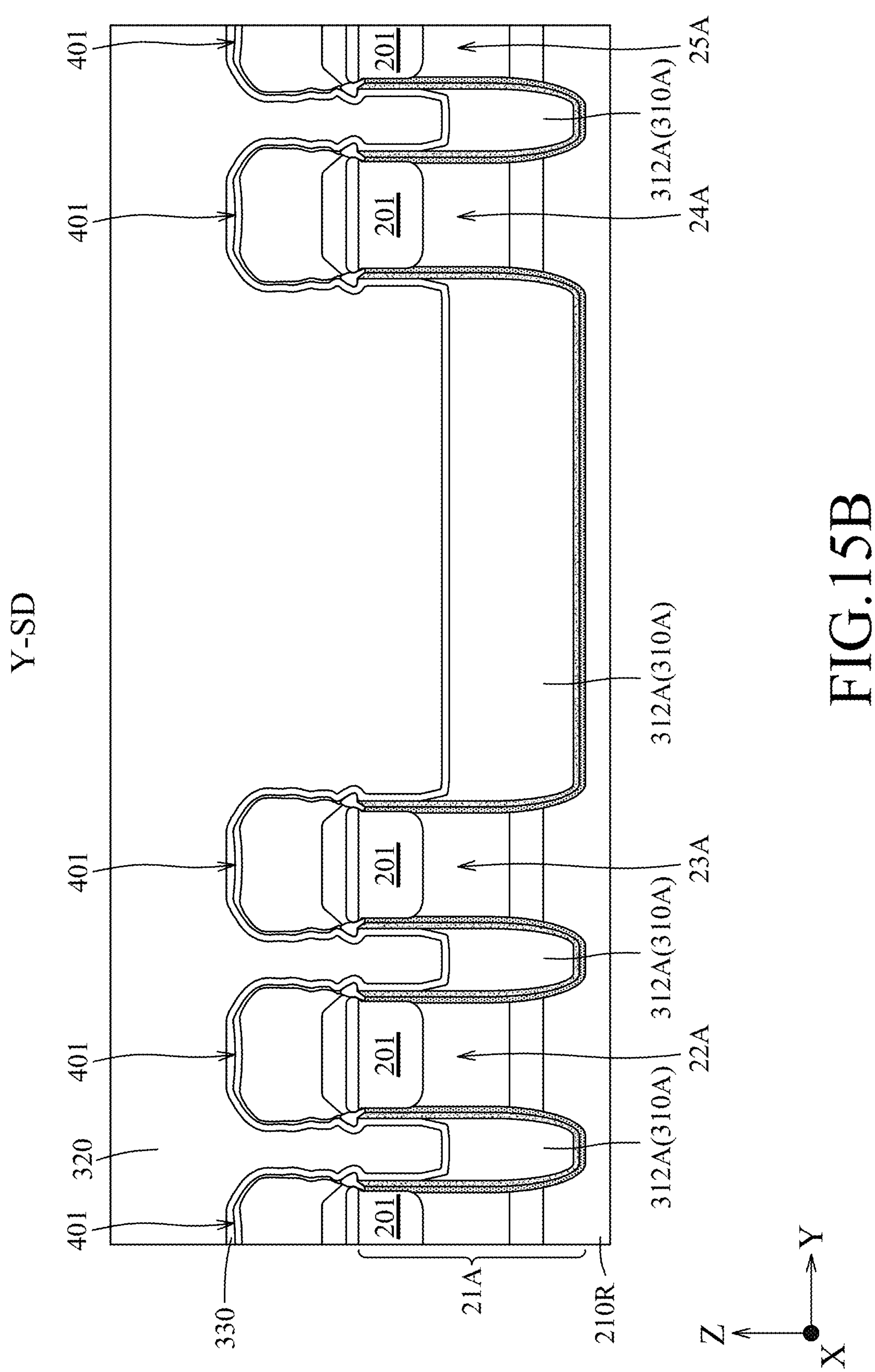

Referring to FIGS. 15A and 15B, which are views respectively subsequent to FIGS. 14A and 14B, a plurality of contact etching stop layers (CESLs) 330 and a plurality of inter-layer dielectric (ILD) layers 320 are sequentially formed to cover the source/drain portions 401 using a deposition process followed by a planarization process to expose the dummy gate structures 231 to 234. During formation of the CESLs 330 and the ILD layers 320, the structure shown in FIG. 12B is substantially not changed. The ILD layers 320 are disposed to alternate with the dummy gate structures 231 to 234 in the X direction, and each of the CESLs 330 is formed around a corresponding one of the ILD layers 320, although only two of the ILD layers 320, two of the CESLs 330, and the dummy gate structure 231 are exemplarily shown in FIG. 15A.

In some embodiments, the ILD layers 320 may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), spin-on-glass (SOG), or combinations thereof. The CESLs 330 are made of a material different form the material(s) of the ILD layers 320. In some embodiments, the CESLs 330 are made of silicon nitride. Other dielectric materials suitable for the ILD layers 320 and the CESLs 330 are within the contemplated scope of the present disclosure.

Figure 16A:
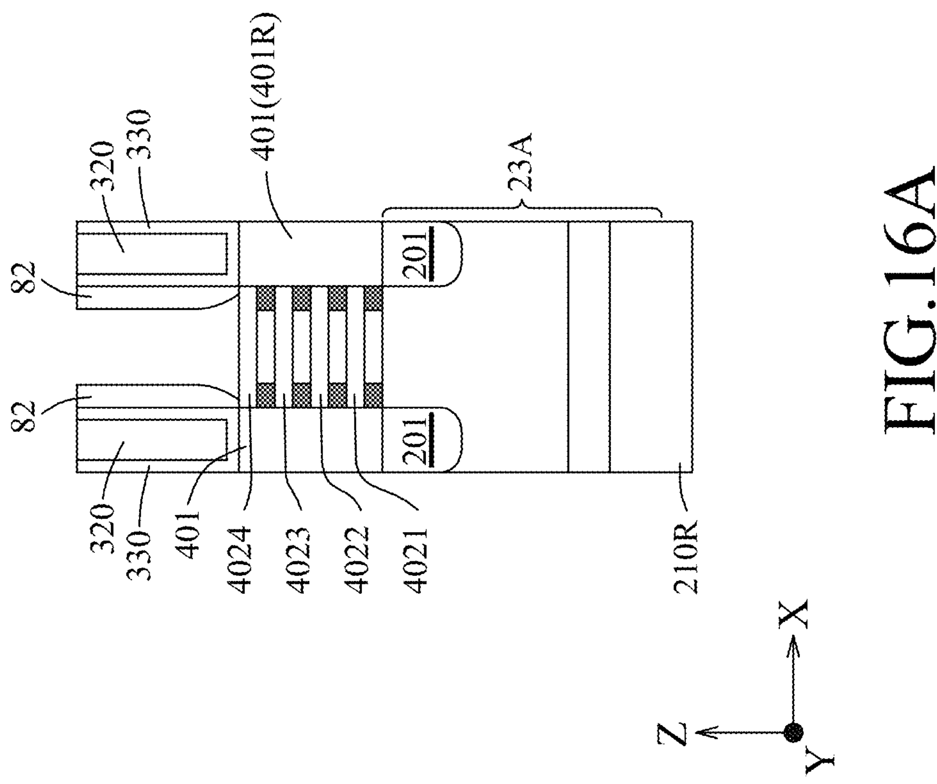
Figure 16B:
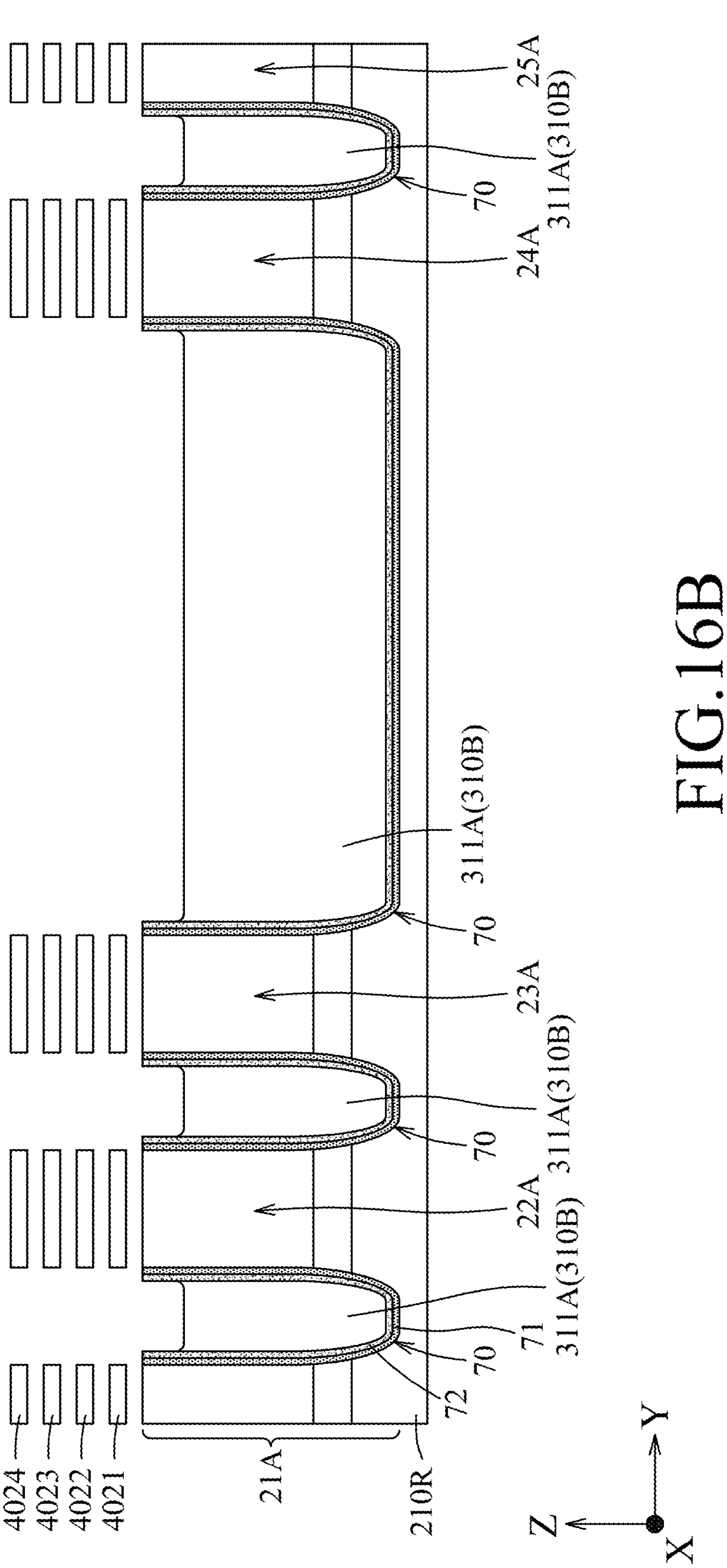

Referring to FIGS. 16A and 16B, which are views respectively subsequent to FIGS. 15A and 12B, the dummy gate structures 231 to 234 (see FIGS. 15A and 12B) and the sacrificial films 222C are sequentially removed using a selective etching process (e.g., a wet etching process) without damaging the channel parts 4021 to 4024. During the removal of the dummy gate structures 231 to 234 and the sacrificial films 222C, the structure shown in FIG. 15B is substantially not changed.

In some embodiments, the first regions 311 (one of which is shown in FIG. 12B) of each of the etched trench isolations 310A may be etched by etching species used in the removal of the dummy gate structures 231 to 234 and the sacrificial films 222C such that the etched trench isolations 310A are formed into the trench isolations 310B. In FIG. 16B, which illustrates the structure after the removal of the dummy gate structures 231 to 234 and the sacrificial films 222C, each of the etched trench isolations 310B includes the etched first regions 311A and the etched second regions 312A (see FIG. 15B).

Referring to FIGS. 17A and 17B, which are views respectively subsequent to FIGS. 16A and to 16B, the gate portions 51 to 54 are each formed to surround the channel parts 4021 to 4024 using CVD, ALD, or other suitable deposition techniques, followed by a planarization process to expose the ILD layers 320. The structure shown in FIG. 15B is substantially not changed during formation of the gate portions 51 to 54.

Referring to FIGS. 18A and 18B, which are views respectively subsequent to FIGS. 17A and 15B, the front-side SNR layers 84 and the front-side contact portions 92 are formed, thereby obtaining the patterned structure 200. The structure shown in FIG. 17B is substantially not changed during formation of the front-side SNR layers 84 and the front-side contact portions 92.

The front-side contact portions 92 are formed in each of the ILD layers 320 (one of the ILD layers 320 is shown in FIG. 15B) and extends through a corresponding one of the CESLs 330 (one of the ILD layers 320 is shown in FIG. 15B) so as to permit each of the source/drain portions 401 to be electrically connected to an external circuit through a corresponding one of the front-side contact portions 92. In each of the ILD layers 320, each of the front-side SNR layers 84 is formed around a corresponding one of the front-side contact portions 92 to separate the corresponding front-side contact portion 92 from adjacent electrically conductive elements.

In some embodiments, formation of the front-side SNR layers 84 and the front-side contact portions 92 may be performed by etching process(es), deposition process(es) (such as physical vapor deposition (PVD), CVD or ALD), and a planarization process to expose the ILD layers 320.

In some embodiments, as shown in FIG. 18B, after formation of the front-side SNR layers 84 and the front-side contact portions 92, each of the ILD layers 320 (one of which is shown in FIG. 15B) is patterned into four inter-layer dielectric (ILD) parts 321 spaced apart from each other in the Y direction, and each of the CESLs 330 (one of which is shown in FIG. 15B) is patterned into four contact etching stop parts 331 spaced apart from each other in the Y direction. In this stage, isolation structures 300 (see FIG. 18B) are obtained, each including one of the etched trench isolations 310B (see FIG. 19A), a corresponding one of the ILD parts 321 of each of the patterned ILD layers (i.e., the ILD parts displaced from each other in the X direction and disposed on the one of the etched trench isolations 310B), and a corresponding one of the contact etching stop parts 331 of each of the patterned CESLs (i.e., the contact etching stop parts 331 displaced from each other in the X direction and disposed on the one of the etched trench isolations 310B).

In some embodiments not shown herein, the patterned structure 200 may further include a plurality of interconnect layers each including an inter-metal dielectric (IMD) feature in which a plurality of electrically conductive elements (for example, metal contacts, metal lines and/or metal vias) are formed so as to permit the devices 41 to 45 and the gate portions 51 to 54 to be electrically connected to external circuits through the electrically conductive elements. In some embodiments, the interconnect layers may be formed by a dual damascene process, a single damascene process, or other suitable back-end-of-line (BEOL) techniques.

Figure 20A:
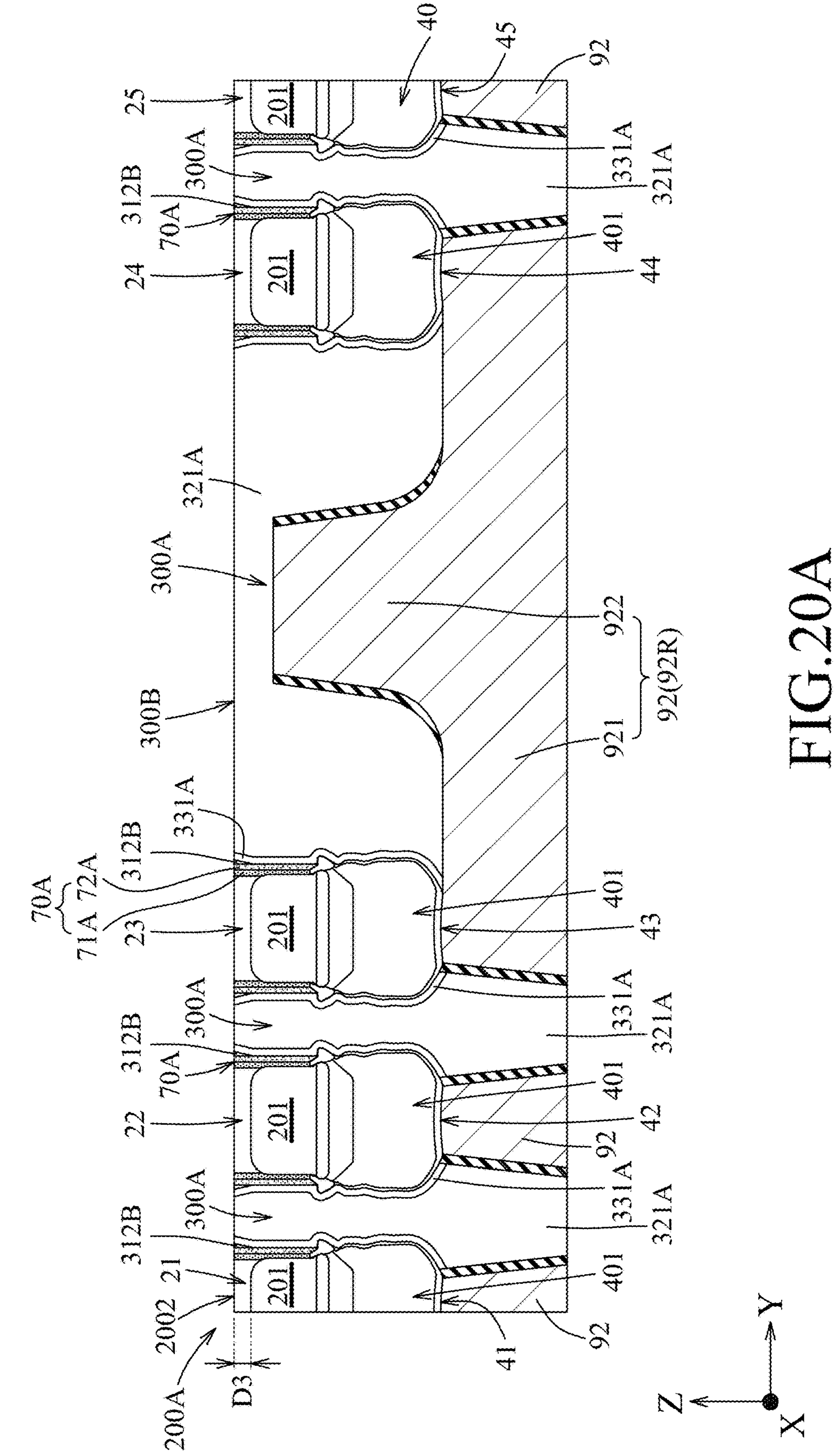
Figure 20B:
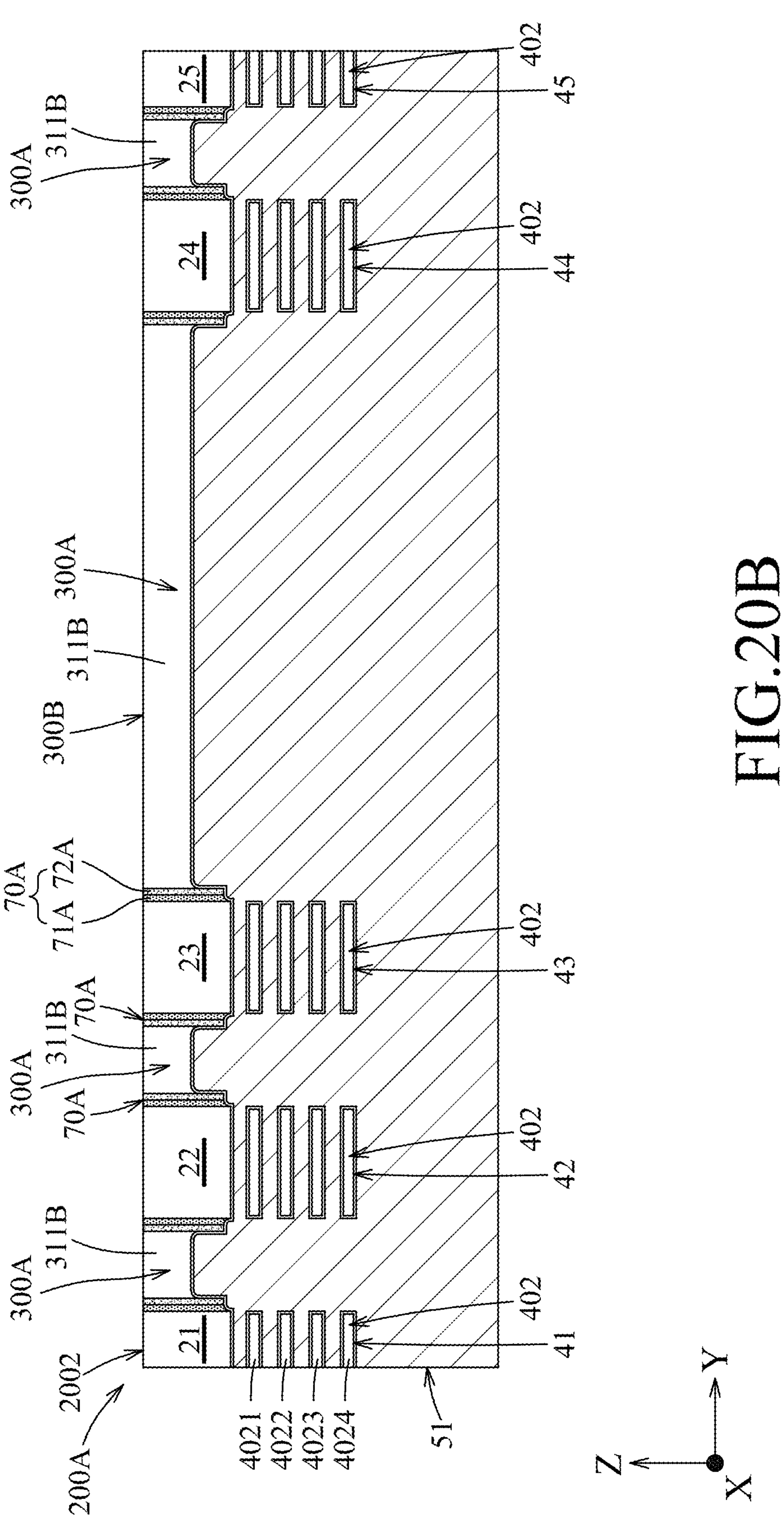

Referring to FIG. 7 and the examples illustrated in FIGS. 20A and 20B, the method 100 proceeds to step 102, where the patterned structure 200 is thinned down from the back surface 2001 (see FIGS. 19B and 19C) by one or more planarization processes (for example, but not limited to, chemical mechanical polishing), and/or one or multiple etching processes. FIGS. 20A and 20B are schematic sectional views respectively similar to FIGS. 19B and 19C, but illustrating the structure after step 102. The patterned structure after being thinned down is denoted by 200A, and has a back surface 2002.

When comparing the patterned structure 200 (i.e., before step 102, see FIGS. 19B and 19C) with the thinned-down patterned structure 200A (i.e., after step 102, see FIGS. 20A and 20B), it can be seen that, after step 102, (i) the underlying substrate 210R is completely removed, (ii) the fins 21A to 25A are partially removed and respectively formed into the fin portions 21 to 25, (iii) the isolation structures 300 are partially removed, and (iv) the liners 70 are partially removed. After step 102, as shown in FIGS. 20A and 20B, the liners, the first sub-layer and the second sub-layer in each of the liners are respectively denoted by the numerals 70A, 71A and 72A. The partially removed isolation structures are each denoted by the numeral 300A, and has a back surface 300B that is flush with the back surface 2002 of the thinned-down patterned structure 200A.

In some embodiments, in step 102, the etched first regions 311A (see FIG. 19C are formed into first regions 311B (see FIG. 20B); and the etched second regions 312A (see FIG. 19B) are formed into second regions 312B (see FIG. 20A). In addition, the ILD parts 321 and the contact etching stop parts 331 (see FIG. 19B) are formed into ILD parts 321A and contact etching stop parts 331A (see FIG. 20A). Each of the isolation structures 300A includes corresponding first regions 311B (displaced from each other in the X direction), corresponding second regions 312B (alternating with the corresponding first regions 311B in the X direction), corresponding ILD parts 321A (displaced from each other in the X direction), and corresponding contact etching stop parts 331A (displaced from each other in the X direction).

In some embodiments, as shown in FIG. 20A, after step 102, a distance (D3) between the back surface 2002 and each of the un-doped regions 201 may range from about 10 nm to about 100 nm depending on the amount thinned of the patterned structure 200 in step 102.

Figure 21A:
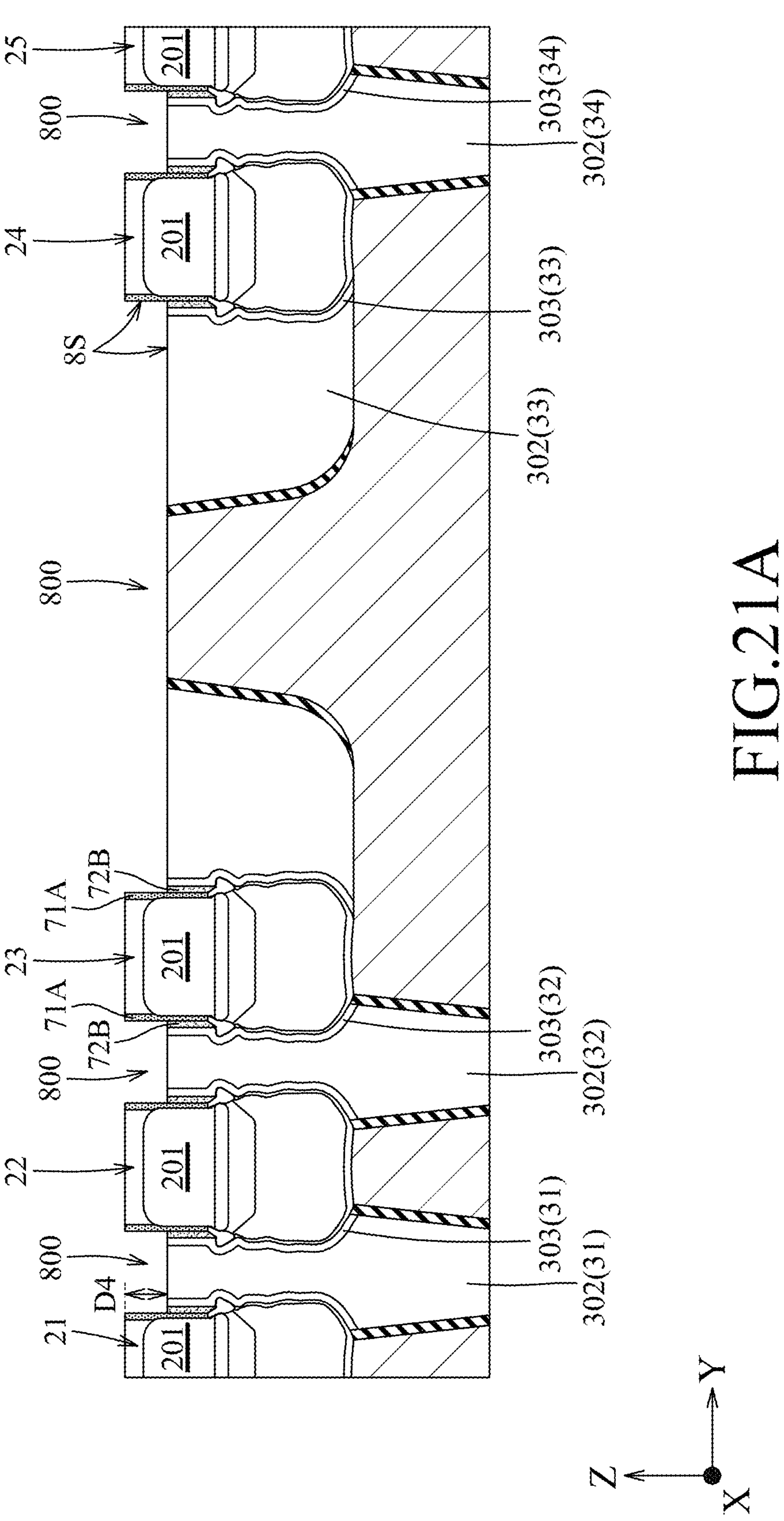
Figure 21B:
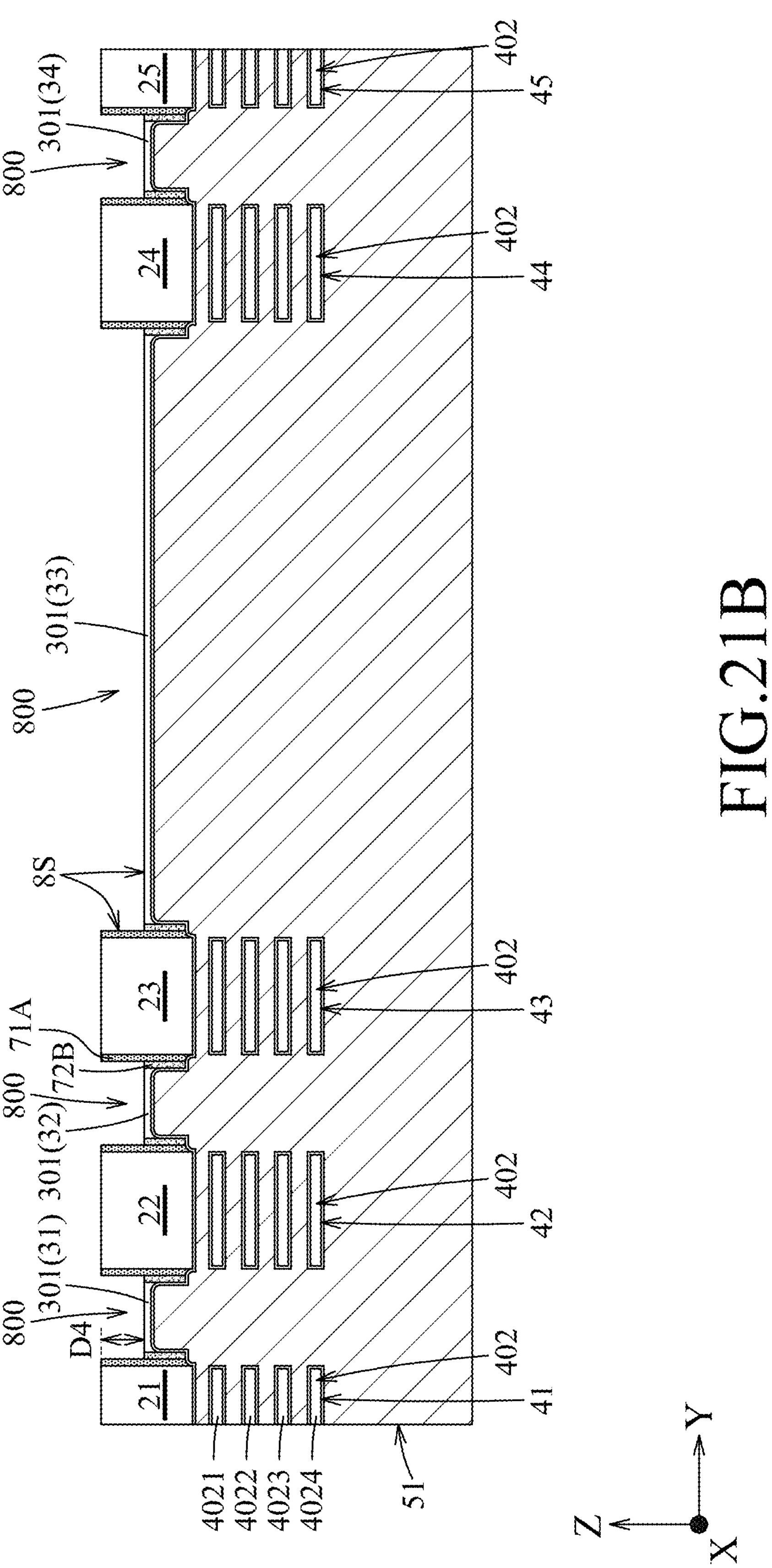

Referring to FIG. 7 and the examples illustrated in FIGS. 21A and 21B, the method 100 proceeds to step 103, where each of the isolation structures 300A is recessed from the back surface 300B thereof (see FIGS. 20A and 20B) by a selective etching process such that a plurality of recesses 800 (four of which are shown in FIGS. 21A and 21B) are formed, and such that the fin portions 21 to 25 substantially remain intact. FIGS. 21A and 21B are schematic sectional views respectively similar to FIGS. 20A and 20B, but illustrating the structure after step 103.

After step 103, the isolation structures 300A are respectively formed into the isolation portions 31 to 34 as described above with reference to FIGS. 3 to 5. To be detail, the first regions 311B of each of the isolation structures 300A (see FIG. 20B) are formed into the trench isolation regions 301 (see FIGS. 4 and 21B) of a corresponding one of the isolation portions 31 to 34, the second regions 312B of each of the isolation structures 300A (see FIG. 20A) are fully removed, the ILD parts 321A of each of the isolation structures 300A (see FIG. 20A) are respectively formed into the ILD regions 302 of a corresponding one of the isolation portions 31 to 34 (see FIGS. 5 and 21A), and the contact etching stop parts 331A of each of the isolation structures 300A (see FIG. 20A) are respectively formed into the contact etching stop regions 303 of a corresponding one of the isolation portions 31 to 34 (see FIGS. 5 and 21A).

In some embodiments, the second sub-layer 72A in each of the liners 70A (see FIGS. 20A and 20B) are partially etched during step 103. Thus, in FIGS. 21A and 21B, the second sub-layer after step 103 is denoted by the numeral 72B.

In some embodiments, each of the recesses 800 has a depth (D4) ranging from about 5 nm to about 60 nm.

For purposes of simplicity and clarity, in following steps, FIG. 21A is further illustrated, while FIG. 21B is not further illustrated.

Figure 22:
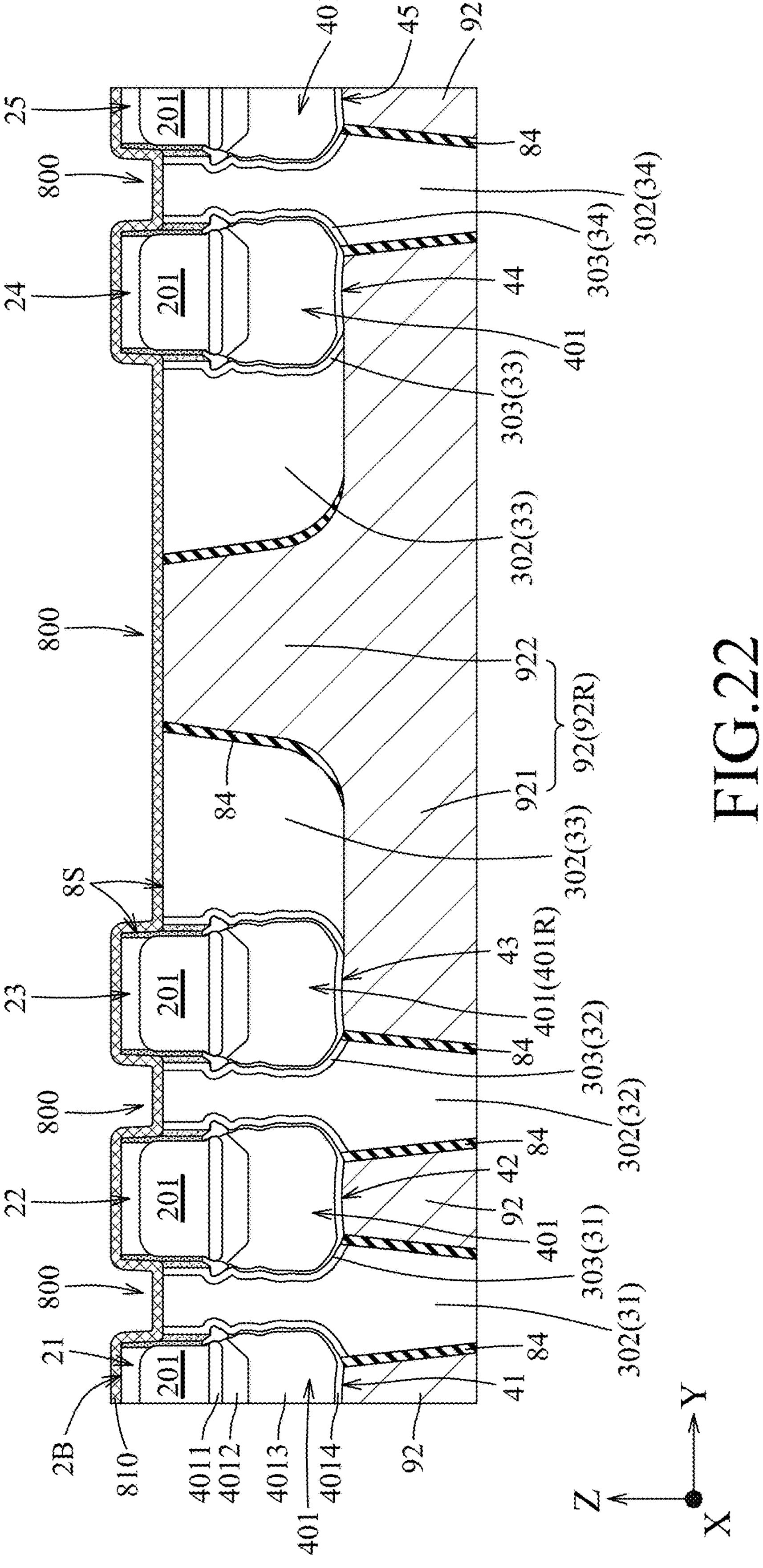

Referring to FIG. 7 and the example illustrated in FIG. 22, the method 100 proceeds to step 104, where a first insulating layer 810 is deposited along the back surface 2B of each of the fin portions 21 to 25 and along an inner surface 8S of each of the recesses 800 by CVD, ALD, or other suitable deposition techniques. FIG. 22 is a schematic sectional view similar to FIG. 21A, but illustrating the structure after step 104.

The first insulating layer 810 will be patterned into the sidewall regions 602 of each of the hard mask portions 61 to 64 (see FIG. 5), and thus is made of the first insulating material. Since the first insulating material has been described above with reference to FIG. 5, the details thereof are not repeated herein for the sake of brevity. In some embodiments, the first insulating layer 810 has a thickness ranging from about 2 nm to about 10 nm.

Figure 23:
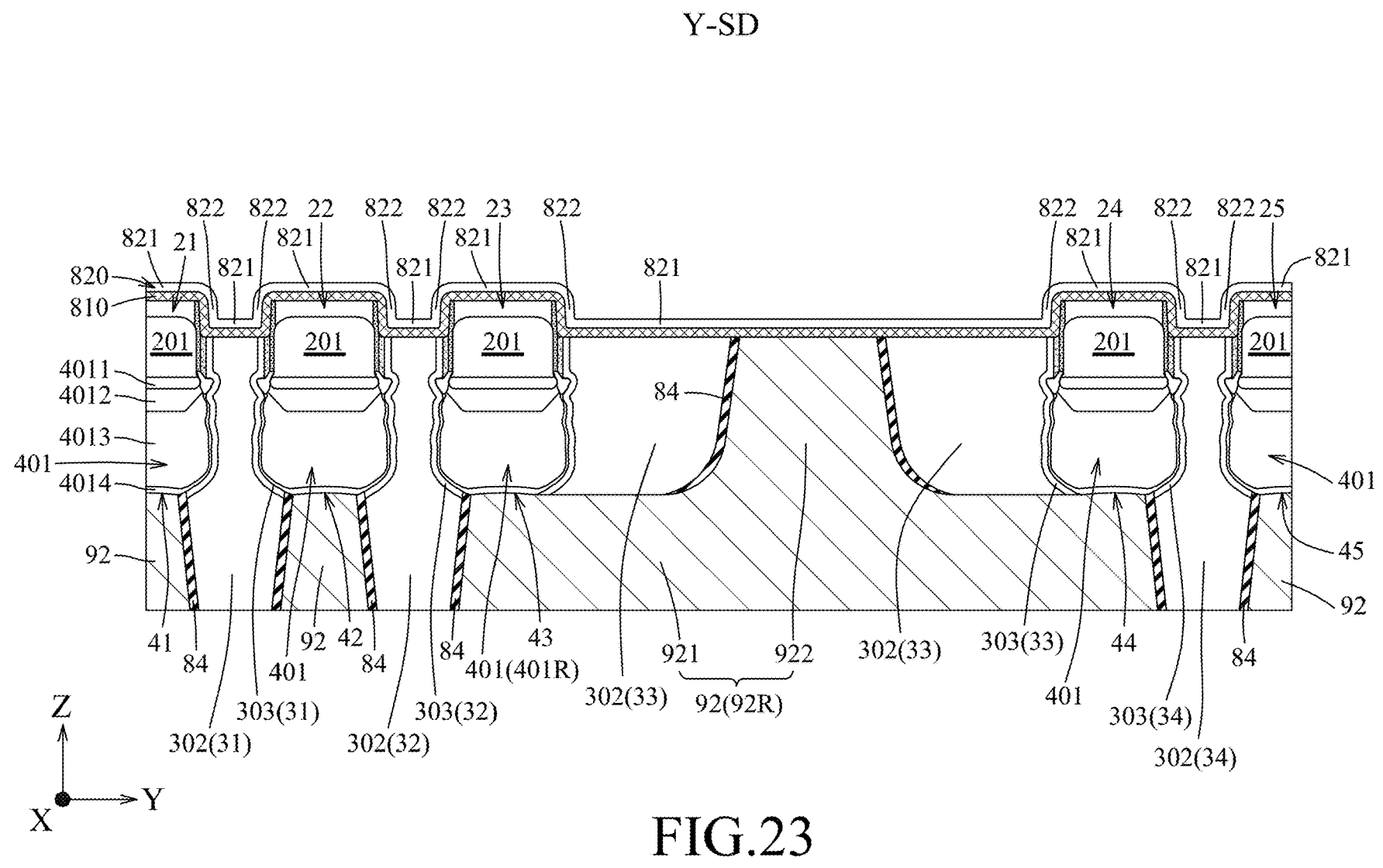

Referring to FIG. 7 and the example illustrated in FIG. 23, the method 100 proceeds to step 105, where a second insulating layer 820 is deposited on the first insulating layer 810 by CVD, ALD, or other suitable deposition techniques. FIG. 23 is a schematic sectional view similar to FIG. 22, but illustrating the structure after step 105.

The second insulating layer 820 will be patterned into a portion of the main region 601 of each of the hard mask portions 61 to 64 (see FIG. 5), and thus is made of the second insulating material. Since the second insulating material has been described above with reference to FIG. 5, the details thereof are not repeated herein for the sake of brevity. In some embodiments, the second insulating layer 820 has a thickness ranging from about 2 nm to about 10 nm.

The second insulating layer 820 includes a plurality of horizontal portions 821 (nine of which are shown in FIG. 23) and a plurality of vertical portions 822 (eight of which are shown in FIG. 23). Each of the vertical portions 822 interconnects two adjacent ones of the horizontal portions 821.

Figure 24:
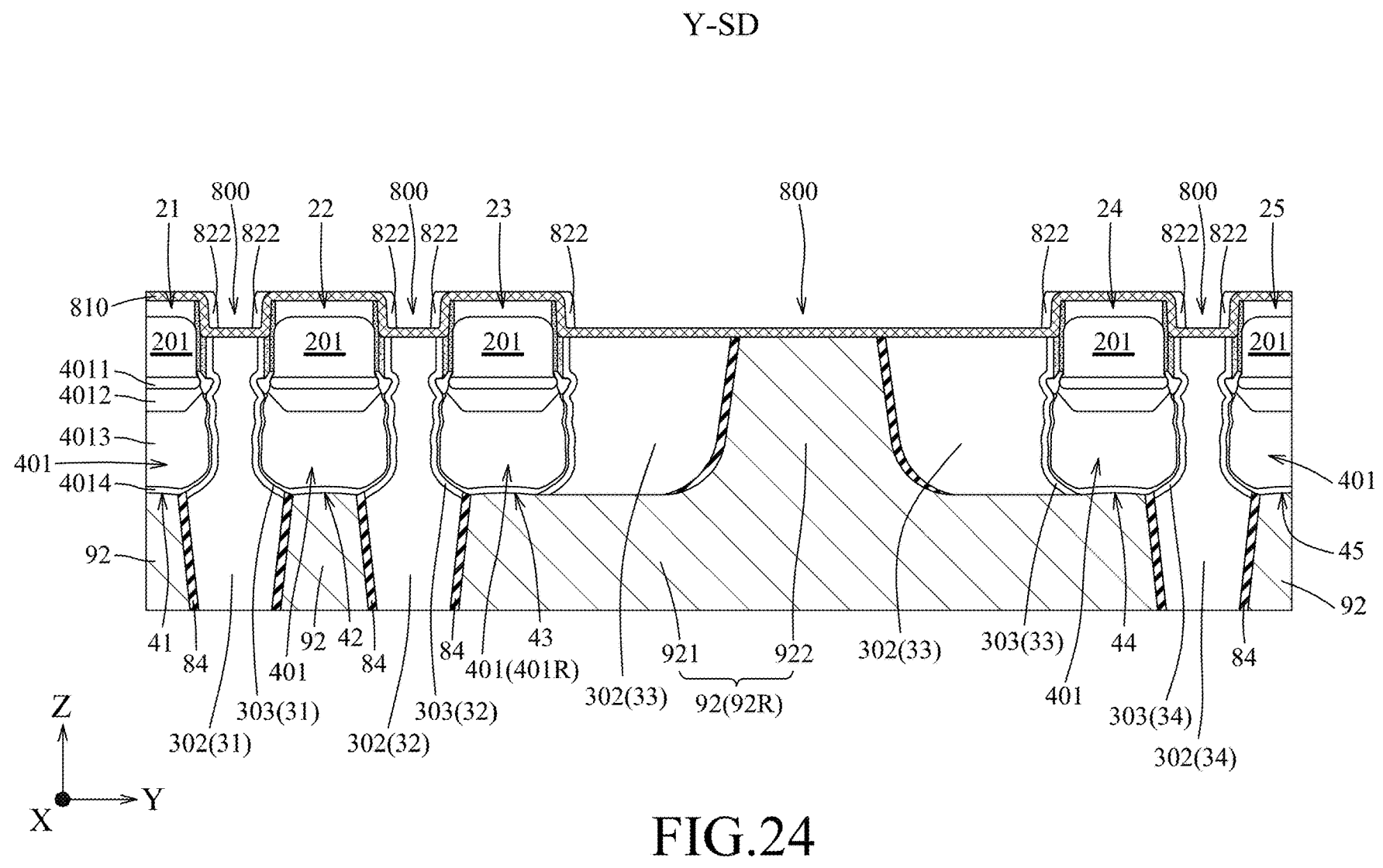

Referring to FIG. 7 and the example illustrated in FIG. 24, the method 100 proceeds to step 106, where the horizontal portions 821 (see FIG. 23) are removed by an anisotropic etching process (for example, but not limited to, dry etching and/or ion bombardment), and four pairs of the vertical portions 822 of the second insulating layer 820 are left in the recesses 800, respectively. Each pair of the vertical portions 822 are spaced apart from each other in the Y direction. FIG.

24 is a schematic sectional view similar to FIG. 23, but illustrating the structure after step 106.

Figure 25:
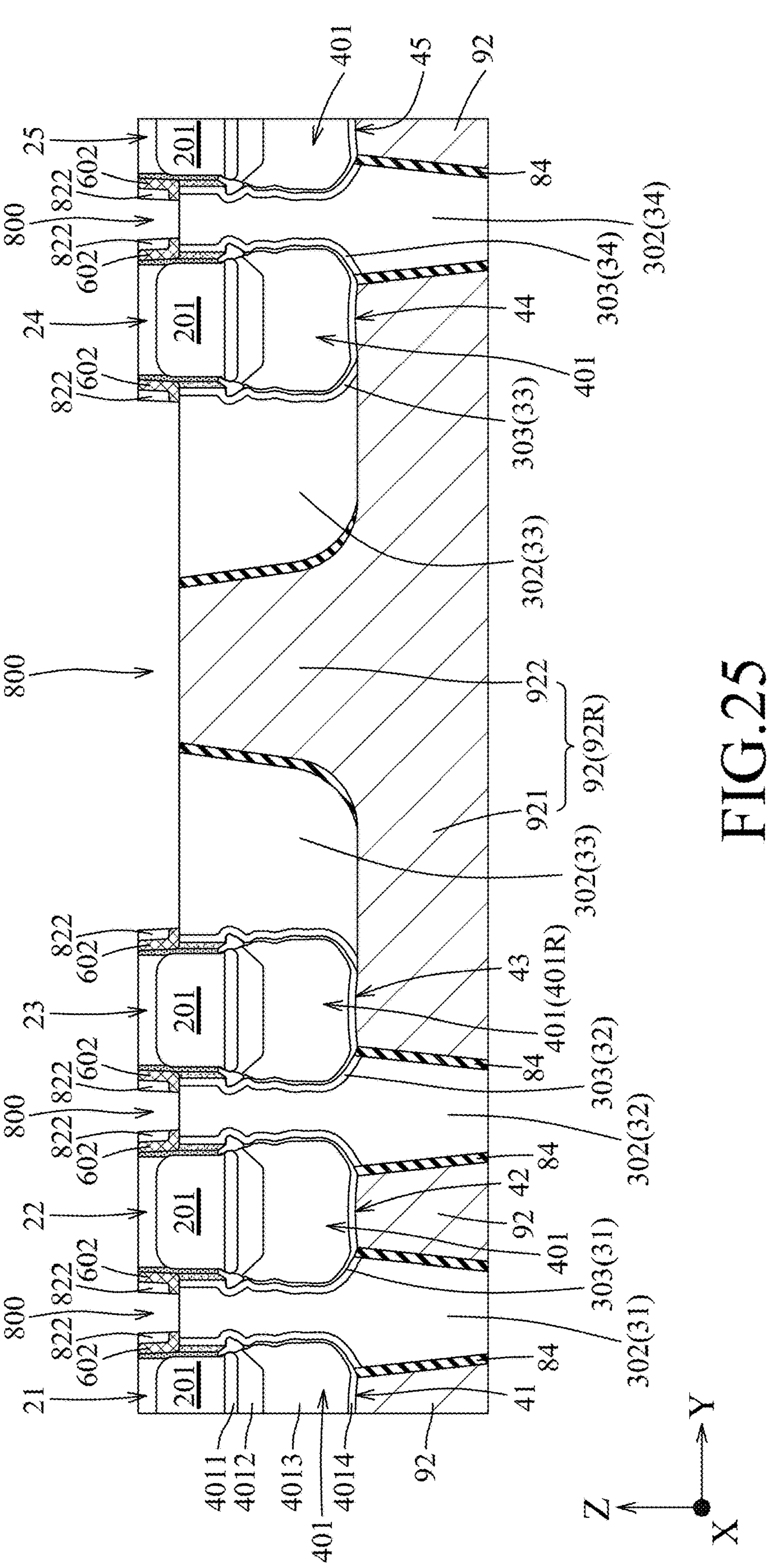

Referring to FIG. 7 and the example illustrated in FIG. 25, the method 100 proceeds to step 107, where the first insulating layer 810 (see FIG. 24) is patterned into the two sidewall regions 602 of each of the hard mask portions 61 to 64 (see FIG. 5). FIG. 25 is a schematic sectional view similar to FIG. 24, but illustrating the structure after step 107.

To be specific, portions of the first insulating layer 810 that are exposed from the four pairs of the vertical portions 822 are removed by a high-selectivity etching process (for example, but not limited to, a wet etching).

Figure 26:
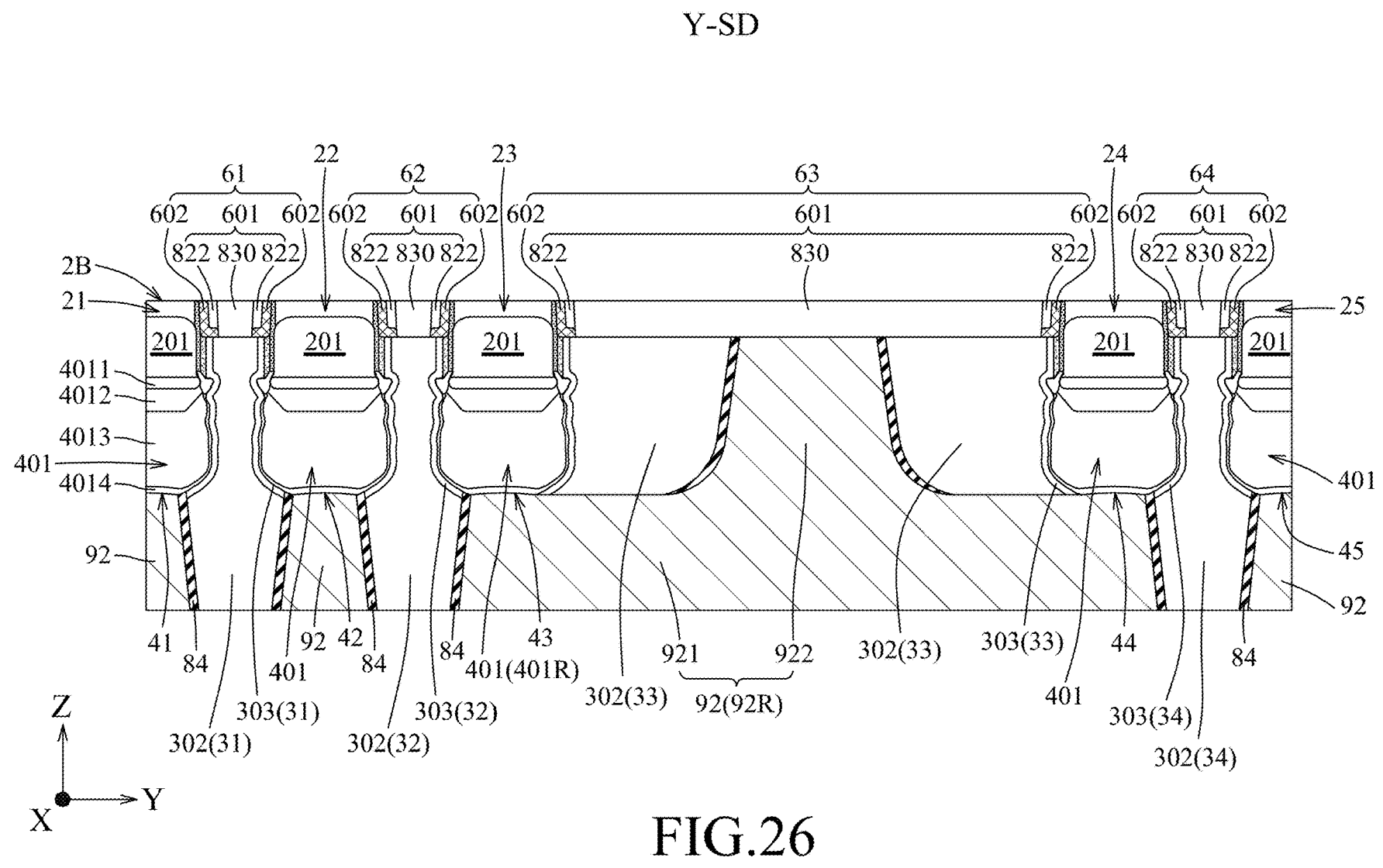

Referring to FIG. 7 and the example illustrated in FIG. 26, the method 100 proceeds to step 108, where a plurality of third insulating layers 830 are formed by filling the second dielectric material in the recesses 800 (see FIG. 25) using CVD, ALD, or other suitable deposition techniques, followed by a planarization process to expose the back surface 2B of each of the fin portions 21 to 25. FIG. 26 is a schematic sectional view similar to FIG. 25, but illustrating the structure after step 108.

After step 108, the main region 601 of each of the hard mask portions 61 to 64 is obtained. Each of the main regions 601 includes one pair of the vertical portions 822 and a corresponding one of the third insulating layers 830.

Figure 27:
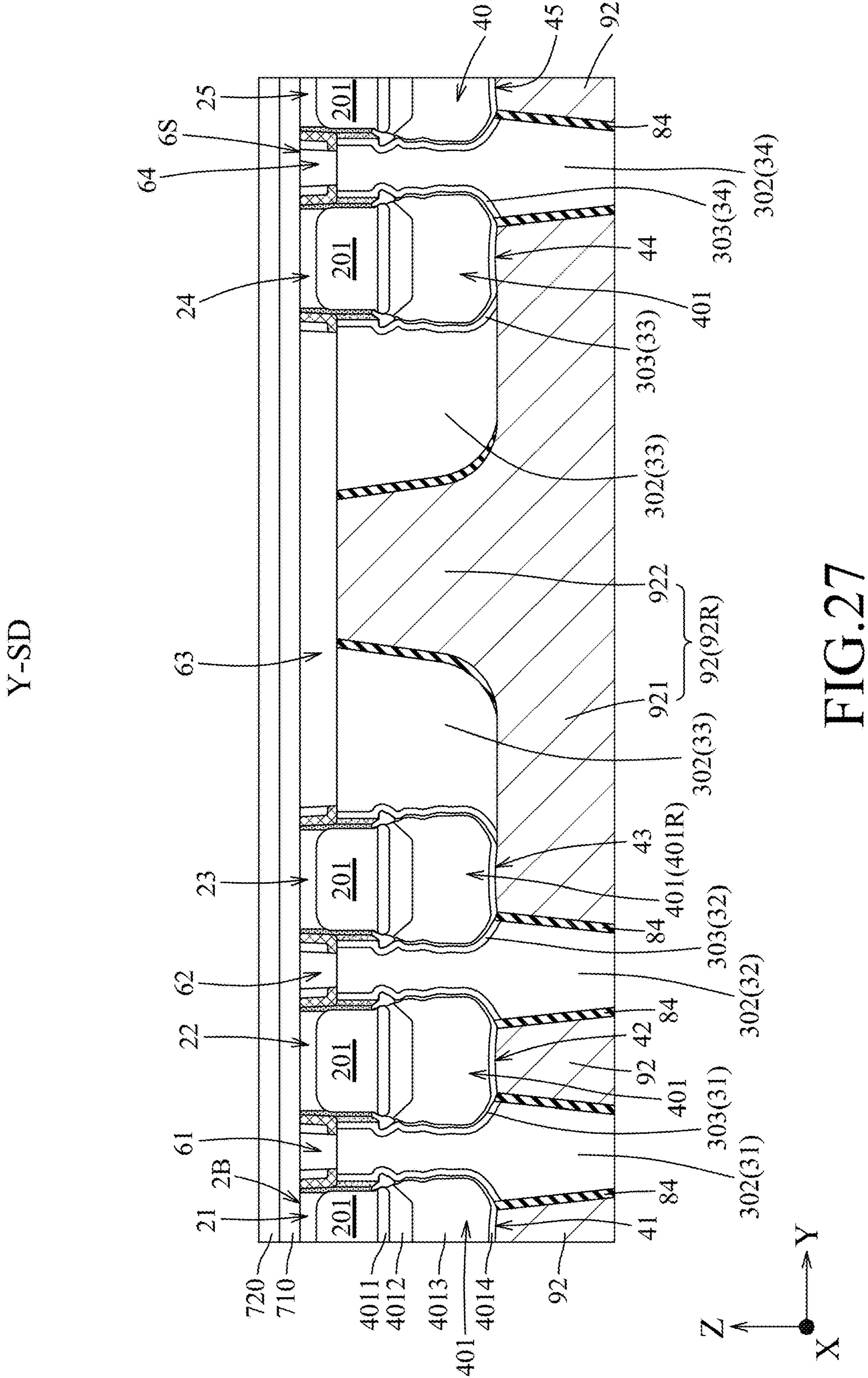

Referring to FIG. 7 and the example illustrated in FIG. 27, the method 100 proceeds to step 109, where the dielectric sub-layers 710, 720 (see also FIG. 5) are sequentially formed to cover the back surface 2B of each of the fin portions 21 to 25 and the surface 6S of each of the hard mask portions 61 to 64 by CVD, ALD, or other suitable deposition techniques. FIG. 27 is a schematic sectional view similar to FIG. 26, but illustrating the structure after step 109. In some embodiments, the dielectric sub-layer 710 is made of silicon oxide, and the dielectric sub-layer 720 is made of silicon nitride, but is not limited thereto.

Figure 28:
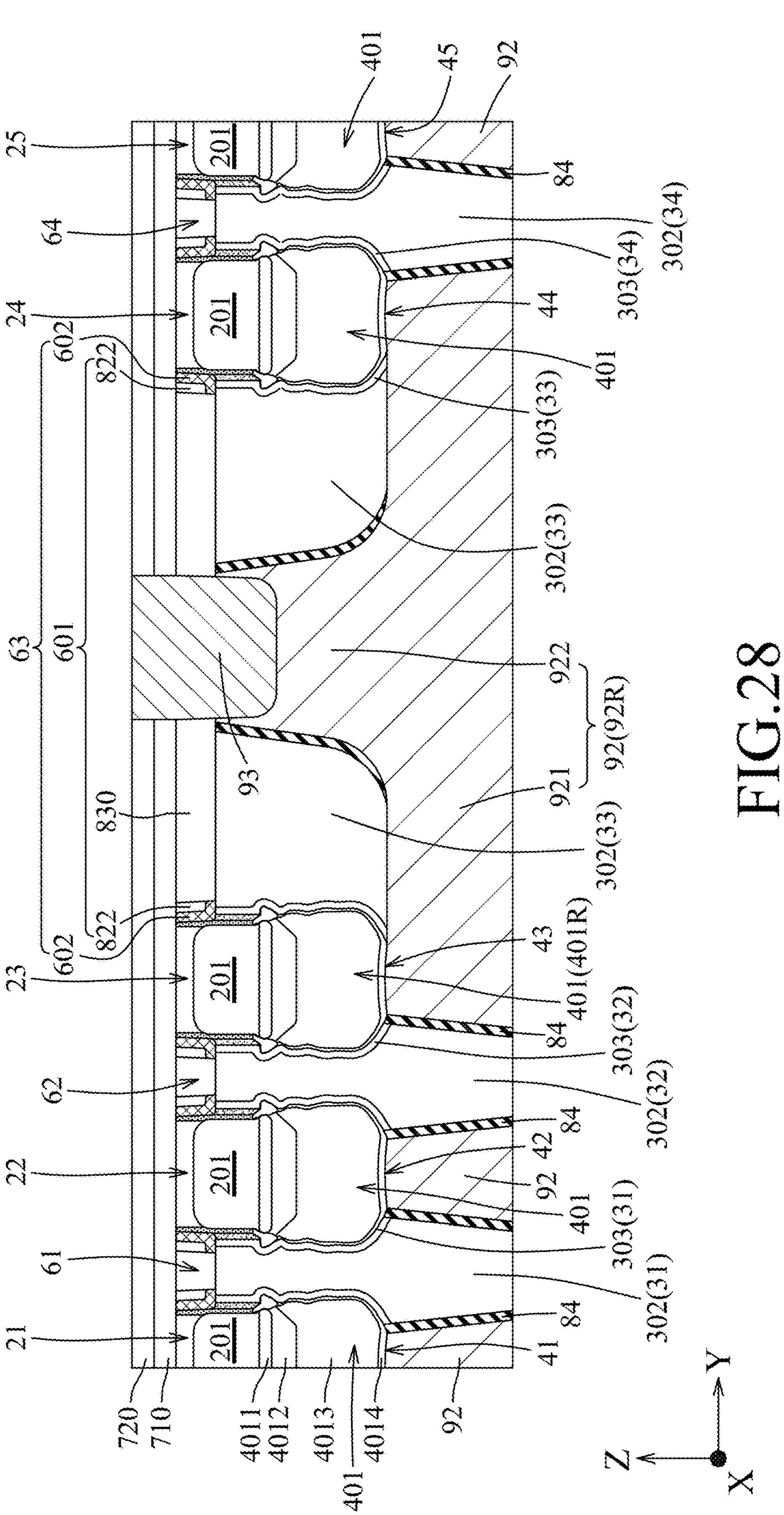

Referring to FIG. 7 and the example illustrated in FIG. 28, the method 100 proceeds to step 110, where the backside contact portion 93 is formed to extend through the first and second dielectric sub-layers 710, 720 and the main region 601 of the hard mask portion 63 such that the backside contact portion 93 is brought into connection with the vertical part 922 of the front-side contact portion 92R. FIG. 28 is a schematic sectional view similar to FIG. 27, but illustrating the structure after step 110.

In some embodiments, formation of the backside contact portion 93 may include (i) performing a patterning process to form a hole (not shown), (ii) depositing the conductive material(s) of the backside contact portion 93 to fill the hole by a suitable deposition process (e.g., PVD, CVD, or ALD), and (iii) performing a planarization process to expose the dielectric sub-layer 720.

Figure 29:
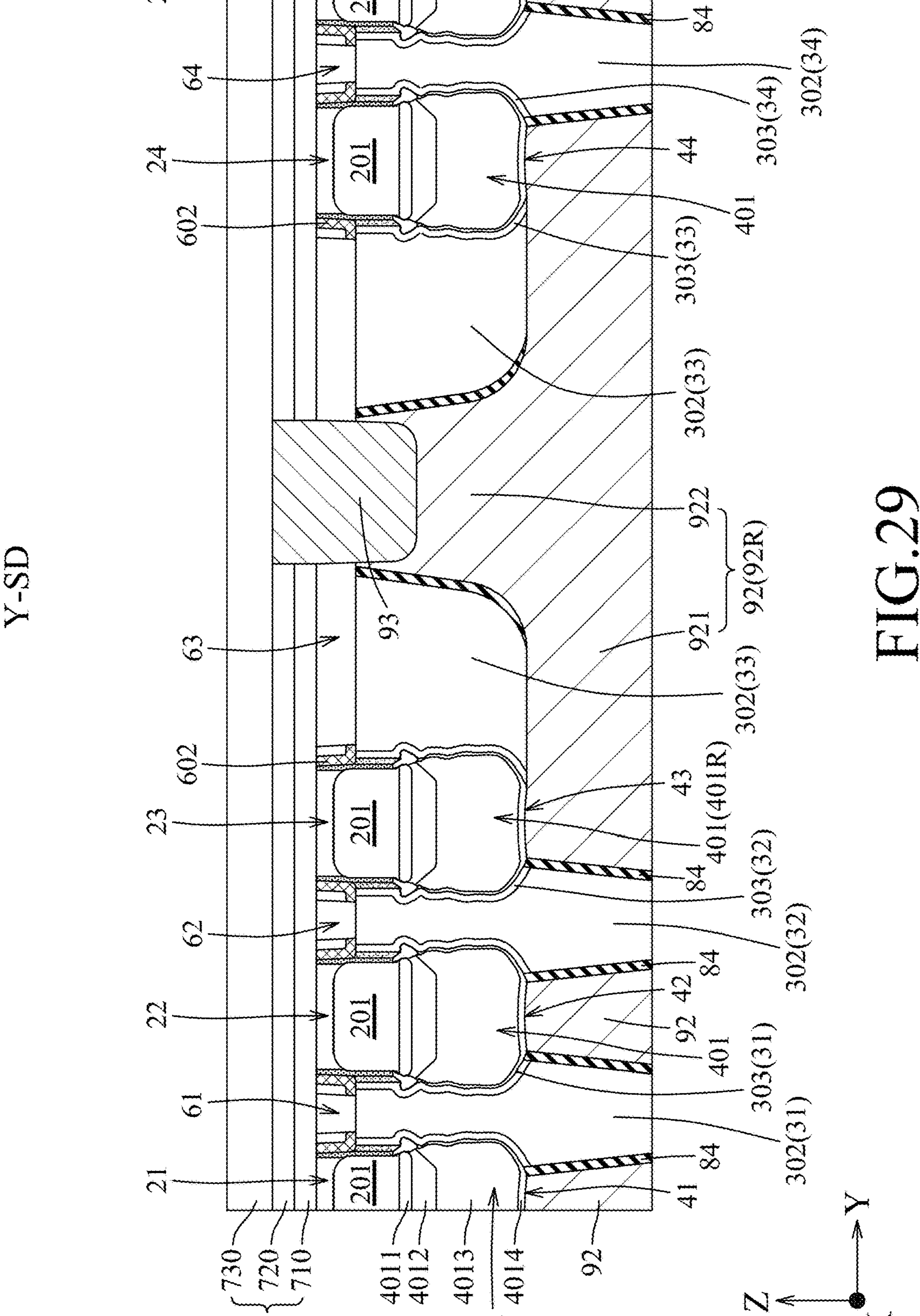

Referring to FIG. 7 and the example illustrated in FIG. 29, the method 100 proceeds to step 111, where the dielectric sub-layer 730 (see also FIG. 5) is formed to cover the dielectric sub-layer 720 and the backside contact portion 93 by CVD, ALD, or other suitable deposition techniques. FIG. 29 is a schematic sectional view similar to FIG. 28, but illustrating the structure after step 111. In some embodiments, the dielectric sub-layer 730 is made of silicon oxide, but is not limited thereto. After step 111, the dielectric layer 700 is formed, and has a back surface 700S spaced apart from the back surfaces 2B of each of fin portions 21 to 25.

Figure 30:
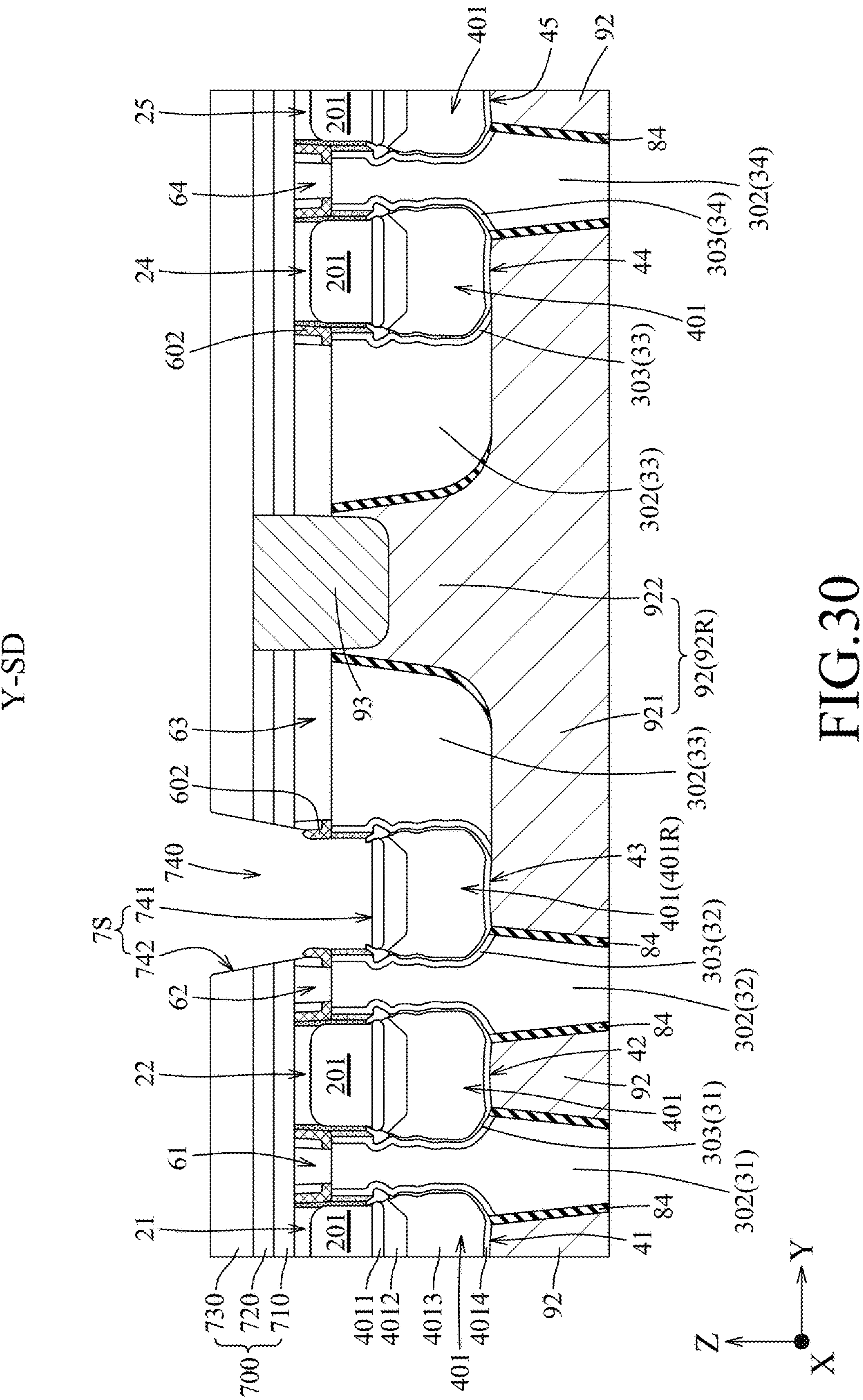

Referring to FIG. 7 and the example illustrated in FIG. 30, the method 100 proceeds to step 112, where a patterning process is performed such that a hole 740 is formed to extend through the dielectric layer 700 and the fin portion 23 (see FIG. 29), and such that one of the two source/drain portions 401R of the device 43 is exposed from the hole 740. FIG. 30 is a schematic sectional view similar to FIG. 29, but illustrating the structure after step 112.

In some embodiments, the patterning process includes lithography and etching processes. In some embodiments, an inner surface 7S of the hole 740 has a hole-bottom portion 741 and a lateral portion 742 which interconnects the back surface 700S of the dielectric layer 700 and the hole-bottom portion 741.

Figure 31:
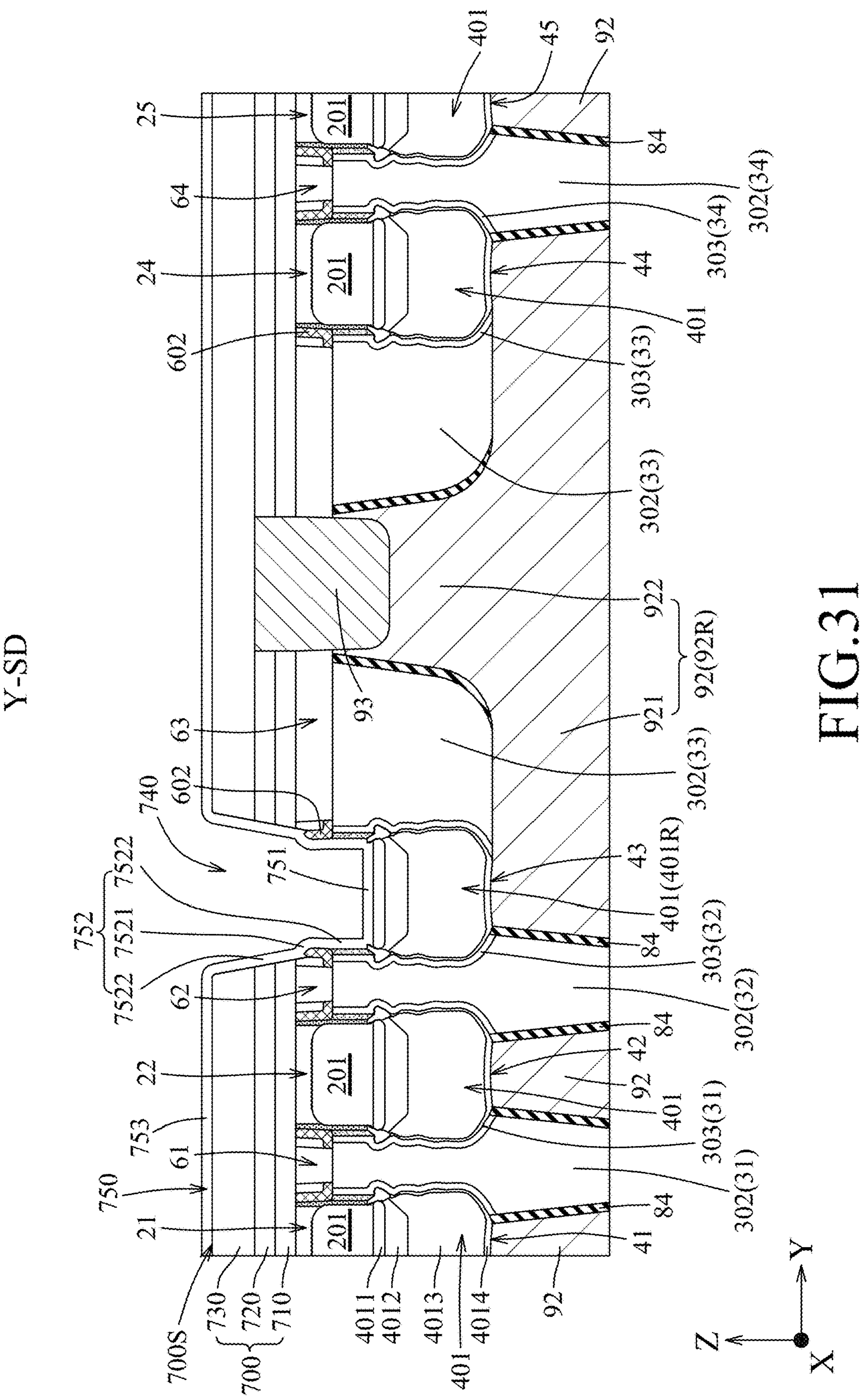

Referring to FIG. 7 and the example illustrated in FIG. 31, the method 100 proceeds to step 113, where a silicon nitride layer 750 is formed along the inner surface 7S of the hole 740 (see FIG. 30) and formed over the dielectric layer 700 by CVD, ALD, or other suitable deposition techniques. FIG. 31 is a schematic sectional view similar to FIG. 30, but illustrating the structure after step 113.

In some embodiments, the silicon nitride layer 750 has a thickness ranging from about 1 nm to about 10 nm. In some embodiments, the silicon nitride layer 750 has a first portion 751 formed on the hole-bottom portion 741, a second portion 752 formed on the lateral portion 752, and a third portion 753 formed on the back surface 700S of the dielectric layer 700. In some embodiments, the second portion 752 of the silicon nitride layer 750 has two vertical parts 7522 and a horizontal part 7521 between the two vertical parts 7522.

Figure 32:
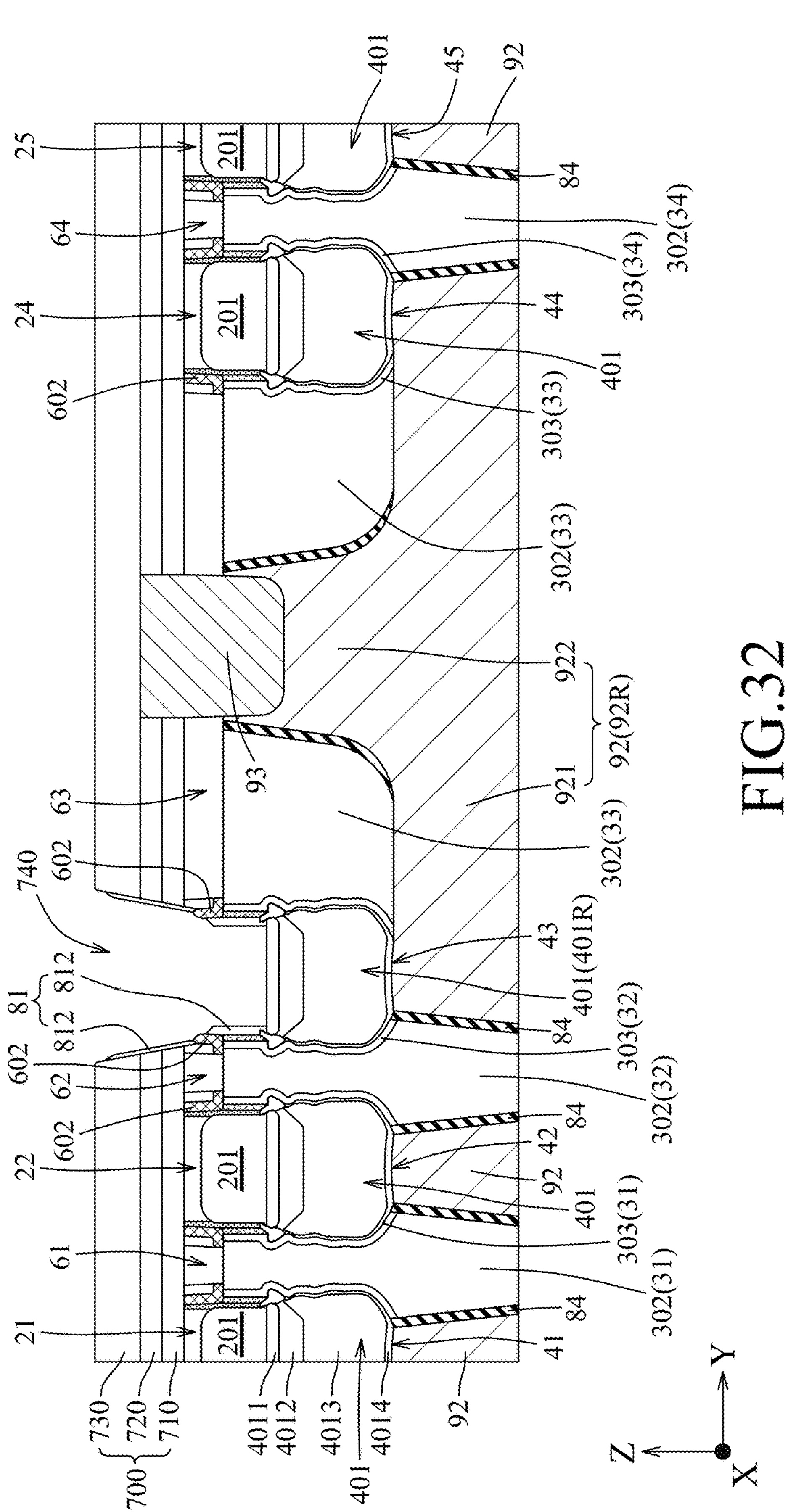

Referring to FIG. 7 and the example illustrated in FIG. 32, the method 100 proceeds to step 114, where the first and third portions 751, 753 of the silicon nitride layer 750 (see FIG. 31) are removed by an anisotropic etching process (for example, but not limited to, dry etching and/or ion bombardment), so as to expose the one of the two source/drain portions 401R of the second device 43. FIG. 32 is a schematic sectional view similar to FIG. 31, but illustrating the structure after step 114.

In some embodiments, during removing the first and third portions 751, 753 of the silicon nitride layer 750, the horizontal part 7521 of the second portion 752 of the silicon nitride layer 750 is removed, so that one of the two sidewall regions 602 of each of the hard mask portions 62, 63 is exposed from the two vertical parts 7522 of the second portion 752 of the silicon nitride layer 750 through the hole 740. After step 113, the two vertical parts 7522 of the second portion 752 of the silicon nitride layer 750 (see FIG. 31) serve as the two vertical parts 812 of the SNR layer 81 (see FIG. 32 and description with reference to FIG. 5).

Referring to FIG. 7 and the example illustrated in FIG. 5, the method 100 proceeds to step 115, where the backside via 91 is formed in the hole 740 (see FIG. 32) such that the backside via 91 is formed in connection with the one of the two source/drain portions 401R of the second device 43. The semiconductor structure 10 is thus obtained. FIG. 5 is a schematic sectional view similar to FIG. 32, but illustrating the structure after step 115.

In some embodiments, formation of the backside via 91 may include (i) depositing the conductive material(s) of the backside via 91 to fill the hole 740 (see FIG. 32) by a suitable deposition process (e.g., PVD, CVD, or ALD), and (ii) performing a planarization process to expose the dielectric sub-layer 730 of the dielectric layer 700.

In some embodiments, some steps in the method 100 may be modified, replaced, or eliminated without departure from the spirit and scope of the present disclosure.

In summary, with the provision of the hard mask portions, although the backside via may be formed to have a greater dimension or formed to partially overlap with an adjacent gate electrode in the Z direction due to process variations, the backside via still can be well separated from the adjacent gate electrode by the hard mask portions. That is, the process window of formation of the semiconductor structure is enlarged. The dimension of the backside via may be greater, and the height of the backside via may be reduced. Thus, the backside via may have a reduced electrical resistance, and the circuit performance of the semiconductor structure may be improved accordingly. Besides, although the two sidewall regions are formed in each of the hard mask portions, the backside contact portion may penetrate the main portion of one of the hard mask portions without being blocked by the two sidewall regions which are spaced apart from each other. Therefore, formation of the backside contact portion can be easily incorporated into the process flow for forming the semiconductor structure that includes the hard mask portions.

In accordance with some embodiments of the present disclosure, a semiconductor structure includes: a first fin portion and a second fin portion, each of which has a front surface and a back surface opposite to the front surface, and each of which is elongated in an X direction, the first fin portion and the second fin portion being spaced apart from each other in a Y direction transverse to the X direction; a first device and a second device which are respectively disposed on the front surfaces of the first fin portion and the second fin portion, and which are spaced apart from each other, each of the first device and the second device including a source/drain portion; an isolation portion disposed to separate the first fin portion and the second fin portion from each other and to separate the first device and the second device from each other, the isolation portion having a front surface and a back surface opposite to the front surface; and a hard mask portion disposed beneath the back surface of the isolation portion, the hard mask portion including a main region and two sidewall regions that are respectively located at two opposite sides of the main region in the Y direction so as to separate the main region from the first fin portion and the second fin portion, the two sidewall regions being made of a material different from a material of the isolation portion, the main region being made of a material different from the material of the two sidewall regions.

In accordance with some embodiments of the present disclosure, the hard mask portion has a surface which is opposite to the isolation portion, and which is flush with the back surface of each of the first fin portion and the second fin portion.

In accordance with some embodiments of the present disclosure, each of the two sidewall regions has a vertical part and a horizontal part which is connected to an end of the vertical part. The horizontal part of one of the two sidewall regions extends toward the horizontal part of another one of the two sidewall regions.

In accordance with some embodiments of the present disclosure, the horizontal part of each of the two sidewall regions is in contact with the back surface of the isolation portion.

In accordance with some embodiments of the present disclosure, the semiconductor structure further includes: a dielectric layer disposed to cover the first fin portion, the second fin portion and the hard mask portion; and a backside via extending through the dielectric layer and the second fin portion such that the backside via is brought into connection with the source/drain portion of the second device.

In accordance with some embodiments of the present disclosure, the semiconductor structure further includes a silicon nitride re-deposition layer disposed to separate the backside via from the second fin portion and the isolation portion.

In accordance with some embodiments of the present disclosure, the material of the two sidewall regions is different from a material of the silicon nitride layer.

In accordance with some embodiments of the present disclosure, the backside via has a wider portion and a narrower portion. The narrower portion is disposed between the wider portion and the source/drain portion of the second device. The wider portion has a dimension in the Y direction greater than a dimension of the second fin portion in the Y direction. The backside via further has a transition portion between the wider portion and the narrower portion. The silicon nitride layer is discontinuous so as to permit the transition portion to be in direct contact with the hard mask portion.

In accordance with some embodiments of the present disclosure, a semiconductor structure includes: a first fin portion and a second fin portion, each of which is elongated in an X direction, the first fin portion and the second fin portion being spaced apart from each other in a Y direction transverse to the X direction; a first device and a second device which are respectively disposed on the first fin portion and the second fin portion, and which are spaced apart from each other, each of the first device and the second device including two source/drain portions spaced apart from each other in the X direction, and a channel portion extending between the two source/drain portions; an isolation portion disposed to separate the first fin portion and the second fin portion from each other and to separate the first device and the second device from each other; a gate portion elongated in the Y direction and extending in the isolation portion in the Y direction, the gate portion being disposed over the channel portions of the first device and the second device; a hard mask portion disposed on the isolation portion in a way that the hard mask portion is spaced apart from the gate portion through the isolation portion, the hard mask portion including a main region and two sidewall regions that are respectively located at two opposite sides of the main region in the Y direction so as to separate the main region from the first fin portion and the second fin portion, the two sidewall regions being made of a material different from a material of the isolation portion, the main region being made of a material different from the material of the two sidewall regions; and a backside via extending through the second fin portion such that the backside via is brought into connection with one of the two source/drain portions of the second device.

In accordance with some embodiments of the present disclosure, the hard mask portion has a surface which is opposite to the isolation portion and which is flush with a back surface of each of the first fin portion and the second fin portion.

In accordance with some embodiments of the present disclosure, each of the two sidewall regions has an L-shaped cross-section.

In accordance with some embodiments of the present disclosure, the channel portion is spaced apart from a corresponding one of the first fin portion and the second fin portion in a Z direction transverse to the X direction and the Y direction. The gate portion is disposed to surround the channel portion of each of the first device and the second device. Each of the first device and the second device further includes two inner spacers which are spaced apart from each other in the X direction, and which are disposed between the channel portion and a corresponding one of the first fin portion and the second fin portion, such that the gate portion is separated from the two source/drain portions respectively through the two inner spacers.

In accordance with some embodiments of the present disclosure, the backside via has a wider portion and a narrower portion. The narrower portion is disposed between the wider portion and the one of the two source/drain portions of the second device. The wider portion has a dimension in the Y direction greater than a dimension of the second fin portion in the Y direction. The narrower portion has a dimension in the Y direction that is not greater than the dimension of the second fin portion in the Y direction.

In accordance with some embodiments of the present disclosure, the narrower portion has a dimension in the X direction greater than a dimension of the one of the two source/drain portions of the second device in the X direction such that the narrower portion is partially landed on one of the inner spacers of the second device.

In accordance with some embodiments of the present disclosure, the gate portion has a first gate part extending in the isolation portion, and two second gate parts respectively disposed over the channel portions of the first device and the second device. The first gate part has a middle region and two end regions at two opposite sides of the middle region in the Y direction. A dimension of the middle region in the X direction being smaller than a dimension of each of the two end regions in the X direction. Each of the two second gate parts has a maximum dimension in the X direction that is greater than the dimension of the middle region in the X direction such that each of the two second gate parts partially overlaps the two inner spacers of a corresponding one of the first device and the second device in the Z direction.

In accordance with some embodiments of the present disclosure, a method for forming a semiconductor structure includes: forming a patterned structure which includes a first fin portion and a second fin portion each of which has a front surface and a back surface opposite to the front surface, the first fin portion and the second fin portion being spaced apart from each other in a Y direction, a first device and a second device which are respectively disposed on the front surfaces of the first fin portion and the second fin portion, each of the first device and the second device including a source/drain portion, and an isolation structure disposed to separate the first fin portion and the second fin portion from each other and to separate the first device and the second device from each other; recessing the isolation structure from a back surface of the isolation structure to form a recess such that the isolation structure is formed into an isolation portion; and forming a hard mask portion in the recess such that the hard mask portion has a surface flush with a back surface of each of the first fin portion and the second fin portion, the hard mask portion including a main region and two sidewall regions that are respectively located at two opposite sides of the main region in the Y direction, so as to separate the main region from the first fin portion and the second fin portion, the two sidewall regions being made of a first insulating material different from a material of the isolation portion, the main region being made of a second insulating material different from the first insulating material of the two sidewall regions.

In accordance with some embodiments of the present disclosure, formation of the hard mask portion includes: depositing a first insulating layer along the back surface of each of the first fin portion and the second fin portion and along an inner surface of the recess, the first insulating layer including the first insulating material; depositing a second insulating layer on the first insulating layer, the second insulating layer including the second insulating material, removing horizontal portions of the second insulating layer such that two vertical portions of the second insulating layer are left in the recess and are spaced apart from each other in the Y direction; removing portions of the first insulating layer which are exposed from the two vertical portions such that the first insulating layer is formed into the two sidewall regions; and forming a third insulating layer to fill the recess, the third insulating layer including the second insulating material, such that the two vertical portions and the third insulating layer together serve as the main region.

In accordance with some embodiments of the present disclosure, the method further includes: forming a dielectric layer to cover the back surfaces of the first fin portion and the second fin portion; and forming a backside via which extends through the dielectric layer and the second fin portion and which is connected to one of the two source/drain portions of the second device.

In accordance with some embodiments of the present disclosure, the method further includes: forming a dielectric layer to cover the back surfaces of the first fin portion and the second fin portion, the dielectric layer having a back surface spaced apart from the back surfaces of the first fin portion and the second fin portion; forming a hole which penetrates the dielectric layer and the second fin portion such that one of the two source/drain portions of the second device is exposed from the hole, an inner surface of the hole having a hole-bottom portion and a lateral portion which interconnects the back surface of the dielectric layer and the hole-bottom portion; depositing a silicon nitride layer along the inner surface of the hole, the silicon nitride layer having a first portion on the hole-bottom portion and a second portion on the lateral portion; removing the first portion of the silicon nitride layer so as to expose the one of the two source/drain portions of the second device; and forming a backside via in the hole, such that the backside via is formed to connect with the one of the two source/drain portions of the second device.

In accordance with some embodiments of the present disclosure, the second portion of the silicon nitride layer has two vertical parts and a horizontal part between the two vertical parts. During the removal of the first portion of the silicon nitride layer, the horizontal part of the second portion of the silicon nitride layer is removed so as to permit one of the two sidewall regions to be exposed from the two vertical parts of the second portion of the silicon nitride layer through the hole. After forming the backside via, the two vertical parts of the silicon nitride layer and the one of the two sidewall regions cooperatively separate the backside via from the isolation portion.

In accordance with some embodiments of the present disclosure, a semiconductor structure includes: a first fin portion and a second fin portion each of which is elongated in an X direction, the first fin portion and the second fin portion being spaced apart from each other in a Y direction transverse to the X direction; a first device and a second device which are respectively disposed on the first fin portion and the second fin portion, and which are spaced apart from each other, each of the first device and the second device including two source/drain portions spaced apart from each other in the X direction, and a channel portion extending between the two source/drain portions; an isolation portion disposed to separate the first fin portion and the second fin portion from each other and to separate the first device and the second device from each other; a gate portion elongated in the Y direction, and extending in the isolation portion in the Y direction, the gate portion being disposed over the channel portions of the first device and the second device; a hard mask portion formed in the isolation portion in a way that the hard mask portion is spaced apart from the gate portion through the isolation portion, the hard mask portion including a main region and two sidewall regions that are respectively located at two opposite sides of the main region in the Y direction so as to separate the main region from the first fin portion and the second fin portion, the two sidewall regions being made of a material different from a material of the isolation portion, the main region being made of a material different from the material of the two sidewall regions; and a front-side contact portion disposed on one of the two source/drain portions of the first device opposite to the first fin portion.

In accordance with some embodiments of the present disclosure, the two sidewall regions each includes an electrically insulating metal oxide.

In accordance with some embodiments of the present disclosure, the isolation portion includes a trench isolation region and two inter-layer dielectric regions. The gate portion is disposed over the trench isolation region. The two inter-layer dielectric region are respectively disposed at two opposite sides of the gate portion in the X direction.

In accordance with some embodiments of the present disclosure, the semiconductor structure further includes a backside contact portion extending through the main region such that the backside contact portion is brought into connection with the front-side contact portion.

In accordance with some embodiments of the present disclosure, the semiconductor structure further includes a backside via extending through the first fin portion such that the backside via is brought into connection with one of the two source/drain portions of the first device.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a patterned structure which includes a first fin portion and a second fin portion each of which has a front surface and a back surface opposite to the front surface along a first direction, the first fin portion and the second fin portion being spaced apart from each other in a second direction different from the first direction;

a first device and a second device which are respectively disposed on the front surface of the first fin portion and the front surface of the second fin portion, each of the first device and the second device including a source/drain portion, and an isolation structure disposed to separate the first fin portion and the second fin portion from each other and to separate the first device and the second device from each other;

recessing the isolation structure from a back surface of the isolation structure to form a recess such that the isolation structure is formed into an isolation portion; and forming a hard mask portion in the recess, the hard mask portion including a main region and two sidewall regions that are respectively located at two opposite sides of the main region in the second direction, so as to separate the main region from the first fin portion and the second fin portion, the two sidewall regions being made of a first insulating material different from a material of the isolation portion, the main region being made of a second insulating material different from the first insulating material of the two sidewall regions.

2. The method as claimed in claim 1, wherein formation of the hard mask portion includes:

depositing a first insulating layer along the back surface of each of the first fin portion and the second fin portion and along an inner surface of the recess, the first insulating layer including the first insulating material;

depositing a second insulating layer on the first insulating layer, the second insulating layer including the second insulating material;

removing horizontal portions of the second insulating layer such that two vertical portions of the second insulating layer are left in the recess and are spaced apart from each other in the second direction;

removing portions of the first insulating layer which are exposed from the two vertical portions of the second insulating layer such that the first insulating layer is formed into the two sidewall regions of the hard mask portion; and forming a third insulating layer to fill the recess, the third insulating layer including the second insulating material, such that the two vertical portions of the second insulating layer and the third insulating layer together serve as the main region of the hard mask portion.

3. The method as claimed in claim 1, further comprising:

forming a dielectric layer to cover the back surface of each of the first fin portion and the second fin portion; and forming a backside via which extends through the dielectric layer and the second fin portion and which is connected to the source/drain portion of the second device.

4. The method as claimed in claim 1, further comprising:

forming a dielectric layer to cover the back surface of each of the first fin portion and the second fin portion, the dielectric layer having a back surface spaced apart from the back surface of each of the first fin portion and the second fin portion;

forming a hole which penetrates the dielectric layer and the second fin portion so as to expose the source/drain portion of the second device, an inner surface of the hole having a hole-bottom portion which is defined by the source/drain portion of the second device and a lateral portion which interconnects the back surface of the dielectric layer and the hole-bottom portion;

depositing a silicon nitride layer along the inner surface of the hole, the silicon nitride layer having a first portion on the hole-bottom portion and a second portion on the lateral portion;

removing the first portion of the silicon nitride layer so as to expose the source/drain portion of the second device; and forming a backside via in the hole, such that the backside via is connected to the source/drain portion of the second device.

5. The method as claimed in claim 4, wherein:

the second portion of the silicon nitride layer has two vertical parts and a horizontal part between the two vertical parts;

during the removal of the first portion of the silicon nitride layer, the horizontal part of the second portion of the silicon nitride layer is removed so as to permit one of the two sidewall regions of the hard mask portion to be exposed from the two vertical parts of the second portion of the silicon nitride layer; and after forming the backside via, the two vertical parts of the second portion of the silicon nitride layer and the one of the two sidewall regions of the hard mask portion cooperatively separate the backside via from the isolation portion.

6. The method as claimed in claim 1, wherein the first insulating material of the two sidewall regions is different from a material of the silicon nitride layer.

7. The method as claimed in claim 1, wherein the first insulating material of the two sidewall regions includes an electrically insulating metal oxide.

8. The method as claimed in claim 1, wherein the hard mask portion has a surface flush with the back surface of one of the first fin portion and the second fin portion.

9. A method for forming a semiconductor structure, comprising:

forming a first fin portion and a second fin portion on a substrate, each of the first fin portion and the second fin portion having a front surface and a back surface opposite to the front surface along a first direction which is normal to a lower surface of the substrate, and being elongated in a second direction different from the first direction, the first fin portion and the second fin portion being spaced apart from each other along a third direction different from the first direction and the second direction;

forming a trench isolation on the substrate between the first fin portion and the second fin portion;

forming a first device and a second device respectively on the front surface of the first fin portion and the front surface of the second fin portion, each of the first device and the second device including a source/drain portion;

forming a first dielectric layer on the trench isolation between the source/drain portion of the first device and the source/drain portion of the second device, the first dielectric layer and the trench isolation together constituting an isolation structure which has a front surface and a back surface opposite to the front surface along the first direction;

removing the substrate so as to expose the back surface of each of the first fin portion, the second fin portion and the isolation structure; and forming a hard mask portion which extends from the back surface of the isolation structure into the isolation structure.

10. The method as claimed in claim 9, wherein the hard mask portion includes a main region and two sidewall regions that are respectively located at two opposite sides of the main region in the third direction so as to separate the main region from the first fin portion and the second fin portion, the two sidewall regions being made of a material different from a material of the isolation structure and a material of the main region.

11. The method as claimed in claim 10, wherein each of the two sidewall regions has a vertical part and a horizontal part which is connected to an end of the vertical part, the horizontal part of one of the two sidewall regions extending toward the horizontal part of another one of the two sidewall regions.

12. The method as claimed in claim 11, wherein the horizontal part of each of the two sidewall regions is in contact with the back surface of the isolation structure.

13. The method as claimed in claim 12, further comprising:

forming a second dielectric layer on the first fin portion, the second fin portion and the hard mask portion opposite to the first dielectric layer; and forming a backside via which extends through the second dielectric layer and the second fin portion such that the backside via is brought into connection with the source/drain portion of the second device.

14. The method as claimed in claim 13, further comprising:

forming a silicon nitride re-deposition layer to separate the backside via from the second fin portion and the isolation structure.

15. The method as claimed in claim 14, wherein the backside via has a wider portion and a narrower portion, the narrower portion being disposed between the wider portion and the source/drain portion of the second device, the wider portion having a dimension in the third direction greater than a dimension of the second fin portion in the third direction, the backside via further having a transition portion between the wider portion and the narrower portion, and the silicon nitride re-deposition layer is discontinuous so as to permit the transition portion to be in direct contact with the hard mask portion.

16. A method for forming a semiconductor structure, comprising:

forming a first fin portion and a second fin portion, the first fin portion and the second fin portion extending lengthwise along a first direction and being spaced apart from each other by a trench isolation in a second direction different from the first direction;

forming a first device and a second device respectively on the first fin portion and the second fin portion, each of the first device and the second device including two source/drain portions which are spaced apart from each other in the first direction, and a channel portion extending between the two source/drain portions;

forming a gate portion over the channel portion of the first device and the channel portion of the second device, the gate portion extending lengthwise along the second direction over the trench isolation;

forming an inter-layer dielectric layer on the trench isolation and the two source/drain portions of each of the first device and the second device, the inter-layer dielectric layer and the trench isolation together constituting an isolation structure;

forming a hard mask portion in the isolation structure such that the hard mask portion is spaced apart from the gate portion through the isolation structure, the hard mask portion including a main region and two sidewall regions that are respectively located at two opposite sides of the main region in the second direction so as to separate the main region from the first fin portion and the second fin portion, the two sidewall regions being made of a material different from a material of the isolation structure and a material of the main region; and forming a backside via which extends through the second fin portion such that the backside via is brought into connection with one of the two source/drain portions of the second device.

17. The method as claimed in claim 16, wherein each of the two sidewall regions has an L-shaped cross-section.

18. The method as claimed in claim 16, wherein the backside via has a wider portion and a narrower portion, the narrower portion being disposed between the wider portion and the one of the two source/drain portions of the second device, the wider portion has a dimension in the second direction greater than a dimension of the second fin portion in the second direction, and the narrower portion has a dimension in the second direction that is not greater than the dimension of the second fin portion in the second direction.

19. The method as claimed in claim 18, wherein the channel portion is spaced apart from a corresponding one of the first fin portion and the second fin portion in a third direction different from the first direction and the second direction, the gate portion is disposed to surround the channel portion of each of the first device and the second device, each of the first device and the second device further includes two inner spacers which are spaced apart from each other in the first direction, and which are disposed between the channel portion and a corresponding one of the first fin portion and the second fin portion, such that the gate portion is separated from the two source/drain portions respectively through the two inner spacers, and the narrower portion has a dimension in the first direction greater than a dimension of the one of the two source/drain portions of the second device in the first direction such that the narrower portion partially lands on one of the two inner spacers of the second device.

20. The method as claimed in claim 19, wherein the gate portion has a first gate part extending into the trench isolation of the isolation structure along the first direction, and having a middle region and two end regions at two opposite sides of the middle region in the second direction, a dimension of the middle region in the first direction being smaller than a dimension of each of the two end regions in the first direction, and two second gate parts respectively disposed over the channel portion of the first device and the channel portion of the second device, each of the two second gate parts having a maximum dimension in the first direction that is greater than the dimension of the middle region of the first gate part in the first direction such that each of the two second gate parts partially overlaps the two inner spacers of a corresponding one of the first device and the second device in the third direction.

* * * * *